(12) United States Patent
Umeda et al.

(10) Patent No.: US 7,075,316 B2
(45) Date of Patent: Jul. 11, 2006

(54) CAPACITANCE DETECTOR CIRCUIT, CAPACITANCE DETECTION METHOD, AND FINGERPRINT SENSOR USING THE SAME

(75) Inventors: Yuichi Umeda, Miyagi-ken (JP); Junichi Sato, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/941,605

(22) Filed: Sep. 14, 2004

(65) Prior Publication Data

US 2005/0073324 A1    Apr. 7, 2005

(30) Foreign Application Priority Data

Oct. 2, 2003  (JP) ............................. 2003-344767
Oct. 30, 2003  (JP) ............................. 2003-370772

(51) Int. Cl.
   *G01R 27/26* (2006.01)
   *G06K 9/00* (2006.01)
(52) U.S. Cl. ....................... 324/658; 324/686; 382/124
(58) Field of Classification Search ................ 382/124; 324/662, 658, 661, 686
   See application file for complete search history.

(56) References Cited

U.S. PATENT DOCUMENTS

| | | | |
|---|---|---|---|
| 5,633,594 A | 5/1997 | Okada | ........................ 324/679 |
| 6,600,428 B1 * | 7/2003 | O'Toole et al. | ........ 340/825.36 |
| 6,603,867 B1 * | 8/2003 | Sugino et al. | ............... 382/115 |
| 6,661,019 B1 * | 12/2003 | Furusato et al. | ............. 250/556 |
| 6,778,686 B1 * | 8/2004 | Hestnes et al. | .............. 382/124 |
| 6,784,413 B1 * | 8/2004 | Sasaki et al. | ........... 250/214 R |
| 6,917,694 B1 * | 7/2005 | Machida et al. | ............. 382/124 |
| 6,937,031 B1 * | 8/2005 | Yoshioka et al. | ........... 324/662 |

\* cited by examiner

*Primary Examiner*—Anjan Deb
*Assistant Examiner*—Marina Kramskaya
(74) *Attorney, Agent, or Firm*—Beyer,Weaver & Thomas, LLP.

(57) ABSTRACT

A capacitance detecting circuit of a capacitive sensor having a plurality of column lines and a row line intersecting the column lines detects a change in capacitance at an intersection of a column line and a row line. The circuit includes a PN code generating unit for generating a code having orthogonality in time sequence to output the generated code as a column drive signal, a column line drive unit for driving a predetermined one of the column lines which are selected in response to the code, a capacitance detecting unit, connected to the row line, for detecting a voltage by converting a total sum of changes in capacitance at intersections of the selected column lines into the voltage to output the detected voltage, and a decode processing unit for performing a predetermined calculation on the detected voltage output from the capacitance detecting unit and the code to determine a voltage value responsive to the capacitance change at the intersection.

24 Claims, 37 Drawing Sheets

| PN CODE (t1) | 1 | 1 | 1 | 1 | 0 | 1 | 0 | 1 | 1 | 0 | 0 | 1 | 0 | 0 | 0 |
|---|---|---|---|---|---|---|---|---|---|---|---|---|---|---|---|
| | ⊕ | ⊕ | ⊕ | ⊕ | ⊕ | ⊕ | ⊕ | ⊕ | ⊕ | ⊕ | ⊕ | ⊕ | ⊕ | ⊕ | ⊕ |
| PN CODE (t2) | 0 | 1 | 1 | 1 | 1 | 0 | 1 | 0 | 1 | 1 | 0 | 0 | 1 | 0 | 0 |
| | 1 | 0 | 0 | 0 | 1 | 1 | 1 | 1 | 0 | 1 | 0 | 1 | 1 | 0 | 0 |

0: NUMBER OF COINCIDENT BITS = 7
1: NUMBER OF NONCOINCIDENT BITS = 8

PN CODE GENERATOR CIRCUIT
M SEQUENCE 255 BITS, FEEDBACK TAP (2,3,4,8)

FIG. 15

| | |
|---|---|
| d1 | $=Vs1+Vs5+Vs8+Vs9+Vs11+Vs13+Vs14+Vs15$ |
| d2 | $=Vs1+Vs2+Vs6+Vs9+Vs10+Vs12+Vs14+Vs15$ |
| d3 | $=Vs1+Vs2+Vs3+Vs7+Vs10+Vs11+Vs13+Vs15$ |
| d4 | $=Vs1+Vs2+Vs3+Vs4+Vs8+Vs11+Vs12+Vs14$ |
| ⋮ | ⋮ |
| d15 | $=Vs4+Vs7+Vs8+Vs10+Vs12+Vs13+Vs14+Vs15$ |

} FIRST CYCLE

| | |
|---|---|
| d16 | $=Vs1+Vs5+Vs8+Vs9+Vs11+Vs13+Vs14+Vs15$ |
| ⋮ | ⋮ |
| d30 | $=Vs4+Vs7+Vs8+Vs10+Vs12+Vs13+Vs14+Vs15$ |

} SECOND CYCLE

| | |
|---|---|
| d31 | $=Vs1+Vs5+Vs8+Vs9+Vs11+Vs13+Vs14+Vs15$ |
| ⋮ | ⋮ |
| d45 | $=Vs4+Vs7+Vs8+Vs10+Vs12+Vs13+Vs14+Vs15$ |

} THIRD CYCLE

| | |
|---|---|
| d46 | $=Vs1+Vs5+Vs8+Vs9+Vs11+Vs13+Vs14+Vs15$ |
| ⋮ | ⋮ |
| d60 | $=Vs4+Vs7+Vs8+Vs10+Vs12+Vs13+Vs14+Vs15$ |

} FOURTH CYCLE

FIG. 16

| | | |
|---|---|---|
| ds1 | =d1+d2+d3+d4-d5+d6-d7+d8+d9-d10-d11+d12-d13-d14-d15 | <FIRST CYCLE> |
| | +d16+d17+d18+d19-d20+d21-d22+d23+d24-d25-d26+d27-d28-d29-d30 | <SECOND CYCLE> |
| | +d31+d32+d33+d34-d35-d36-d37-d38+d39-d40-d41+d42+d43-d44-d45 | <THIRD CYCLE> |
| | +d46+d47+d48+d49-d50+d51-d52+d53+d54-d55-d56+d57-d58-d59-d60 | <FOURTH CYCLE> |
| ds2 | =-d1+d2+d3+d4+d5-d6+d7-d8+d9+d10-d11-d12+d13+d14-d15 | <FIRST CYCLE> |
| | -d16+d17+d18+d19+d20-d21+d22-d23+d24+d25-d26-d27+d28-d29-d30 | <SECOND CYCLE> |
| | -d31+d32+d33+d34+d35-d36-d37-d38+d39-d40-d41+d42+d43-d44-d45 | <THIRD CYCLE> |
| | -d46+d47+d48+d49+d50-d51+d52-d53+d54+d55-d56-d57+d58-d59-d60 | <FOURTH CYCLE> |
| ds3 | =-d1-d2+d3+d4+d5+d6-d7+d8-d9+d10+d11-d12-d13+d14-d15 | <FIRST CYCLE> |
| | -d16-d17+d18+d19+d20-d21-d22+d23-d24+d25+d26-d27-d28+d29-d30 | <SECOND CYCLE> |
| | -d31-d32+d33+d34+d35-d36-d37-d38+d39-d40+d41-d42-d43+d44-d45 | <THIRD CYCLE> |
| | -d46-d47+d48+d49+d50-d51-d52+d53-d54+d55+d56-d57+d58+d59-d60 | <FOURTH CYCLE> |
| . . . . . | | |
| ds15 | =d1+d2+d3-d4-d5-d6+d7+d8-d9-d10+d11-d12-d13-d14+d15 | <FIRST CYCLE> |
| | +d16+d17+d18-d19-d20-d21+d22+d23-d24-d25+d26+d27-d28-d29+d30 | <SECOND CYCLE> |
| | +d31+d32+d33-d34-d35-d36+d37+d38-d39-d40+d41-d42-d43-d44+d45 | <THIRD CYCLE> |
| | +d46+d47+d48-d49-d50-d51+d52+d53-d54-d55+d56-d57-d58-d59+d60 | <FOURTH CYCLE> |

M SEQUENCE 15 CHIPS, FEEDBACK TAP (3,4)

FIG. 19

| | |
|---|---|
| d1 | =Vs1+Vs5+Vs8+Vs9+Vs11+Vs13+Vs14+Vs15 |
| d2 | =Vs1+Vs2+Vs6+Vs9+Vs10+Vs12+Vs14+Vs15 |
| d3 | =Vs1+Vs2+Vs3+Vs7+Vs10+Vs11+Vs13+Vs15 |
| d4 | =Vs1+Vs2+Vs3+Vs4+Vs8+Vs11+Vs12+Vs14 |
| ⋮ | ⋮ |
| d15 | =Vs4+Vs7+Vs8+Vs10+Vs12+Vs13+Vs14+Vs15 |

FIRST CYCLE (A)

| | |
|---|---|
| d16 | =Vs1+Vs3+Vs5+Vs6+Vs9+Vs13+Vs14+Vs15 |
| ⋮ | ⋮ |
| d30 | =Vs2+Vs4+Vs5+Vs8+Vs12+Vs13+Vs14+Vs15 |

SECOND CYCLE (B)

| | |
|---|---|
| d31 | =Vs1+Vs5+Vs8+Vs9+Vs11+Vs13+Vs14+Vs15 |
| ⋮ | ⋮ |
| d45 | =Vs4+Vs7+Vs8+Vs10+Vs12+Vs13+Vs14+Vs15 |

THIRD CYCLE (A)

| | |
|---|---|
| d46 | =Vs1+Vs3+Vs5+Vs6+Vs9+Vs13+Vs14+Vs15 |
| ⋮ | ⋮ |
| d60 | =Vs2+Vs4+Vs5+Vs8+Vs12+Vs13+Vs14+Vs15 |

FOURTH CYCLE (B)

FIG. 20

| | | |
|---|---|---|
| ds1 | =+d1+d2+d3+d4−d5+d6−d7+d8+d9−d10−d11+d12−d13−d14−d15 | <FIRST CYCLE (A)> |
| | +d16+d17+d18+d19−d20−d21−d22+d23−d24−d25+d26+d27−d28+d29−d30 | <SECOND CYCLE (B)> |
| | +d31+d32+d33−d34−d35+d36−d37+d38+d39−d40−d41+d42−d43−d44−d45 | <THIRD CYCLE (A)> |
| | +d46+d47+d48+d49−d50−d51−d52+d53−d54−d55+d56+d57−d58+d59−d60 | <FOURTH CYCLE (B)> |
| ds2 | =−d1+d2+d3+d4+d5−d6+d7−d8+d9+d10−d11−d12+d13−d14−d15 | <FIRST CYCLE (A)> |
| | −d16+d17+d18+d19+d20−d21−d22−d23+d24−d25−d26+d27+d28−d29+d30 | <SECOND CYCLE (B)> |
| | −d31+d32+d33+d34−d35+d36−d37+d38+d39+d40−d41−d42+d43−d44−d45 | <THIRD CYCLE (A)> |
| | −d46+d47+d48+d49+d50−d51−d52−d53+d54−d55−d56+d57+d58−d59+d60 | <FOURTH CYCLE (B)> |
| ds3 | =−d1−d2+d3+d4+d5−d6+d7−d8+d9+d10−d11−d12+d13+d14−d15 | <FIRST CYCLE (A)> |
| | +d16−d17+d18+d19+d20+d21−d22−d23−d24+d25−d26−d27+d28+d29−d30 | <SECOND CYCLE (B)> |
| | −d31−d32+d33+d34+d35−d36+d37−d38+d39+d40−d41−d42+d43+d44−d45 | <THIRD CYCLE (A)> |
| | +d46−d47+d48+d49+d50+d51−d52−d53−d54+d55−d56−d57+d58+d59−d60 | <FOURTH CYCLE (B)> |
| ...... | | |
| ds15 | =+d1+d2+d3−d4+d5+d6+d7+d8−d9+d10+d11−d12−d13−d14+d15 | <FIRST CYCLE (A)> |
| | +d16+d17+d18−d19−d20−d21+d22−d23−d24+d25+d26+d27+d28−d29+d30 | <SECOND CYCLE (B)> |
| | +d31+d32+d33−d34+d35+d36+d37+d38−d39+d40+d41−d42−d43−d44+d45 | <THIRD CYCLE (A)> |
| | +d46+d47+d48−d49−d50−d51+d52−d53−d54+d55+d56+d57+d58−d59+d60 | <FOURTH CYCLE (B)> |

(DELAY-ADD CHARACTERISTICS OF M SEQUENCE)

FIG. 23

| | 1 | 2 | 3 | 4 | 5 | 6 | 7 | 8 | 9 | 10 | 11 | 12 | 13 | 14 | 15 | SHIFT |
|---|---|---|---|---|---|---|---|---|---|---|---|---|---|---|---|---|
| t1 | 1 | 0 | 0 | 0 | 1 | 0 | 0 | 1 | 1 | 0 | 1 | 0 | 1 | 1 | 1 | 0 |
| t2 | 1 | 1 | 0 | 0 | 0 | 1 | 0 | 0 | 1 | 1 | 0 | 1 | 0 | 1 | 1 | 1 |
| t3 | 1 | 1 | 1 | 0 | 0 | 0 | 1 | 0 | 0 | 1 | 1 | 0 | 1 | 0 | 1 | 2 |
| t4 | 1 | 1 | 1 | 1 | 0 | 0 | 0 | 1 | 0 | 0 | 1 | 1 | 0 | 1 | 0 | 3 |
| t5 | 0 | 1 | 1 | 1 | 1 | 0 | 0 | 0 | 1 | 0 | 0 | 1 | 1 | 0 | 1 | 4 |
| t6 | 1 | 0 | 1 | 1 | 1 | 1 | 0 | 0 | 0 | 1 | 0 | 0 | 1 | 1 | 0 | 5 |
| t7 | 0 | 1 | 0 | 1 | 1 | 1 | 1 | 0 | 0 | 0 | 1 | 0 | 0 | 1 | 1 | 6 |
| t8 | 1 | 0 | 1 | 0 | 1 | 1 | 1 | 1 | 0 | 0 | 0 | 1 | 0 | 0 | 1 | 7 |
| t9 | 1 | 1 | 0 | 1 | 0 | 1 | 1 | 1 | 1 | 0 | 0 | 0 | 1 | 0 | 0 | 8 |
| t10 | 0 | 1 | 1 | 0 | 1 | 0 | 1 | 1 | 1 | 1 | 0 | 0 | 0 | 1 | 0 | 9 |
| t11 | 0 | 0 | 1 | 1 | 0 | 1 | 0 | 1 | 1 | 1 | 1 | 0 | 0 | 0 | 1 | 10 |
| t12 | 1 | 0 | 0 | 1 | 1 | 0 | 1 | 0 | 1 | 1 | 1 | 1 | 0 | 0 | 0 | 11 |
| t13 | 0 | 1 | 0 | 0 | 1 | 1 | 0 | 1 | 0 | 1 | 1 | 1 | 1 | 0 | 0 | 12 |
| t14 | 0 | 0 | 1 | 0 | 0 | 1 | 1 | 0 | 1 | 0 | 1 | 1 | 1 | 1 | 0 | 13 |
| t15 | 0 | 0 | 0 | 1 | 0 | 0 | 1 | 1 | 0 | 1 | 0 | 1 | 1 | 1 | 1 | 14 |

FIG. 24

| | 1 | 2 | 3 | 4 | 5 | 6 | 7 | 8 | 9 | 10 | 11 | 12 | 13 | 14 | 15 | SHIFT |
|---|---|---|---|---|---|---|---|---|---|---|---|---|---|---|---|---|
| t1 | 1 | 0 | 0 | 0 | 1 | 0 | 0 | 1 | 1 | 0 | 1 | 0 | 1 | 1 | 1 | 0 |
| t2 | 0 | 1 | 0 | 0 | 1 | 1 | 0 | 1 | 0 | 1 | 1 | 1 | 1 | 0 | 0 | 12 |
| t3 | 0 | 1 | 1 | 0 | 1 | 0 | 1 | 1 | 1 | 1 | 0 | 0 | 0 | 1 | 0 | 9 |
| t4 | 0 | 1 | 1 | 1 | 1 | 0 | 0 | 0 | 1 | 0 | 0 | 1 | 1 | 0 | 1 | 4 |
| t5 | 1 | 1 | 1 | 1 | 0 | 0 | 0 | 1 | 0 | 0 | 1 | 1 | 0 | 1 | 0 | 3 |
| t6 | 0 | 0 | 1 | 1 | 0 | 1 | 0 | 1 | 1 | 1 | 1 | 0 | 0 | 0 | 1 | 10 |
| t7 | 1 | 1 | 0 | 1 | 0 | 1 | 1 | 1 | 1 | 0 | 0 | 0 | 1 | 0 | 0 | 8 |
| t8 | 0 | 0 | 1 | 0 | 0 | 1 | 1 | 0 | 1 | 0 | 1 | 1 | 1 | 1 | 0 | 13 |
| t9 | 0 | 1 | 0 | 1 | 1 | 1 | 1 | 0 | 0 | 0 | 1 | 0 | 0 | 1 | 1 | 6 |
| t10 | 1 | 1 | 1 | 0 | 0 | 0 | 1 | 0 | 0 | 1 | 1 | 0 | 1 | 0 | 1 | 2 |
| t11 | 1 | 0 | 1 | 1 | 1 | 1 | 0 | 0 | 0 | 1 | 0 | 0 | 1 | 1 | 0 | 5 |
| t12 | 0 | 0 | 0 | 1 | 0 | 0 | 1 | 1 | 0 | 1 | 0 | 1 | 1 | 1 | 1 | 14 |
| t13 | 1 | 1 | 0 | 0 | 0 | 1 | 0 | 0 | 1 | 1 | 0 | 1 | 0 | 1 | 1 | 1 |
| t14 | 1 | 0 | 1 | 0 | 1 | 1 | 1 | 1 | 0 | 0 | 0 | 1 | 0 | 0 | 1 | 7 |
| t15 | 1 | 0 | 0 | 1 | 1 | 0 | 1 | 0 | 1 | 1 | 1 | 1 | 0 | 0 | 0 | 11 |

| | 1 | 2 | 3 | 4 | 5 | 6 | 7 | 8 | 9 | 10 | 11 | 12 | 13 | 14 | 15 | SHIFT |
|---|---|---|---|---|---|---|---|---|---|---|---|---|---|---|---|---|
| t1 | 1 | 0 | 0 | 0 | 1 | 0 | 0 | 1 | 1 | 0 | 1 | 0 | 1 | 1 | 1 | 0 |
| t2 | 1 | 1 | 0 | 0 | 0 | 1 | 0 | 0 | 1 | 1 | 0 | 1 | 0 | 1 | 1 | 1 |
| t3 | 1 | 1 | 1 | 0 | 0 | 0 | 1 | 0 | 0 | 1 | 1 | 0 | 1 | 0 | 1 | 2 |
| t4 | 1 | 1 | 1 | 1 | 0 | 0 | 0 | 1 | 0 | 0 | 1 | 1 | 0 | 1 | 0 | 3 |
| t5 | 0 | 1 | 1 | 1 | 1 | 0 | 0 | 0 | 1 | 0 | 0 | 1 | 1 | 0 | 1 | 4 |
| t6 | 1 | 0 | 1 | 1 | 1 | 1 | 0 | 0 | 0 | 1 | 0 | 0 | 1 | 1 | 0 | 5 |
| t7 | 0 | 1 | 0 | 1 | 1 | 1 | 1 | 0 | 0 | 0 | 1 | 0 | 0 | 1 | 1 | 6 |
| t8 | 1 | 0 | 1 | 0 | 1 | 1 | 1 | 1 | 0 | 0 | 0 | 1 | 0 | 0 | 1 | 7 |
| t9 | 1 | 1 | 0 | 1 | 0 | 1 | 1 | 1 | 1 | 0 | 0 | 0 | 1 | 0 | 0 | 8 |
| t10 | 0 | 1 | 1 | 0 | 1 | 0 | 1 | 1 | 1 | 1 | 0 | 0 | 0 | 1 | 0 | 9 |
| t11 | 0 | 0 | 1 | 1 | 0 | 1 | 0 | 1 | 1 | 1 | 1 | 0 | 0 | 0 | 1 | 10 |
| t12 | 1 | 0 | 0 | 1 | 1 | 0 | 1 | 0 | 1 | 1 | 1 | 1 | 0 | 0 | 0 | 11 |
| t13 | 0 | 1 | 0 | 0 | 1 | 1 | 0 | 1 | 0 | 1 | 1 | 1 | 1 | 0 | 0 | 12 |
| t14 | 0 | 0 | 1 | 0 | 0 | 1 | 1 | 0 | 1 | 0 | 1 | 1 | 1 | 1 | 0 | 13 |
| t15 | 0 | 0 | 0 | 1 | 0 | 0 | 1 | 1 | 0 | 1 | 0 | 1 | 1 | 1 | 1 | 14 |

FIG. 41

| | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| (LSB) | | | | | | | | | | | | | | | (MSB) |
| t1 | 1 | 0 | 1 | 0 | 1 | 0 | 1 | 0 | 1 | 0 | 1 | 0 | 1 | 0 | 1 |
| t2 | 0 | 1 | 1 | 0 | 0 | 1 | 1 | 0 | 0 | 1 | 1 | 0 | 0 | 1 | 1 |
| t3 | 1 | 1 | 0 | 0 | 1 | 1 | 0 | 0 | 1 | 1 | 0 | 0 | 1 | 1 | 0 |
| t4 | 0 | 0 | 0 | 1 | 1 | 1 | 1 | 0 | 0 | 0 | 0 | 1 | 1 | 1 | 1 |
| t5 | 1 | 0 | 1 | 1 | 0 | 1 | 0 | 0 | 1 | 0 | 1 | 1 | 0 | 1 | 0 |
| t6 | 0 | 1 | 1 | 1 | 1 | 0 | 0 | 0 | 0 | 1 | 1 | 1 | 1 | 0 | 0 |
| t7 | 1 | 1 | 0 | 1 | 0 | 0 | 1 | 0 | 1 | 1 | 0 | 1 | 0 | 0 | 1 |
| t8 | 0 | 0 | 0 | 0 | 0 | 0 | 0 | 1 | 1 | 1 | 1 | 1 | 1 | 1 | 1 |
| t9 | 1 | 0 | 1 | 0 | 1 | 0 | 1 | 1 | 0 | 1 | 0 | 1 | 0 | 1 | 0 |
| t10 | 0 | 1 | 1 | 0 | 0 | 1 | 1 | 1 | 1 | 0 | 0 | 1 | 1 | 0 | 0 |
| t11 | 1 | 1 | 0 | 0 | 1 | 1 | 0 | 1 | 0 | 0 | 1 | 1 | 0 | 0 | 1 |
| t12 | 0 | 0 | 0 | 1 | 1 | 1 | 1 | 1 | 1 | 1 | 1 | 0 | 0 | 0 | 0 |
| t13 | 1 | 0 | 1 | 1 | 0 | 1 | 0 | 1 | 0 | 1 | 0 | 0 | 1 | 0 | 1 |
| t14 | 0 | 1 | 1 | 1 | 1 | 0 | 0 | 1 | 1 | 0 | 0 | 0 | 0 | 1 | 1 |
| t15 | 1 | 1 | 0 | 1 | 0 | 0 | 1 | 1 | 0 | 0 | 1 | 0 | 1 | 1 | 0 |

QUADRATURE CODE (15×15)

CAPACITANCE DETECTOR CIRCUIT, CAPACITANCE DETECTION METHOD, AND FINGERPRINT SENSOR USING THE SAME

BACKGROUND OF THE INVENTION

1. Field of the Invention

The present invention relates to a circuit and a method for detecting a low capacitance and a fingerprint sensor using the circuit.

2. Description of the Related Art

Pressure sensitive capacitive sensors have been developed as a fingerprint sensor that is considered as the most promising technique in biometrics. The pressure sensitive capacitive sensor includes one film bearing column lines spaced at predetermined intervals on the surface thereof and the other film bearing row lines spaced at predetermined intervals on the surface thereof. The two films are arranged to face each other with an insulator interposed therebetween to allow a predetermined separation therebetween. The films of the pressure sensitive capacitive sensor are deformed in response to the roughness of the fingerprint when a finger is placed onto the sensor. The separation between the column line and the row line changes depending on location, and the shape of the fingerprint is detected as a capacitance at the intersection of the lines. One of the techniques available to detect a capacitance less than several hundreds of fF (femto farads) is a detector circuit that converts a capacitance into an electrical signal using a switched capacitor circuit. In the detector circuit, a common switched capacitor circuit is connected to a sensor capacitance element, driven by a first drive signal, for detecting a target capacitance, and a reference capacitance element, driven by a second drive signal and serving as a detector circuit reference capacitance. First and second sample-and-hold units, which alternately functions, sample the respective output signals, and determine a difference between the sample results to result in a detected signal.

The common capacitor switched circuit in the detector reliably detects a signal proportional to a capacitance value Cs as a target and inversely proportional to a feedback capacitance Cf. Although a charge Qd are stored in a parasitic capacitance between the gate electrode of a reset switch (feedback control switch) and another electrode in the switched capacitor circuit, the effect of leakage (field through) of the charge to the other electrode is cancelled. As disclosed in Japanese Unexamined Patent Application Publication No. 8-145717, it is also expected that low-frequency noise contained in an offset component at a reference voltage in the switched capacitor circuit and an input signal is removed to some degree by determining a difference between the two sample results.

High sensitivity is required of the capacitance detector circuit such as the fingerprint sensor because of a small capacitance change, while the detector must be robust against noise coming in from the human body (including high-frequency components) and noise derived from electrical circuits.

The detector must also be free from the effect of crosstalk noise from adjacent lines among column lines and row lines that detect a change in capacitance.

One contemplated capacitance detector circuit detects a charge voltage corresponding to a charge stored in a capacitance at an intersection of a column line and a row line when the column line rises in a voltage level, and a discharge voltage corresponding to a charge discharged from the capacitance at the intersection when the column line falls in voltage. The detector circuit thus detects a change in capacitance using the charge voltage and the discharge voltage.

More specifically, the capacitance detector circuit determines a difference between the charge voltage and the discharge voltage, and regards the difference voltage as a voltage corresponding to a change in capacitance. The detector circuit thus removes a voltage offset arising from the effect of field through at the same electrodes in an amplifier circuit, and an offset component taking place in other circuits, thereby eliminating noise sufficiently low in frequency in comparison with a sampling frequency.

When a change in capacitance of each sensor element of a capacitive sensor is detected, typical detector circuits including a capacitance detector circuit drives a single column line only, thereby detecting a change in a capacitance value Cs at each of intersections (sensor elements) of a plurality of row lines, serving detecting lines, and the column line.

As previously discussed, a change in capacitance per sensor element (single intersection) is as small as several hundreds of fF.

Known capacitance detector circuits are still subject to the effect of noise occurring in the capacitive sensor even if the offset component taking place in circuits containing an amplifier is removed.

In other words, the capacitance detector circuit is unable to precisely detect a capacitance change because of disturbing noise when power supply noise and conductive noise transferred to a capacitive sensor via the human body are superimposed on a signal of the column line and the row line.

Widely available inverter type fluorescent lamps generating high-frequency through semiconductors become a noise source having a fundamental frequency of several tens of kHz.

When the difference between the charge voltage and the discharge voltage is detected in the capacitance detector circuit, the sampling frequency of the capacitance change becomes close to the fundamental frequency of the noise source.

When the capacitance detector circuit determines the difference between the charge voltage and the discharge voltage, a beat due to the difference remains. Such a beam is generated when two waves having slightly different frequencies are superimposed. Thus, it is difficult to completely remove disturbing noise components.

When a user uses a fingerprint sensor, an apparatus having a noise source of a frequency component close to the sample frequency of the capacitance detector circuit may be located close to the body of the user. For example, an inverter type fluorescent lamp may be used, or an apparatus having an inverter circuit used to backlight a liquid-crystal display may be connected to the sensor. The disturbance noise due to the beat cannot be fully eliminated. The signal to noise ratio S/N of s signal for detecting a capacitance change is degraded, and the fingerprint of a user cannot be precisely read.

SUMMARY OF THE INVENTION

Accordingly, it is an object of the present invention to provide a capacitance detector circuit, a capacitance detection method, and a fingerprint sensor for detecting a small capacitance Cs at an intersection of a column line and a row line and a capacitance change ΔCs in the capacitance Cs with the effect of disturbance noise reduced and an S/N ratio heightened.

A circuit of a capacitive sensor having a matrix of intersections of a plurality of column lines and a plurality of row lines intersecting the column lines, for detecting a change at each intersection, includes a code generating unit for generating a code having orthogonality in time sequence to output the generated code as a column drive signal, a column line drive unit for driving a plurality of column lines, from among the column lines, which are selected in response to the code, a capacitance detecting unit, connected to the row line, for detecting a voltage by converting a total sum of changes in capacitance at intersections of the selected column lines into the voltage to output the detected voltage, and a decode processing unit for performing a predetermined calculation on the detected voltage output from the capacitance detecting unit and the code to determine a voltage value responsive to the capacitance change at the intersection.

With this arrangement, the capacitance detector circuit concurrently drives a plurality of column lines intersecting the row line in accordance with the code such as a pseudo-random noise (PN) code having orthogonality, in other words, concurrently drives a plurality of sensor elements on a per row line basis, and multiplexes capacitance values Cs and capacitance change values ΔCs to increase the capacitance value and capacitance change value to NCs and NΔCs. Here, N is the number of column lines concurrently driven, namely, the number of intersections multiplexed. The detector circuit then converts capacitance to voltage, thereby outputting a detected signal. In this arrangement, a significantly large capacitance and a significantly large capacitance change are measured, and disturbance noise such as beat is relatively reduced, and the S/N ratio is heightened. The use of an M sequence PN code providing excellent autocorrelation eliminates the effect of crosstalk in the column lines.

Using the same code that has been used in the multiplex operation, the capacitance detector circuit performs a predetermined calculation on the detected signal which is multiplexed in time by the decode processing unit. Since the multiplexed detected value is thus decoded as the capacitance value Cs and capacitance change ΔCs for each of the sensor elements, the detected result provides the same resolution as when a single column line is driven.

The code generating unit generates and outputs a PN code with the phase thereof varied in time sequence as a column drive signal. The generation of a single PN code easily results in the detected signal multiplexed by the number of bits of the PN code, required in the multiplication and summing operation in a decode process, without the need for the generation of different PN codes.

If the decode process is performed in a personal computer, the capacitance detector circuit is freed from transmitting fingerprint data in the decoded state thereof. Multiplexed fingerprint data heightens the level of data security.

In a preferred embodiment of the present invention, the code generating unit outputs the PN code with the phase thereof shifted by a random number of bits in time sequence (with the phase hopped). The generation of a single PN code easily results in the detected signal multiplexed by the number of bits of the PN code, required in the multiplication and summing operation in a decode process, without the need for the generation of different PN codes. The effect of disturbance noise is spread over a set of detected signals having different phases (the detected signals of the number of bits of the PN code) after being subjected to the multiplication and summing operation and shifting operation. A flattening process through a filtering operation is thus facilitated.

The code generating unit repeats by a plurality of times a cycle within which the phase of the PN code is varied by a number of bits equal to the number of bits of the PN code, and the decode processing unit determines a voltage responsive to a change in capacitance at the intersection on a per cycle basis, sums the voltage for a plurality of cycles, and outputs the summed result as the detected voltage. The disturbance noise contained in the detected voltage is thus averaged, the effect of the disturbance noise is reduced, and the precision of the detected result is heightened.

In a preferred embodiment of the present invention, the code generating unit generates a plurality of PN codes, and switches the PN code from one PN code to a different PN code every cycle. In comparison with the case in which the same PN code is repeated over a plurality of cycles, the effect of periodicity is excluded, and the S/N ratio is heightened.

In a preferred embodiment of the present invention, the PN code includes an M sequence. The PN code thus provides high autocorrelation. With the PN code shifted, changes at intersections are multiplexed, and during decoding, the detected signal is decoded with the phase of the same PN code associated therewith. This arrangement controls of the generation of crosstalk between the column lines, and the capacitance change at the intersection is thus detected at a high precision.

The code generating unit preferably generates a Walsh code having bit strings varying in time sequence, and outputs the Walsh code as the code thereof.

In the capacitance detector circuit, the number of drives of each column line becomes half the number of detections. The effect of crosstalk between the column lines is reduced, and the capacitance at the intersection is thus precisely detected.

In a preferred embodiment of the present invention, the decode processing unit performs a decode process by multiplying and summing a data string of the detected voltage that is output in accordance with the code in time sequence. To this end, a plurality of column lines are concurrently driven to detect a change in capacitance at each of the intersections (sensor elements) of the column lines and the row lines. The capacitance of the sensor elements of the driven column lines is converted into voltage. The level of the detected signal is thus substantially heightened, and the effect of the disturbance noise is lowered.

In a preferred embodiment of the present invention, a capacitance at an intersection is detected in an area type capacitive sensor which includes a matrix of intersections of a plurality of column lines and a plurality of row lines. With the capacitive sensor incorporated as a fingerprint sensor, more precise determination results are obtained.

In a preferred embodiment of the present invention, a capacitance at an intersection is detected in a line type capacitive sensor which includes a single row line and a plurality of column lines intersecting the row line.

In a preferred embodiment of the present invention, a fingerprint sensor includes the capacitance detector circuit, and detects a fingerprint at a high precision.

According to one aspect of the present invention, a method for detecting a change in capacitance at an intersection of a column line and a row line in a capacitive sensor that includes a plurality of column lines and a plurality of row lines, includes the steps of generating a code with the phase thereof varied in time sequence to output the code as a column drive signal, driving a plurality of column lines, from among the column lines, selected in response to the code, detecting a voltage by converting a total sum of changes in capacitance at intersections of the selected column line into the voltage to output the voltage as a detected voltage, and decoding a data string of the detected voltage output in the detecting step in accordance with the code in a predetermined calculation to determine a voltage value responsive to the capacitance change at the intersection.

When a row voltage output unit drives a column line at a first voltage with a column line drive unit outputting a signal for causing the column line to rise to a first voltage, a third voltage corresponding to a current for charging capacitances at a plurality of intersections is output. When the column line is driven by a second voltage, a fourth voltage corresponding to a current for discharging the capacitances of the plurality of intersections is output. A change in the capacitance at the intersection is thus determined.

The capacitance detection method of the preferred embodiments of the present invention takes advantage of a difference between an output voltage during discharging and an output voltage during charging. The effect of the discharge current due to field through superimposed in a constant direction of a charge current to and a discharge current from the capacitance at the intersection cancels the effect of the discharge current due to field through in an amplifier in the charge amplifier circuit. The change in the capacitance at the intersection is thus detected with a high precision.

According to another aspect of the present invention, a circuit for detecting a change in capacitance at an intersection of a column line and a row line in a capacitive sensor that includes a plurality of column lines and a row line intersecting the column lines, includes a code generating unit for generating a code having orthogonality in time sequence, a column line group selecting unit for dividing the plurality of column lines into groups, each group including a predetermine number of column lines, and for selecting a group of column lines to be measured, a column line drive unit for driving the plurality of column lines in each of the successively selected column line groups in response to the code, a capacitance detecting unit, connected to the row line, for converting a total sum of changes in capacitance at intersections of the selected column line into a voltage signal, and outputting the voltage signal as a detected voltage, and a decode processing unit for performing a predetermined calculation on the measured voltage and the code on a per column line group basis, and for determining a voltage value responsive to the capacitance change at each intersection.

With this arrangement, the capacitance detector circuit concurrently drives a plurality of column lines intersecting the row line in accordance with the code such as a pseudo-random noise (PN) code having orthogonality, in other words, concurrently drives a plurality of sensor elements on a per row line basis, and multiplexes capacitance value Cs and capacitance change value ΔCs to increase the capacitance value and capacitance change value to NCs and NΔCs. Here, N is the number of column lines concurrently driven, namely, the number of intersections multiplexed. The detector circuit then converts capacitance to voltage, thereby outputting a detected signal. In this arrangement, a significantly large capacitance and a significantly large capacitance change are measured, and disturbance noise such as beat is relatively reduced, and the S/N ratio is heightened. The use of an M sequence PN code providing excellent autocorrelation eliminates the effect of crosstalk in the column lines.

Using the same PN code that has been used in the multiplex operation, the capacitance detector circuit-performs a predetermined calculation (multiplication and summing operation) on the detected signal which is multiplexed in time by the decode processing unit. Since the multiplexed detected value is thus decoded as the capacitance value Cs and capacitance change ΔCs (determined if the capacitance value Cs is determined) for each of the sensor elements, the detected result provides the same resolution as when a single column line is driven.

In a preferred embodiment of the present invention, the column line group includes a predetermined number of adjacent column lines.

Since any number of column lines to be subjected to the multiplication and summing operation is set to adjust the burden in calculation, processing taking into consideration the throughput of a system in use may be performed.

The column line group preferably includes column lines spaced at predetermined intervals.

The capacitance detector circuit generally detects the capacitance of an entire area of the matrix on a per column line group basis. In this method, variations in the detected value become small in comparison with the case in which measurement is performed in a localized area. The setting of sensitivity in measurement is easily performed.

According to yet another aspect of the present invention, a method for detecting, as a voltage, a change in capacitance at an intersection of each of a plurality of column lines and a row line intersecting the column lines, includes a code generating step for generating a code having orthogonality in time sequence, a column line group selecting step for selecting a group of column lines to be measured, the plurality of column lines being divided into the groups of column lines, each group including a predetermine number of column lines, a column line drive step for driving the plurality of column lines in each of the successively selected column line groups in response to the code, a capacitance measuring step for measuring capacitance by outputting, as a measured voltage, a total sum of currents responsive to capacitances at intersections of the row line and the plurality of driven column lines, and a decode processing step for performing a predetermined calculation on the measured voltage and the code on a per column group basis and for determining a voltage value responsive to the capacitance at each intersection.

As described above, the capacitance detector circuit of the preferred embodiments of the present invention multiplexes the capacitances in accordance with the code having orthogonality to drive a plurality of column lines at a time, and sums changes in capacitance at a plurality of intersections to detect the capacitance. The effect of disturbance noise added to the column lines is relatively reduced. The gain of detection is heightened. The PN code used in the multiplex operation is used in decoding the detection result to determine change in capacitance at each intersection. The change in capacitance at each intersection is detected at a resolution comparable to the resolution at which a capacitance change is detected with a single column line driven.

BRIEF DESCRIPTION OF THE DRAWINGS

FIG. 15 illustrates a measurement method in which the shifting of the bit train of the PN code is repeated for a plurality of cycles to multiplex voltage data of each sensor to determine measurement data;

FIG. 16 illustrates the concept of a decode process of a decode processing circuit that decodes the measurement data multiplexed by measuring data for a plurality of cycles into voltage data of each sensor;

FIG. 19 illustrates a measurement method of the third preferred embodiment in which voltage data of each sensor is multiplexed to measure data while the bit train of the PN code is shifted at the same time;

FIG. 20 illustrates the concept of a decode process of a decode processing circuit that decodes the measurement data, multiplexed by measuring data for a plurality of cycles, into voltage data of each sensor in accordance with the third preferred embodiment of the present invention;

FIG. 23 is a table that lists data of each of the bit train of the PN code that is output by a storage shift register at the shifting of each bit;

FIG. 24 is a table that lists the output of a code selector that selects between the bit train of a latch register and the bit train on which an exclusive OR register has performed a hopping process;

FIG. 41 is a table illustrating the Walsh code stored in a code memory of FIG. 39.

DESCRIPTION OF THE PREFERRED EMBODIMENTS

First Preferred Embodiment

A capacitance detector circuit of preferred embodiments of the present invention is for use in a matrix capacitive sensor having a plurality of column lines and a row line intersecting the column lines and detects a change in capacitance at an intersection of a column line and a row line. The capacitance detector circuit includes a code generating unit for generating a code having orthogonality in time sequence to output the generated code as a column drive signal, a column line drive unit for concurrently driving a predetermined column lines which are selected in response to the code, a capacitance detecting unit, connected to the row line, for detecting a voltage by converting a total sum of changes in capacitance at intersections of the selected column lines into the voltage to output the detected voltage, and a decode processing unit for performing a predetermined calculation on a data string of the detected voltage output in time sequence on a per row line basis every cycle of the phase change of a PN code in a decode process to determine a voltage value responsive to the capacitance change at the intersection.

Figure 1:
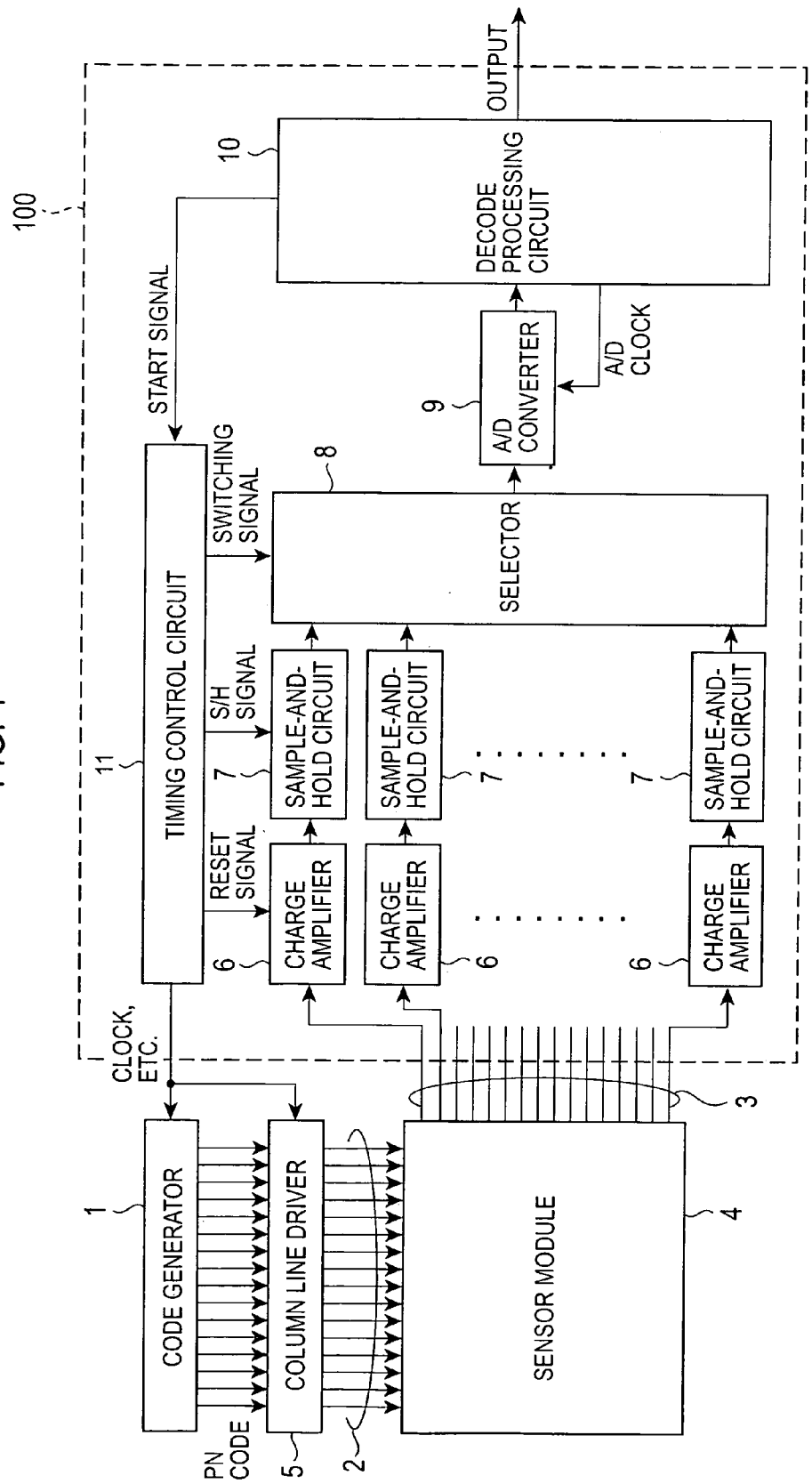
FIG. 1 is a block diagram illustrating the structure of a fingerprint sensor using a capacitance detector circuit in accordance with a first preferred embodiment of the present invention.

The capacitance detector circuit 1 of a first preferred embodiment of the present invention is described below with reference to FIG. 1. FIG. 1 is a block diagram illustrating the structure the capacitance detector circuit 1 in accordance with the first preferred embodiment of the present invention.

The capacitance detector circuit 1 generates a PN code used to generate a column drive signal for driving each column line in a column line array 2 of a sensor 4. The PN code is an M sequence PN code having high autocorrelation. The sensor 4 includes column lines of the column line array 2 and row lines of a row line array 3, and each intersection of a column line and a row line forms a sensor element (sensor element 55 of FIG. 4).

Figure 2A:
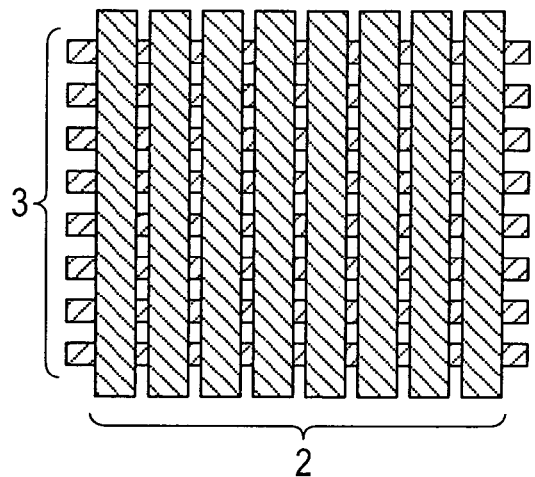
FIGS. 2A and 2B illustrate the structure of the sensor of FIG. 1.
Figure 2B:
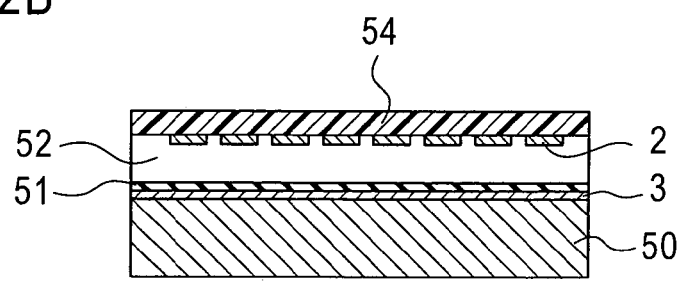

FIG. 2A is a plan view of the sensor 4, and FIG. 2B is a cross-sectional view of the sensor 4. As shown in FIG. 2A, the column lines in the column line array 2 are arranged with a pitch of 50 μm and the row lines in the row line array 3 arranged with a pitch of 50 μm. The column lines and the row lines intersect each other. As shown in FIG. 2B, a plurality of row lines of the row line array 3 are arranged on a substrate 50, an insulator 51 is deposited on the row line array 3, and a film 54 is arranged with a gap 52 allowed between the surface of the insulator 51 and the film 54. A plurality of column lines in the column line array 2 are arranged on the underside of the film 54. Arranged at the intersections of the column lines in the column line array 2 and the row lines in the row line array 3 are respective sensor elements as capacitance elements, each having a predetermined capacitance across the gap 52 and the insulator 51 between the respective column and row lines.

Figure 3:
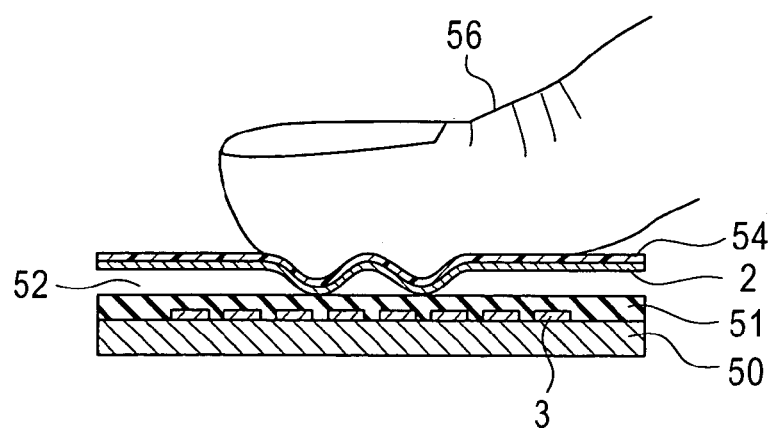
FIG. 3 is a view illustrating the sensor of FIG. 1 for use in measurement of fingerprint.

When a finger 56 touches the top of the sensor 4, the irregularity of the finger 56 causes the film 54 and the column lines in the column line array 2 to be deformed as shown in FIG. 3, thereby-changing the gap 52, and leading to a change in the capacitance of the substrate 50 formed at the intersections between the column line array 2 and the row line array 3.

Figure 4:
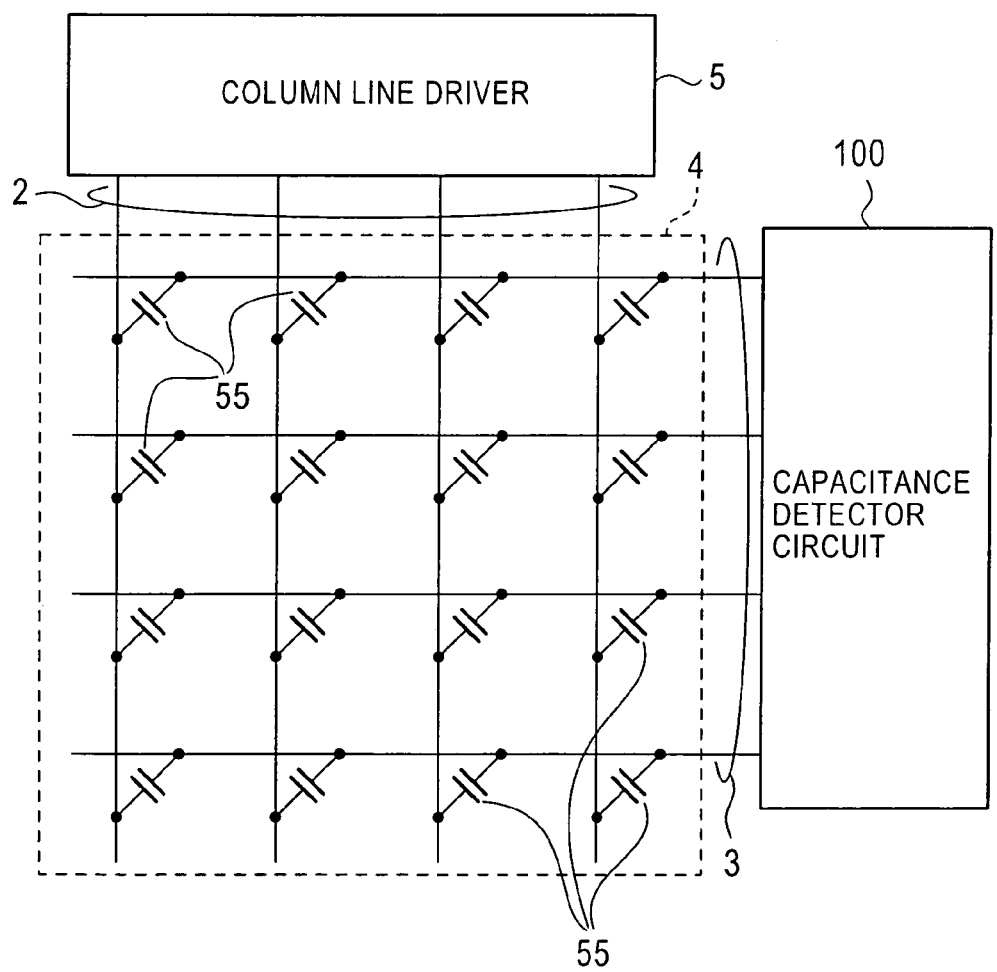
FIG. 4 illustrates the structure of sensor elements formed at intersections of column lines in a column line array and row lines in a row line array in an area type sensor.

FIG. 4 illustrates a matrix of capacitance elements (sensor elements) between the column lines and the row lines in the sensor 4. The sensor 4 includes a matrix of sensor elements 55, and is connected to a column line driver 5 and a capacitance detector circuit 100. The column line driver 5 outputs a drive pulse train to the column line array 2 in accordance with a bit train of a pseudo-random noise (PN) code, in other words, outputs predetermined drive pulses (drive signals) to the column lines in the column line array 2 of the sensor 4 in parallel. The pattern of the drive pulse in the drive pulse train (of whether or not to drive the column lines) is generated based on the PN code. A plurality of column lines in the column line array 2 are driven (activated) in accordance with the data of the bit train of the PN code. Changes in capacitances at the intersections (sensor elements) formed by the driven column lines and a row line are multiplexed. The capacitance detector circuit 100 includes charge amplifiers 6, sample-and-hold circuits 7, a selector 8, an A/D converter 9, a decode processing circuit 10, and a timing control circuit 11.

The charge amplifier 6, arranged at each of the row lines in the row line array 3 in the sensor 4, detects a small amount of charge (a current responsive to a change in capacitance) input or output in response to the capacitance of the intersection (sensor element) based on a charge and a discharge current, amplifies the current, and converts the current into a voltage, and outputs the voltage as a measured signal. The sample-and-hold circuit 7, arranged at each charge amplifier 6, samples the detected signal in accordance with an input sample-and-hold signal, and temporarily holds the sampled signal. The selector 8 switches voltage information held by the sample-and-hold circuits 7 in the order of the arrangement of the row line array, and outputs the voltage information to the A/D converter 9.

The A/D converter 9 converts the measured voltage as analog voltage information input in time sequence into digital measured data at the timing of an A/D clock input from the decode processing circuit 10, and outputs the digital data to the decode processing circuit 10.

For high-speed processing, the A/D converter 9 is arranged in each sample-and-hold circuit 7 to convert the analog measured data into the digital measured data.

The decode processing circuit 10 performs a calculation operation for removing an offset component due to field through by determining a difference between measurement data during charging of the sensor element at the intersection and measurement data during discharging. The decode processing circuit 10 also decodes the signal multiplexed with the PN code by performing a multiplication and summing process on the multiplexed signal using the same PN code that has been used in the multiplexing operation. The signal is separated into voltage data components indicating the capacitances of the respective sensor elements.

Upon receiving a start signal for starting capacitance detection from the decode processing circuit 10, the timing control circuit 11 outputs a clock and a control signal to a PN code generator, the column line driver 5, the charge amplifiers 6, the sample-and-hold circuits 7, and the selector 8, thereby controlling the operation timing of the entire capacitance detector circuit 100.

Figure 5:
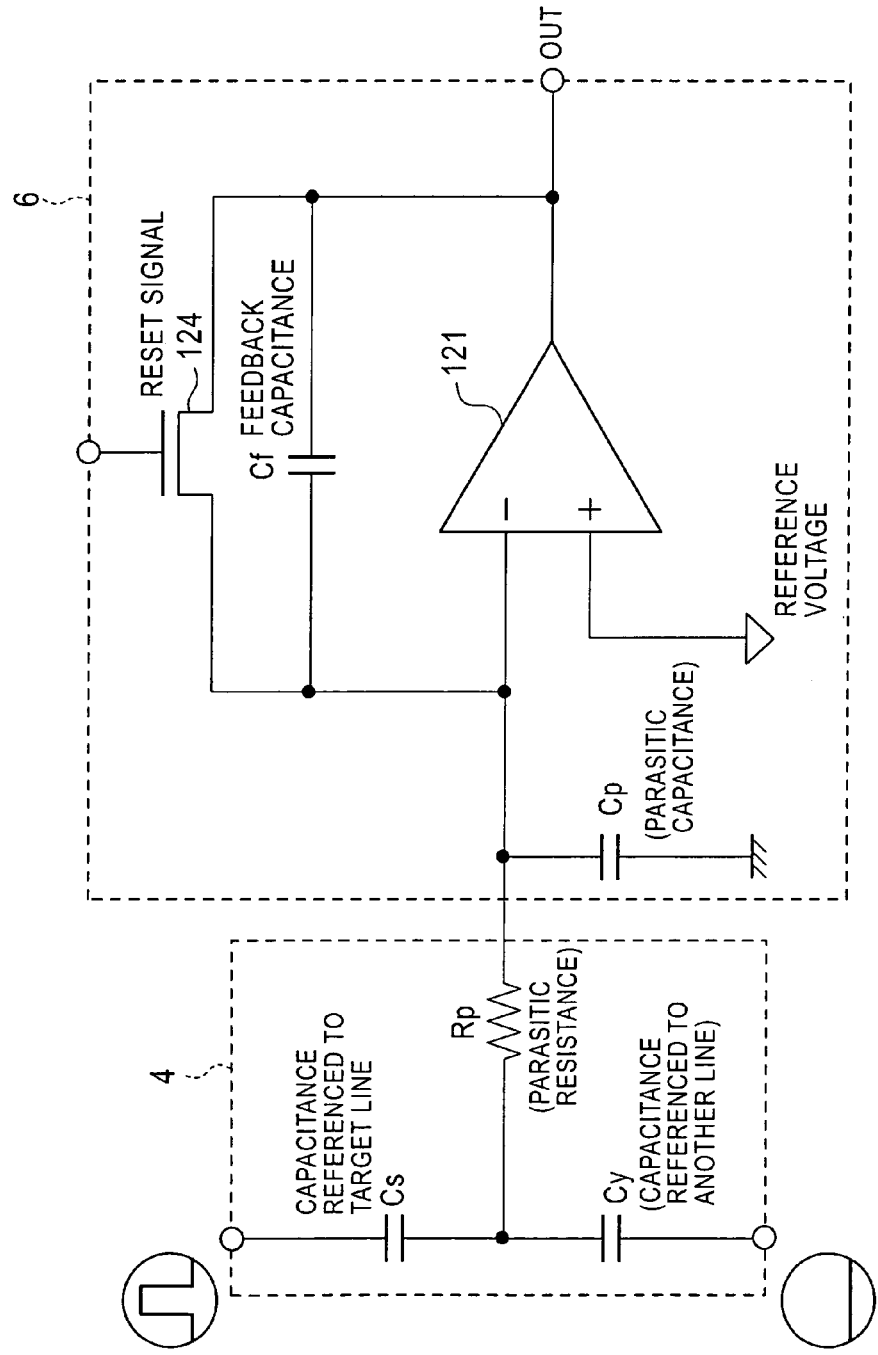
FIG. 5 is a block diagram illustrating the structure of the sensor and charge amplifier of FIG. 1.

The charge amplifier 6 will now be discussed with reference to FIG. 5. FIG. 5 illustrates the structure of the charge amplifier 6. As shown, the charge amplifier 6 includes an operational amplifier 121, a feedback capacitance Cf connected between an inverting input terminal and an output terminal of the operational amplifier 121, and an analog switch 124 for discharging a charge in the feedback capacitance Cf. A non-inverting input terminal of the operational amplifier 121 is connected to a reference voltage. Also shown are a parasitic capacitance Cp of the operational amplifier 121, etc, a capacitance Cs at the intersection (sum of the capacitance of multiplexed sensor elements), and an overall capacitance Cy with respect to the other column lines than a target column line.

The operation of the capacitance detector circuit 100 thus constructed in accordance with the first preferred embodiment of the present invention will now be discussed with reference to FIG. 1. To simplify explanation, a PN code having a 15 bit length generated by a PN code generator circuit 20 is described below.

The decode processing circuit 10 receives a start signal for starting capacitance detection from the outside, namely, a signal for collecting a fingerprint on a fingerprint sensor 4.

In response, the decode processing circuit 10 outputs, to the timing control circuit 11, a start command signal for starting capacitance detection. The timing control circuit 11 in turn outputs a clock signal and a reset signal to the code generator 1.

In response to the reset signal, the code generator 1 initializes a linear feedback shift register (LFSR) having four internal stages, thereby generating M sequence PN code in synchronization with the clock signal, and successively outputting the PN code.

Figure 6A:
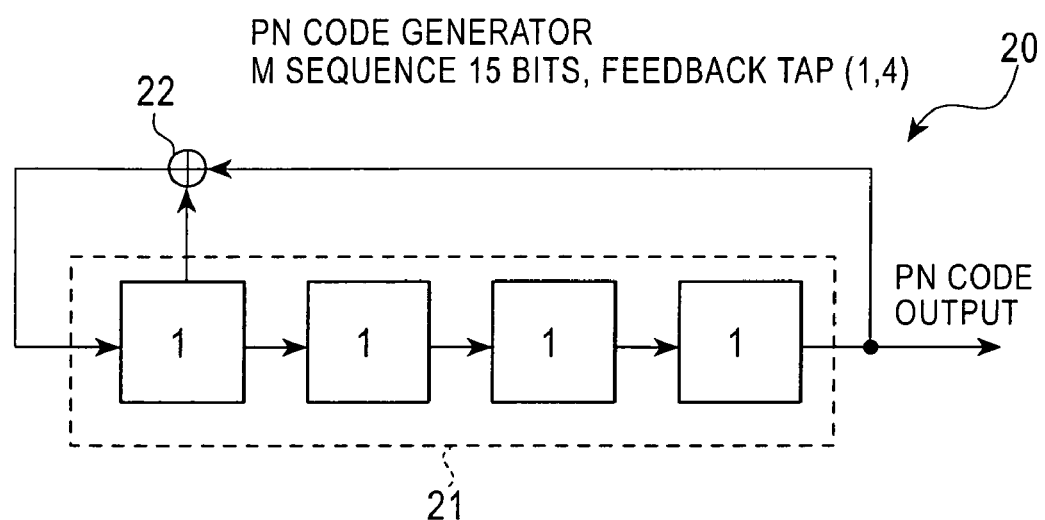
FIGS. 6A and 6B illustrate the structure of a code generator circuit in a code generator of FIG. 1.
Figure 6B:
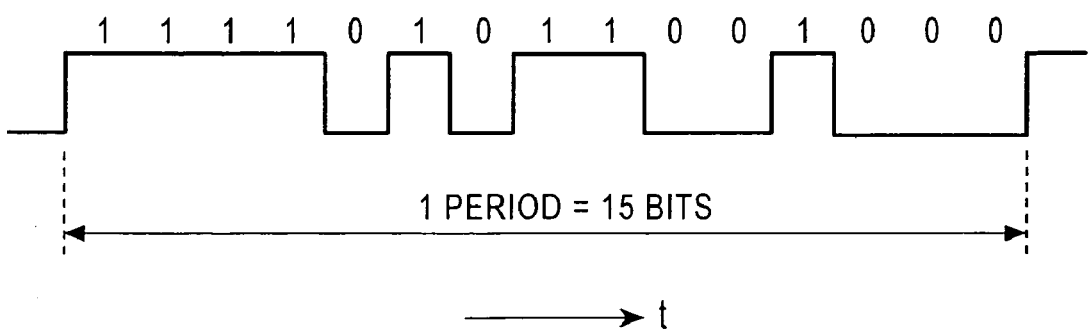

The code generator 1, including the PN code generator circuit 20 shown in FIG. 6A, outputs the M sequence PN code in synchronization with the clock. The PN code generator circuit 20 (referred to as LFSR) generates the M sequence 15 bit PN code, and includes a 4-bit shift register 21 and an exclusive OR (EXOR) gate 22. The EXOR gate 22 is connected to the output of tap 1 of the shift register 21 (the output of a first bit of the shift register 21) and the output of tap 4 (the output of a fourth bit of the shift register 21). The EXOR gate 22 exclusive OR gates the input signals, and outputs the exclusive OR gated output to the input of the shift register 21. The PN code generator circuit 20 shifts the data of each bit of the shift register 21 in synchronization with the clock signal, thereby successively generating data of a bit train of the PN code in synchronization with the clock signal in sequence. As shown in FIG. 6B, the PN code generator circuit 20 writes the data of the bit train (1 (least significant bit (LSB)), 1, 1, 1, 0 1, 0, 1, 1, 0, 0, 1, 0, 0, 0 (most significant bit (MSB)) with time advancing from left to right as shown in FIG. 6B) in an internal shift register 23 (to be discussed later) in time sequence in synchronization with the clock signal. The PN code generator circuit 20 outputs the PN code in sequence in the order of the LSB bit to the MSB bit.

Figures 7A, 7B:
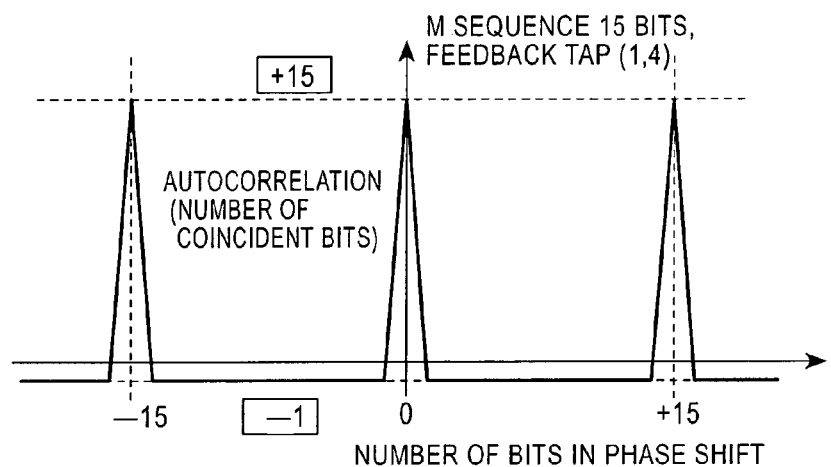
FIGS. 7A and 7B illustrate autocorrelation of every cycle of bit trains in phase change due to the bit shift of bit train of the PN code.

Referring to FIG. 7A, one cycle is now 15 bits, in other words, the bit train of the PN code is formed of 15 bits. With one bit successively shifted, the number of autocorrelated bits is maximized (to +15) each time the same bit arrangement (in phase state) appears, and in the middle of the cycle, the number of autocorrelated bits is minimized to −1. As shown in FIG. 7A, the ordinate represents autocorrelation (the number of coincident bits), and the abscissa represents the number of bits to be shifted (a shift of 15 bits is one cycle). Phase shifting refers to bit shifting to the initial bit arrangement of the PN code with data of the bits unchanged.

Referring to FIG. 7B, the PN code has the following feature: the PN code is compared with the PN code having the same but cycled bit train. If the PN codes match in phase, the bits coincide with each other, and the multiplication and summing result is maximized to +15. If the PN codes fail to match, the number of coincident bits is less than the number of noncoincident bits by 1 bit, and the multiplication and summing result is averaged resulting in a minimum of −1. Multiplexed information is thus separated using the multiplication and summing operation. This process is similar to the principle of multiplexing and separation of code division multiple access (CDMA) of cellular phones.

Figure 8:
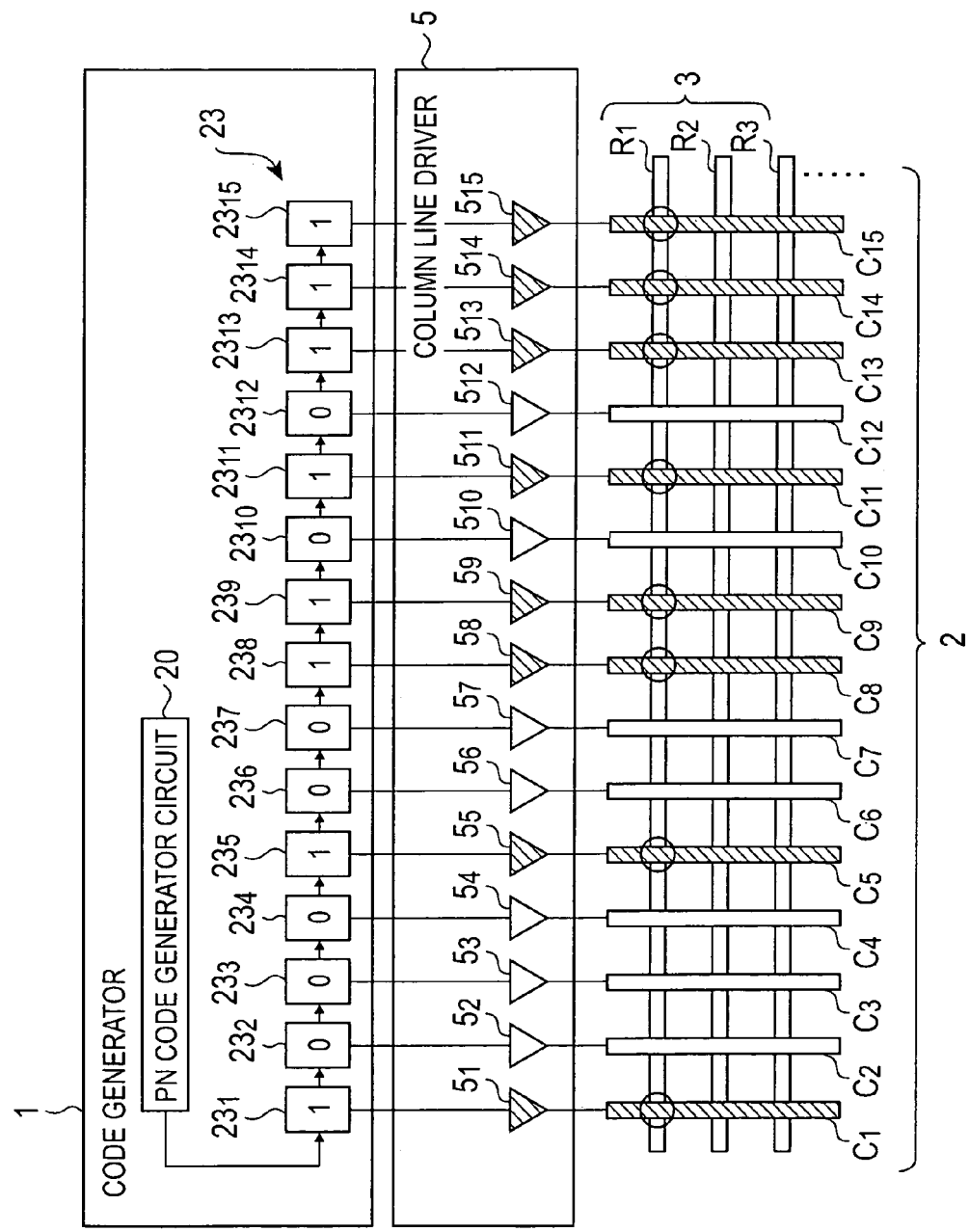
FIG. 8 is a conceptual block diagram illustrating the operation of the first preferred embodiment of the present invention wherein the PN code drives the column lines to multiplex the capacitances of sensor elements.
Figure 9:
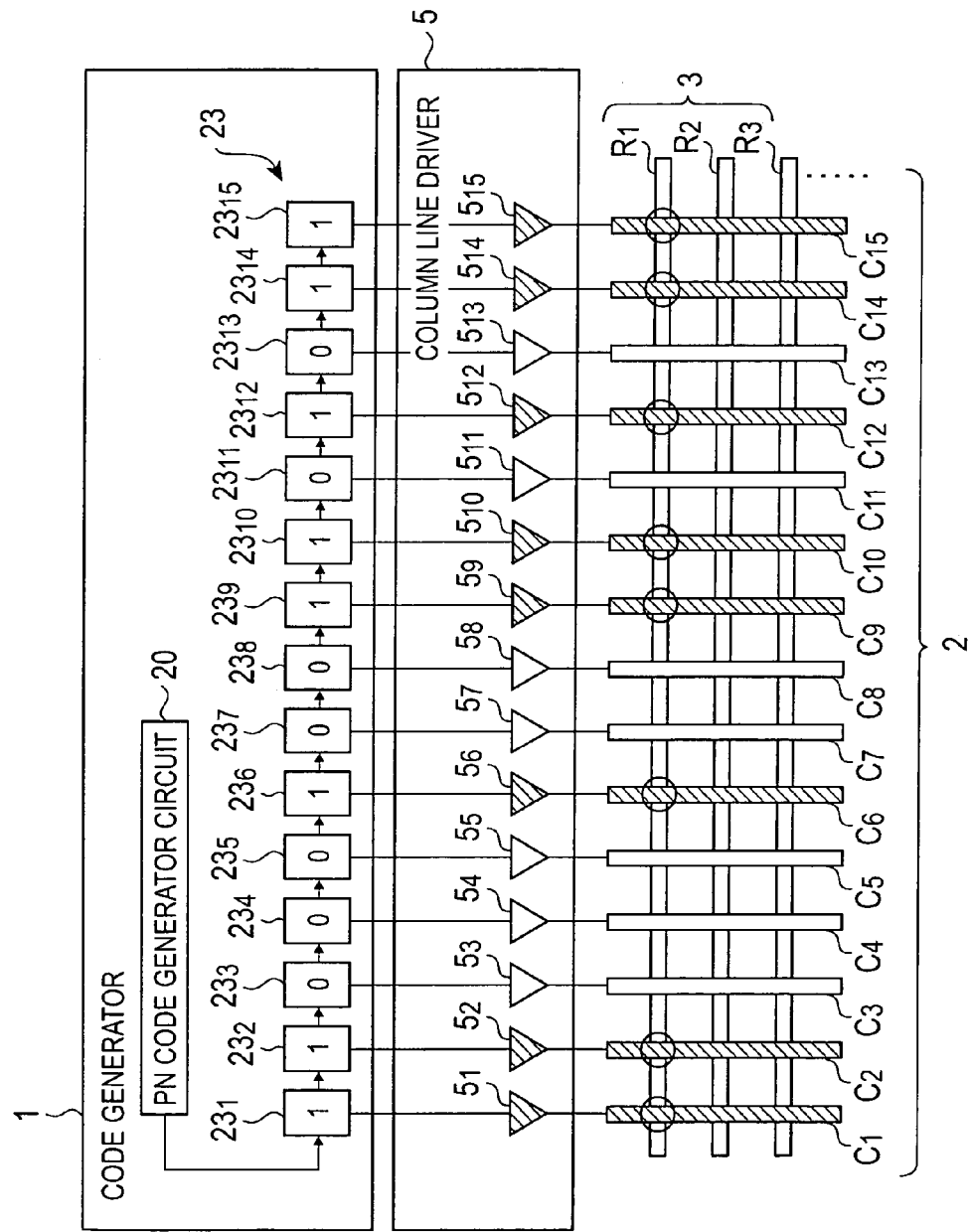
FIG. 9 is a conceptual block diagram illustrating the operation of the first preferred embodiment of the present invention wherein the PN code drives the column lines to multiplex the capacitances of sensor elements.

As shown in FIGS. 8 and 9, the column line driver 5 concurrently drives a plurality of column lines in the column line array 2 in response to the PN code output from the code generator 1. More specifically, if the PN code has 15 bits of {1, 1, 1, 1, 0, 1, 0, 1, 1, 0, 0, 1, 0, 0, 0} as shown in FIG. 8, one cycle corresponding to a bit train of the PN code is a constant duration of time from $t_1$ through $t_{15}$, at intervals of which the bits are shifted in sequence. The bit train of {1, 1, 1, 1, 0, 1, 0, 1, 1, 0, 0, 1, 0, 0, 0} of the PN code generated by the PN code generator circuit 20 is successively shifted in the storage shift register 23. The storage shift register 23 includes 15 register stages of a register stage $23_1$ through a register stage $23_{15}$. Data is shifted from left to right (from the register stage $23_1$ toward the register stage $23_{15}$). At time $t_1$, "1" of the first bit of the PN code is input to the leftmost register stage $23_1$ of the storage shift register 23. At time $t_2$, "1" of the first bit of the PN code, stored in the register stage $23_1$, is shifted to the register stage $23_2$, while "1" of the second bit of the bit train of the PN code is input to the register stage $23_1$.

The above-referenced shifting operation is performed at times $t_1$, $t_2$, $t_3$, $t_4$, $t_5$, $t_6$, $t_7$, $t_8$, $t_9$, $t_{10}$, $t_{11}$, $t_{12}$, $t_{13}$, $t_{14}$, and $t_{15}$, thereby inputting the data {1, 1, 1, 1, 0, 1, 0, 1, 1, 0, 0, 1, 0, 0, 0} of the bit train of the PN code to register stages $23_{15}$, $23_{14}$, $23_{13}$, $23_{12}$, $23_{11}$, $23_{10}$, $23_9$, $23_8$, $23_7$, $23_6$, $23_5$, $23_4$, $23_3$, $23_2$, and $23_1$, respectively. The data stored in the register stages $23_{15}$, $23_{14}$, $23_{13}$, $23_{12}$, $23_{11}$, $23_{10}$, $23_9$, $23_8$, $23_7$, $23_6$, $235$, $23_4$, $23_3$, $23_2$, and $23_1$ of the storage shift register 23 are supplied to driver circuits $15_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively. When the period of $t_1$ through $t_{15}$ has elapsed, the bit train {1, 1, 1, 1, 0, 1, 0, 1, 1, 0, 0, 1, 0, 0, 0} of the PN code is already fed to the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively. The operation during the one period of from time $t_1$ through time $t_{15}$ is one cycle for the fingerprint capturing process in accordance with the present invention.

The operation of the storage shift register 23 is described below. When a signal for starting fingerprint capturing is input, 15 clocks of a clock signal are input to the storage shift register 23 from the timing control circuit 11. The register stages $23_{15}$, $23_{14}$, . . . , $23_1$ are set to {1, 1, 1, 1, 0, 1, 0, 1, 1, 0, 0, 1, 0, 0, 0} at the default state thereof. At the first time $t_1$ of the one cycle of the fingerprint capturing process, a clock is input from the timing control circuit 11 to the storage shift register 23. In response to the input clock, the register stages $23_{15}$, $23_{14}$, . . . , $23_1$ in the storage shift register 23 shifts the data thereof by one bit, thereby having {1, 1, 1, 0, 1, 0, 1, 1, 0, 0, 1, 0, 0, 0, 1} (see FIG. 8). In response to the clock signal output from the timing control circuit 11, the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5 drive corresponding column lines $C_{15}$, $C_{14}$, $C_{13}$, $C_{12}$, $C_{11}$, $C_{10}$, $C_9$, $C_8$, $C_7$, $C_6$, $C_5$, $C_4$, $C_3$, $C_2$, and $C_1$ with a drive pulse train of drive pulses, each pulse having a predetermined pulse width (see FIGS. 10(c) and 11(f)). In the case of a drive pulse train P1 corresponding to the bit train of the PN code, the column line driver 5 outputs a drive pulse having a predetermined voltage in response to "1" of the data of the bit, and does not output the drive pulse in response to "0" of the data of the bit. The column line driver 5 thus outputs the ground voltage to column lines other than the column lines receiving the drive pulse. At time $t_1$, in response to the drive pulse of the drive pulse train P1, column lines $C_1$, $C_5$, $C_8$, $C_9$, $C_{11}$, $C_{13}$, $C_{14}$, and $C_{15}$ are driven. A sum of capacitances of capacitive sensors formed of the plurality of driven column lines and each of the row lines $R_1$, $R_2$, $R_3$, . . . , namely, a capacitance value multiplexed in accordance with the bit arrangement of the PN code is connected to each of the row lines $R_1$, $R_2$, $R_3$, . . .

Figure 10:
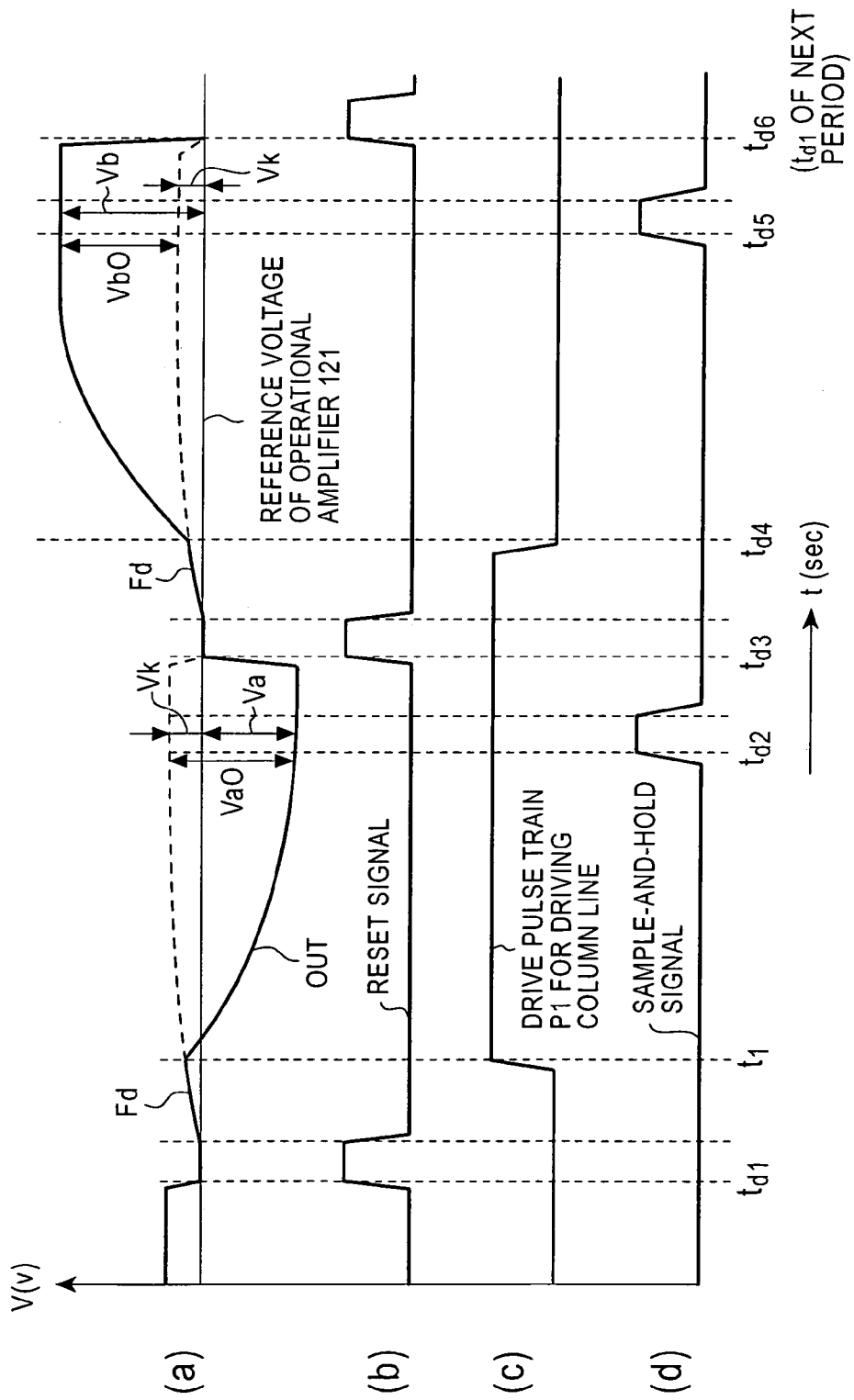
FIG. 10 is a timechart illustrating the detected signal and the operation of the charge amplifier in accordance with the first preferred embodiment of the present invention.

As shown in FIGS. 10(*b*) and 11(*a*), the timing control circuit 11 outputs a reset signal to the charge amplifier 6 slightly prior to the rising edge of the drive pulse of the drive pulse train for driving the column line and slightly prior to the falling edge of the drive pulse. As shown in FIGS. 10(*d*) and 11(*b*), the timing control circuit 11 outputs a sample-and-hold signal to the sample-and-hold circuit 7 slightly prior to the reset signal.

Figure 11:
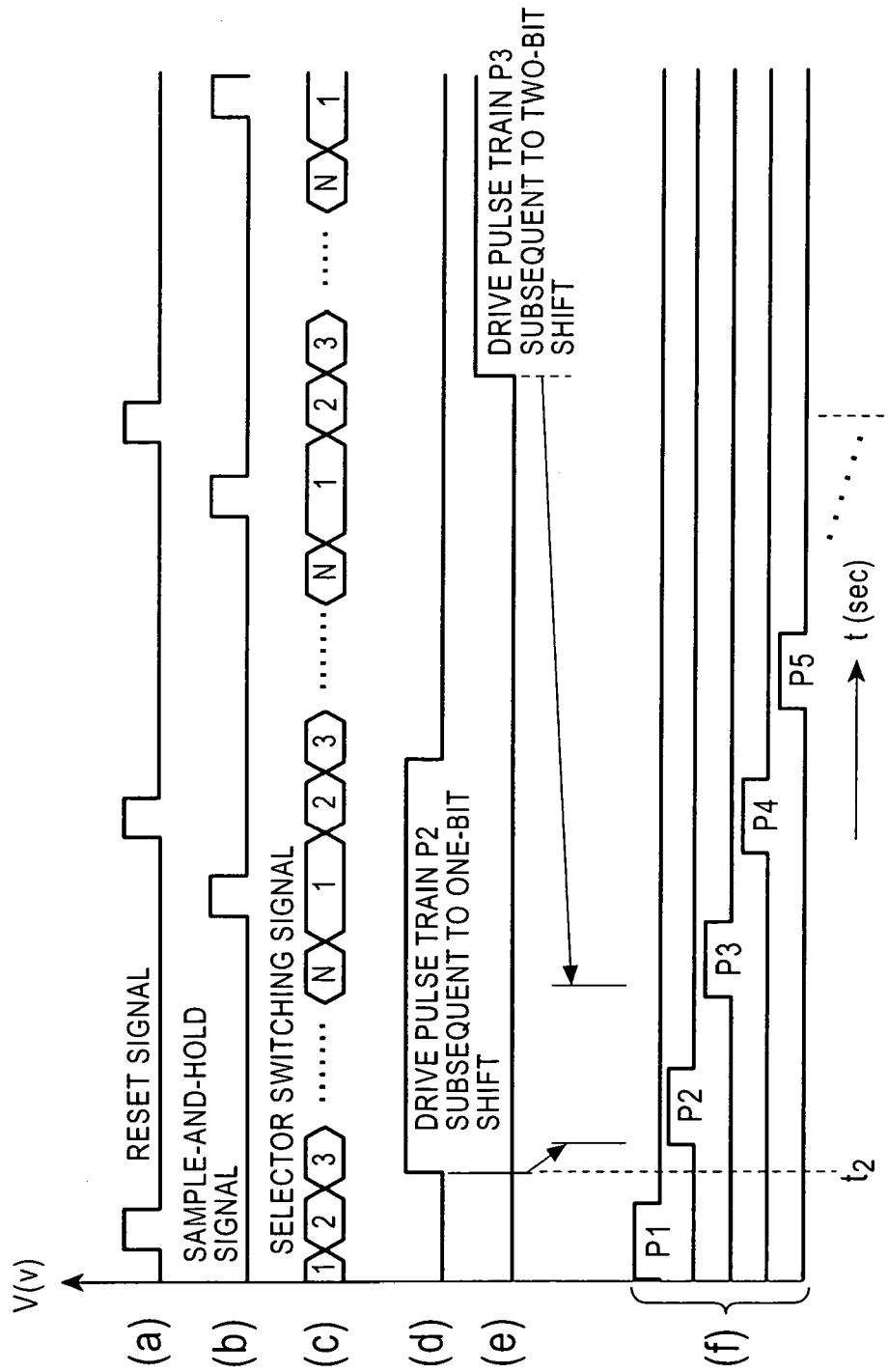
FIG. 11 is a timechart illustrating the control process of a selector and the column lines in accordance with the first preferred embodiment of the present invention.

The timing control circuit 11 outputs N switching signals (N is the number of sample-and-hold circuits 7) to the selector 8 within the intervals of the inputting of the sample-and-hold signals. As shown in FIG. 11(*c*), the signals held by the sample-and-hold circuits 7 in response to a single sample-and-hold signal are successively fed to the A/D converter 9 through the selector 8 until a next sample-and-hold signal. At the timing of an analog-to-digital (A/D) clock input from the decode processing circuit 10, the A/D converter 9 converts measurement voltage in response to a detection signal for each row line into digital data, thereby outputting the digital data as measurement data d1 to the decode processing circuit 10. The decode processing circuit 10 writes, onto an internal memory on a per row line basis, data strings of measurement data successively input.

The operation of the charge amplifier 6 will now be discussed. When the timing control circuit 11 outputs the reset signal at time $td_1$ slightly prior to time $t_1$ of FIG. 10, the analog switch 124, as a metal-oxide semiconductor (MOS) transistor shown in FIG. 5, is turned on. The feedback capacitance Cf is discharged, causing the output OUT of the operational amplifier 121 to be short-circuited to the inverting input terminal of the operational amplifier 121. The output OUT is set to the reference voltage, and the row line connected to the inverting input terminal of the operational amplifier 121 is also set to the reference voltage.

When the reset signal is transitioned to an off level, field through due to the parasitic capacitance of the gate of the analog switch 124 causes the output voltage of the operational amplifier 121 to slightly rise (see label Fd subsequent to time $td_1$ in FIG. 10(*a*)).

When a predetermined drive pulse of the bit pattern of the PN code in the drive pulse train (drive pulse train P1 shown in FIG. 11(*f*)) rises at time $t_1$, the drive pulse is fed to the inverting input terminal of the operational amplifier 121 through the sensor element (capacitance Cs) at the intersection of the column line and the row line. A current flowing in response to the voltage value of the drive pulse causes the output OUT of the operational amplifier 121 to gradually drop as shown in FIG. 10(*a*).

At time $td_2$, the timing control circuit 11 outputs a sample-and-hold signal (S/H) signal to the sample-and-hold circuit 7. Upon receiving the sample-and-hold signal, the sample-and-hold circuit 7 holds the measurement voltage Va output from the output OUT of the operational amplifier 121 in the charge amplifier 6.

At time $td_3$, the timing control circuit 11 outputs a reset signal to the charge amplifier 6 again. In response, the output OUT of the operational amplifier 121 is short-circuited to the inverting input terminal thereof, the feedback capacitance Cf is discharged, and the output OUT of the operational amplifier 121 is returned to the reference voltage. With the reset signal transitioned to off, field through of the gate parasitic capacitance of the analog switch 124 causes the output voltage of the operational amplifier 121 to slightly rise (see label Fd subsequent to time $td_3$ of FIG. 10(*a*)).

At time $td_4$, the drive pulse of the drive pulse train P1 falls. The sensor element (capacitance Cs) at the intersection of the column line driven by drive pulse and the row line is discharged in response to a current based on the voltage of the drive pulse. In response, the output OUT of the operational amplifier 121 gradually rises in a voltage level.

At time $td_5$, the timing control circuit 11 outputs a sample-and-hold signal to the sample-and-hold circuit 7. The sample-and-hold circuit 7 holds a measurement voltage Vb of the output OUT of the operational amplifier 121 at the timing of the input of the sample-and-hold signal.

At time $td_6$, the timing control circuit 11 outputs a reset signal to the charge amplifier 6. The output OUT of the operational amplifier 121 in the charge amplifier 6 is thus short-circuited to the inverting input terminal thereof, the feedback capacitance Cf is discharged, and the output OUT of the operational amplifier 121 returns to the reference voltage. The above-referenced operation is repeated.

In the above-referenced measurement operation, an offset Vk due to the field through current of the analog switch 124 is generated in a positive direction regardless of whether the output OUT rises or falls with respect to the reference voltage. In this preferred embodiment, the offset due to the field through is not negligible when the capacitance Cs to be measured falls within a range of several tens of fF to several hundreds of fF. In the above measurement, −VaO (=−Va+Vk) is a voltage proportional to the target capacitance Cs. The voltage to be measured is Va, and contains an error Vk due to offset as follows:

$$Va = VaO + Vk$$

In this preferred embodiment, a voltage Vb during discharging of the target capacitance Cs is also measured. A voltage VbO is expressed as follows:

$$VbO = Vb - Vk$$

Here, VbO is proportional to the capacitance Cs, and the voltage Vb to be measured is expressed as follows:

$$Vb = VbO + Vk$$

The measurement voltages Va and Vb are successively held by the sample-and-hold circuits 7, and the held voltages are analog-to-digital converted by the A/D converter 9 on a per Va and Vb basis, and the resulting digital data is stored in the memory of the decode processing circuit 10. The decode processing circuit 10 performs a calculation operation in accordance with the following equation:

$$d = Vb - Va = (VbO + Vk) - (Vk + VaO) = VbO - VaO$$

In this way, measurement data d corresponding to multiplexed capacitance values, free from an offset error, is obtained.

The decode processing circuit 10 thus determines a difference between the output signals of the charge amplifier 6 in response to the rising of the voltage at the column line and the falling of the voltage of the column line when the predetermined drive pulse in the drive pulse train rises and falls. The decode processing circuit 10 thus determines the capacitance value of the sensor element in a state free from the effect of field through. With the selector used, the time-consuming measurements of the column lines of the charge amplifiers 6 are performed in parallel. A high-speed measurement of the entire sensor is thus achieved.

At time $t_2$ (prior to the rising of a drive pulse P2 shown in FIG. 11(f) subsequent to one bit shift), the timing control circuit 11 outputs a clock to the code generator 1. The shift register 21 in the code generator 1 generates "1" with one bit shifted, and outputs the shifted data to the storage shift register 23. In synchronization with the clock, the storage shift register 23 shifts the bits of {1, 1, 1, 0, 1, 0, 1, 1, 0, 0, 1, 0, 0, 0, 1} of the stored PN code by one bit, while writing data "1" input from the shift register 21 onto the register stage $23_1$. In this way, data "1" stored in the register stage $23_{15}$ is pushed out of the storage shift register 23, and disappears. Data "1" stored in the register stage $23_{14}$ is newly written onto the register stage $23_{15}$.

As shown in FIG. 9, the data stored in the register stages $23_{15}$, $23_{14}$, $23_{13}$, $23_{12}$, $23_{11}$, $23_{10}$, $23_9$, $23_8$, $23_7$, $23_6$, $23_5$, $23_4$, $23_3$, $23_2$, and $23_1$ of the storage shift register 23 are the bit train {1, 1, 0, 1, 0, 1, 1, 0, 0, 1, 0, 0, 0, 1, 1}. The outputs of the register stages of the storage shift register 23 are thus fed to the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively. At the end of time $t_2$, namely, when of the capacitance values of the plurality of sensor elements in response to the drive pulse train P1 are multiplexed, the bit train of the PN code {1, 1, 0, 1, 0, 1, 1, 0, 0, 1, 0, 0, 0, 1, 1} are the PN code with the bit arrangement (phase) thereof shifted by one bit, and are fed to the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively.

At time $t_2$ in response to the clock signal output from the timing control circuit 11, the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5 drive corresponding column lines $C_{15}$, $C_{14}$, $C_{13}$, $C_{12}$, $C_{11}$, $C_{10}$, $C_9$, $C_8$, $C_7$, $C_6$, $C_5$, $C_4$, $C_3$, $C_2$, and $C_1$ with a drive pulse train (drive pulse train P2 subsequent to one bit shifting) of drive pulses, each pulse having a predetermined pulse width. See FIGS. 10(c) and 11(f). At time $t_2$, column lines $C_1$, $C_2$, $C_6$, $C_9$, $C_{10}$, $C_{12}$, $C_{14}$, and $C_{15}$ are driven (see FIG. 9). The state at time $t_2$ all corresponds to the state at time $t_1$ already discussed.

At or in the vicinity of $t_2$, the operation from $td_1$ to time $td_5$, already discussed with reference to FIG. 10, is repeated. When the bit train of the PN code is shifted by one bit, the plurality of column lines are driven, the capacitance values of the plurality of sensor elements are multiplexed, and the multiplexed capacitances are then converted to a voltage value. Thus, the measurement voltage is obtained.

The process discussed with reference to time $t_1$ and time $t_2$, namely, the process performed from time $td_1$ to time $td_5$ as shown in FIG. 10 is repeated at each timing of time $t_3$ through time $t_{15}$. FIG. 23 shows the bit trains of the PN code of the storage shift register 23 at each time. The bit shifting of the PN code, the driving of the column lines, and the voltage measurement are repeated for one cycle to perform fingerprint capturing.

In response to the drive pulse train of the drive pulses P1-P15, the capacitance detector circuit 100 drives a plurality of column lines in the column line array 2, and performs the measurement process each time the 15 bit PN code is successively shifted by one bit. The measurement voltages Vd with the phase thereof shifted by one bit are obtained from the row lines, respectively. The measurement voltages of Vd are converted to digital data. A data string {d1, d2, . . . , d15} multiplexed by the PN code is thus obtained.

The following measurement data of the row lines with the phase of the PN code shifted by one bit is stored in the memory of the decode processing circuit 10:

$d1 = Vs1 + Vs5 + Vs8 + Vs9 + Vs11 + Vs13 + Vs14 + Vs15$ $d2 = Vs1 + Vs2 + Vs6 + Vs9 + Vs10 + Vs12 + Vs14 + Vs15$ $d3 = Vs1 + Vs2 + Vs3 + Vs7 + Vs10 + Vs11 + Vs13 + Vs15$ $d4 = Vs1 + Vs2 + Vs3 + Vs4 + Vs8 + Vs11 + Vs12 + Vs14$

. . .

$d15 = Vs4 + Vs7 + Vs8 + Vs10 + Vs12 + Vs13 + Vs14 + Vs15$ where Vs represents the voltage digital data into which the capacitance at each sensor element at the intersection of the driven column lines and the row line is converted. The measurement data d is multiplexed in response to the capacitance of the sensor element corresponding to the column line driven by the PN code.

The measurement data d in a general form is expressed by the following equation (1):

$$di = \sum_{j=1}^{N} \begin{cases} PN(i-j-1) \times Vs(j) & (i \geq j) \\ PN(i-j+1+N) \times Vs(j) & (i < j) \end{cases} \quad (1)$$

Since about half the column line array 2 (eight lines) is driven concurrently in accordance with the PN code, the measurement data di is determined by summing the products of the PN code and the voltage data Vsj corresponding to the capacitance Csj of half the sensor elements. Here, "j" represents a line number of the column line C, and is 1, 2, 3, . . . , N, and "i" represents a measurement data number (corresponding to the order of phase shifting), and is 1, 2, 3, . . . , N.

The decode processing circuit 10 determines the voltage data Vs of each sensor element based on the multiplexed measurement data and the PN code used in the multiplexing operation in accordance with equation (2):

$$dsi = \sum_{j=1}^{N} \begin{cases} PNs(j-i+1) \times d(j) & (j \geq i) \\ PNs(j-i+1+N) \times d(j) & (j < i) \end{cases} \quad (2)$$

As already discussed, the measurement data d in time sequence that is determined by successively shifting the PN code bit by bit is separated into voltage data ds, namely, voltage data Vs corresponding to the capacitance of the sensor element at the intersection of the row line and the driven column line by performing the multiplication and summing operation on the PN code and the measurement data d as represented by equation (2).

In equation (2), a coefficient PNs(i)=+1 when the data of the bit of the PN code is PNi=1, and a coefficient PNs(i)=−1 when PNi=0. The decode processing circuit 10 performs a separation process (namely, a decode process) from the measurement data d to the voltage data ds using equation (2).

A data string of the measurement data {d1, d2, . . . , d14, d15} has been determined by multiplexing the voltage data ds and the PN code on a per row line basis. To determine the voltage data ds of each sensor element, namely, the voltage data {ds1, ds2, ds3, . . . , ds14, ds15), each measurement data dj is multiplied by a coefficient corresponding to the data PNi of each bit of the bit train of the PN code {1 (LSB), 1, 1, 1, 0, 1, 0, 1, 1, 0, 0, 1, 0, 0, 0 (MSB)}. When the drive signal is applied to the column line in response to the predetermined PN code during measurement, the order of the bit train corresponds to the order of the column lines. For example, the LSB bit corresponds to the column line $C_1$, and the MSB bit corresponds to a column line $C_{15}$. The voltage data dS1 at the intersection of the column line $C_1$ is determined by multiplying a coefficient PNs(i) corresponding to the data PNi of each bit of the bit train of {1 (LSB), 1, 1, 1, 0, 1, 0, 1, 1, 0, 0, 1, 0, 0, 0 (MSB)} by the measurement data dj and summing the products throughout one cycle. More specifically, the column line $C_1$ is driven by the data of the LSB bit of the PN code at time $t_1$ of FIG. 23, driven by the data of the second bit at $t_2$, . . . , and driven by the data of the MSB bit at time $t_{15}$. In the multiplication and summing operation, the data are multiplied by the coefficient corresponding to the data of the respective bits of the PN code and the products are then summed.

The column line $C_2$ is driven by the bit train of the PN code one bit shifted (rightward circulated) as in the data of the second bit of the PN code at each time as shown in FIG. 23. The voltage data dS2 at the intersection of the column line $C_2$ is determined by multiplying a coefficient PNs(i) corresponding to the data PNi of each bit of the bit train of 0 (LSB), 1, 1, 1, 1, 0, 1, 0, 1, 1, 0, 0, 1, 0, 0 (MSB)} by the measurement data dj and summing the products throughout one cycle. This process is the multiplication and summing process of the PN code. As shown below, the voltage data dSi at each intersection is determined by performing the multiplication and summing operation on the data of the bit train of the PN code shifted by a predetermined number of bits. In the multiplication and summing operation during decoding, the default PN code is used for the column line $R_1$, and the PN codes successively one bit shifted for the respective column lines in the order of measurement are used.

In the multiplication and summing operation during decoding, for data measured at each time, the column number of the intersection to be determined, and the data of the bit of the order number of the bit arrangement of the PN code used at that time are multiplied, and then the resulting products are summed. In other words, at each time during measurement, the data of the bit of the PN code that has been used to drive the corresponding column line and the coefficient corresponding to the same data are multiplied.

In accordance with equation (2), the decode processing circuit 10 performs the following calculation process based on the bit train of the PN code {1, 1, 1, 1, 0, 1, 0, 1, 1, 0, 0, 1, 0, 0, 0} for the 15 column lines:

$$dS1 = +d1 + d2 + d3 + d4 - d5 + d6 - d7 + d8 + d9 - d10 - d11 + d12 - d13 - d14 - d15$$

$$dS2 = -d1 + d2 + d3 + d4 + d5 - d6 + d7 - d8 + d9 + d10 - d11 - d12 + d13 - d14 - d15$$

$$dS3 = -d1 - d2 + d3 + d4 + d5 + d6 - d7 + d8 - d9 + d10 + d11 - d12 - d13 + d14 - d15$$

$$dS4 = -d1 - d2 - d3 + d4 + d5 + d6 + d7 - d8 + d9 - d10 + d11 + d12 - d13 - d14 + d15$$

...

$$dS15 = +d1 + d2 + d3 - d4 + d5 - d6 + d7 + d8 - d9 - d10 + d11 - d12 - d13 - d14 + d15$$

The decode processing circuit 10 thus separates the data string of the measurement data di into the voltage data dsi corresponding to the capacitance value of each sensor.

In accordance with the first preferred embodiment, a plurality of column lines are driven in response to the PN code, and the phase of the PN code is changed at the next timing. This process is repeated. The multiplication and summing process is performed on the PN code and the data that has been acquired in time sequence by the detector side. The effect of the capacitance at the intersection of the other column line is significantly averaged while only information of charge stored and discharged at the intersection (capacitive sensor) of the target column line is extracted.

In accordance with the first preferred embodiment, the M sequence from among other sequences is used as the PN code. The M sequence, having excellent autocorrelation, averages the effect of the adjacent column lines on the detector during the decode process, thereby minimizing the effect of crosstalk between the column lines.

Figure 12A:
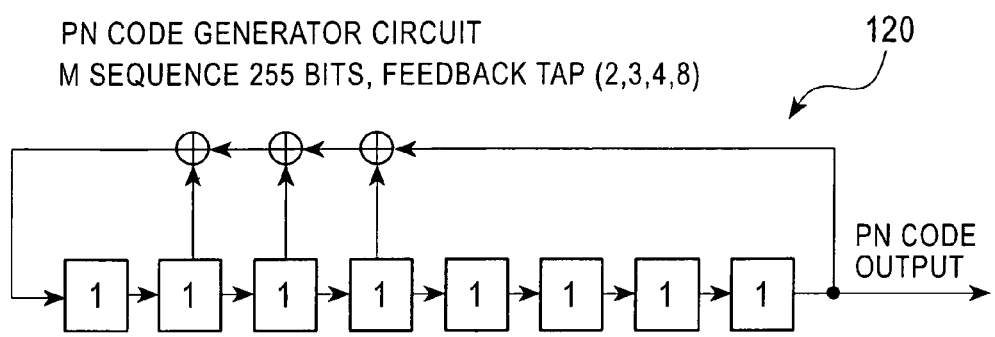
FIGS. 12A and 12B illustrate the structure of a PN code generator circuit for generating the PN code for 255 column lines.
Figure 12B:
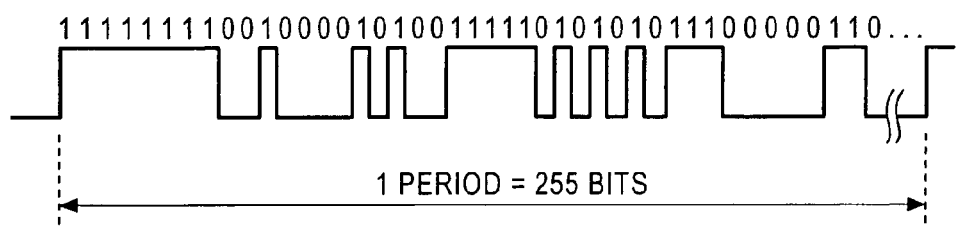

The length of the M sequence depends on the number of column lines. For example, if the number of column lines is 255, the LFSR 120 generating the M sequence has eight stages as shown in FIG. 12, and the length of one cycle is 255 bits (here the unit of length is bit although the unit of length is chip in the CDMA communication).

Figure 13:
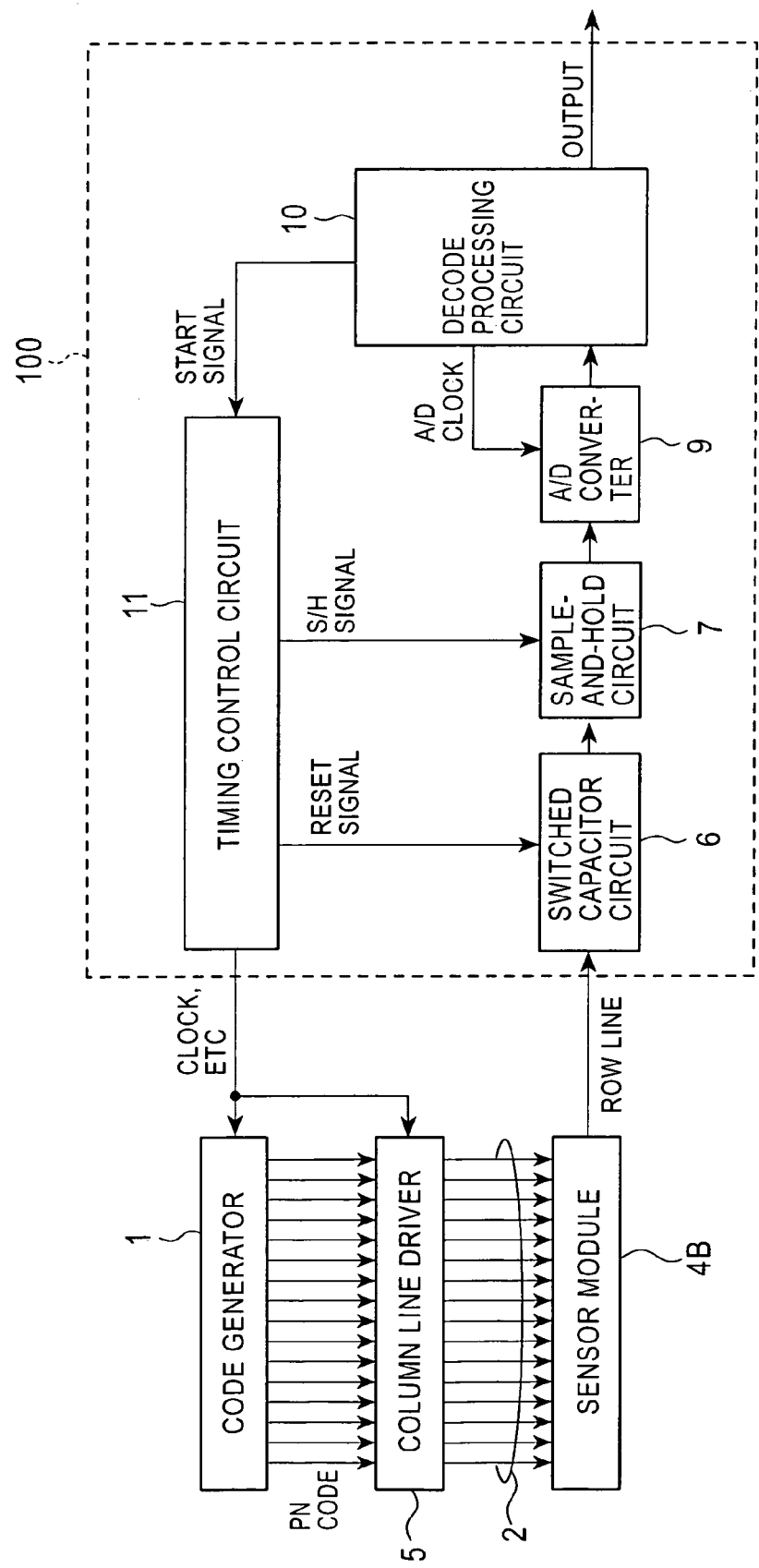
FIG. 13 is a block diagram illustrating the structure of a line sensor incorporating the first preferred embodiment of the present invention.

FIG. 13 is a block diagram illustrating the structure of a line sensor 4B in accordance with the first preferred embodiment of the present invention.

The line sensor 4B has a plurality of column lines and only a single row line.

The capacitance detector circuit is identical in structure to the area sensor except that the selector 8 is not included. Like elements are designated with like reference numerals, and the discussion thereof is omitted here.

In comparison with the area type sensor, the line type sensor is small in the scale of circuit, leading to lower power consumption and low cost design.

To use the line type sensor as a fingerprint sensor, a finger is swept across the sensor in a direction substantially perpendicular to the direction of the row line. The timing control circuit 11 outputs required signals with a predetermined period for measurement, and the decode processing circuit 10 thus obtain two-dimensional fingerprint data by concatenating measurement data that is input on a per row line basis every predetermined period.

Second Preferred Embodiment

A second preferred embodiment of the present invention is described below with reference to FIG. 1. The discussion of the elements and operation identical to those of the first preferred embodiment is omitted here. In the capacitance detector circuit of the second preferred embodiment, the PN code generator 1 circulates the generated PN code for a plurality of cycles, and the column line driver 5 outputs the drive pulse train for the plurality of cycles to the column line array 2 to acquire measurement data for the plurality of cycles. In response to the PN code, the decode processing circuit 10 performs the multiplication and summing process on the acquired measurement data, thereby obtaining voltage data corresponding to the capacitance of each sensor element.

Figure 14A:
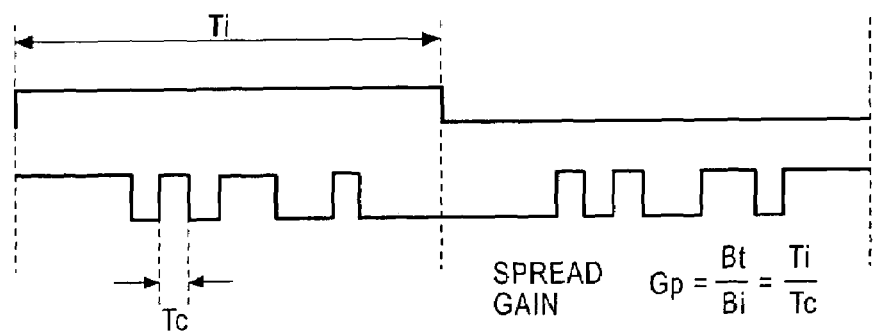
FIGS. 14A and 14B explain that measurement of a plurality of cycles leading to improvement in spread gain in accordance with a second preferred embodiment of the present invention.
Figure 14B:
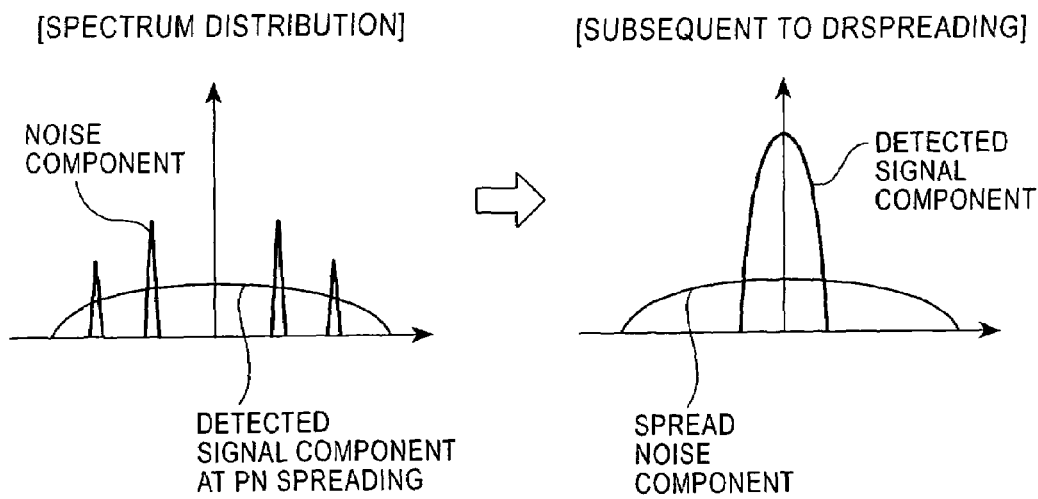

Referring to FIG. 14A, a spread gain is obtained. More specifically, in spread spectrum communication, spread gain GP is determined if transmission bandwidth BT is large with respect to bandwidth Bi of information as in the following equation:

$$GP=BT/Bi=Ti/Tc$$

If the transmission bandwidth BT is four times the information bandwidth Bi, the spread gain GP is quadrupled to 6 dB. Here, Ti represents the period of information bit, and TC represents the period of the chip of a spread code.

The capacitance detector circuit of the second preferred embodiment performs a process by a plurality of times by shifting the bit train of the PN code, and multiplexing the measurement capacitances. The number of measurements at the sensor element of a single intersection is increased. If a noise component is superimposed during PN spreading, a decode process spreads the noise component as shown in FIG. 4B. The S/N ratio is even further improved in comparison with the first preferred embodiment. Elements identical to those of the first preferred embodiment are designated with the same reference numerals.

As shown in FIG. 15, the decode processing circuit 10 successively measures the data string {d1, ..., d15} of the measurement data in time sequence for a first cycle in the same manner as the first preferred embodiment.

In accordance with the first preferred embodiment, the multiplication and summing process is performed on the measurement data collected for the first cycle in accordance with the PN code, and calculates the measurement data corresponding to the capacitance of each sensor element. Unlike the first preferred embodiment, the capacitance detector circuit of the second preferred embodiment performs measurements by four cycles, for example. A data string {d16, d17, ..., d30} of the measurement data is determined for a second cycle, a data string {d31, d32, ..., d45} of the measurement data is determined for a third cycle, and a data string {d46, d47, ..., d60} of the measurement data is determined for a fourth cycle, successively. The decode processing circuit 10 stores the data strings on a per row line basis in a memory of the row line array 3. The measurement data di in time sequence in each cycle is expressed using equation (1).

The decode processing circuit 10 performs the multiplication and summing process on the measurement data di in time sequence in each cycle in accordance with the PN code using the following equation (3):

$$dsi = \sum_{j=1}^{NM} \begin{cases} PNs(((j-i)\mod N)+1) \times d(j) & (j \geq i) \\ PNs(j-i+1+N) \times d(j) & (j < i) \end{cases} \quad (3)$$

to separate the voltage data dSi corresponding to the capacitance of each sensor element, namely, the voltage data Vs.

In equation (3), "mod" represents a remainder operation, M represents the number of repetition of multiplexing process of the PN code, namely, the number of measurement cycles using the PN code, and MN thus represents the product of M and N. To obtain the voltage data of each sensor element, the data string of the measurement data di multiplexed by the PN code is decoded using the PN code. The PN code used to obtained the measurement data for use in the multiplication and summing process is circulated by one bit by one bit in phase up until one cycle is completed. The cycle is identical to the cycle in the first preferred embodiment. As in equation (2), PNs(i)=+1 when the data of the bit of PN code is PNi=1, and PNs(i)=−1 when PNI=0 in equation (3).

In accordance with equation (3), the decode processing circuit 10 separates the data string of the measurement data di in time sequence for a plurality of cycles into the voltage data ds of each sensor element on a per row line basis (see FIG. 16).

Third Preferred Embodiment

Figure 17:
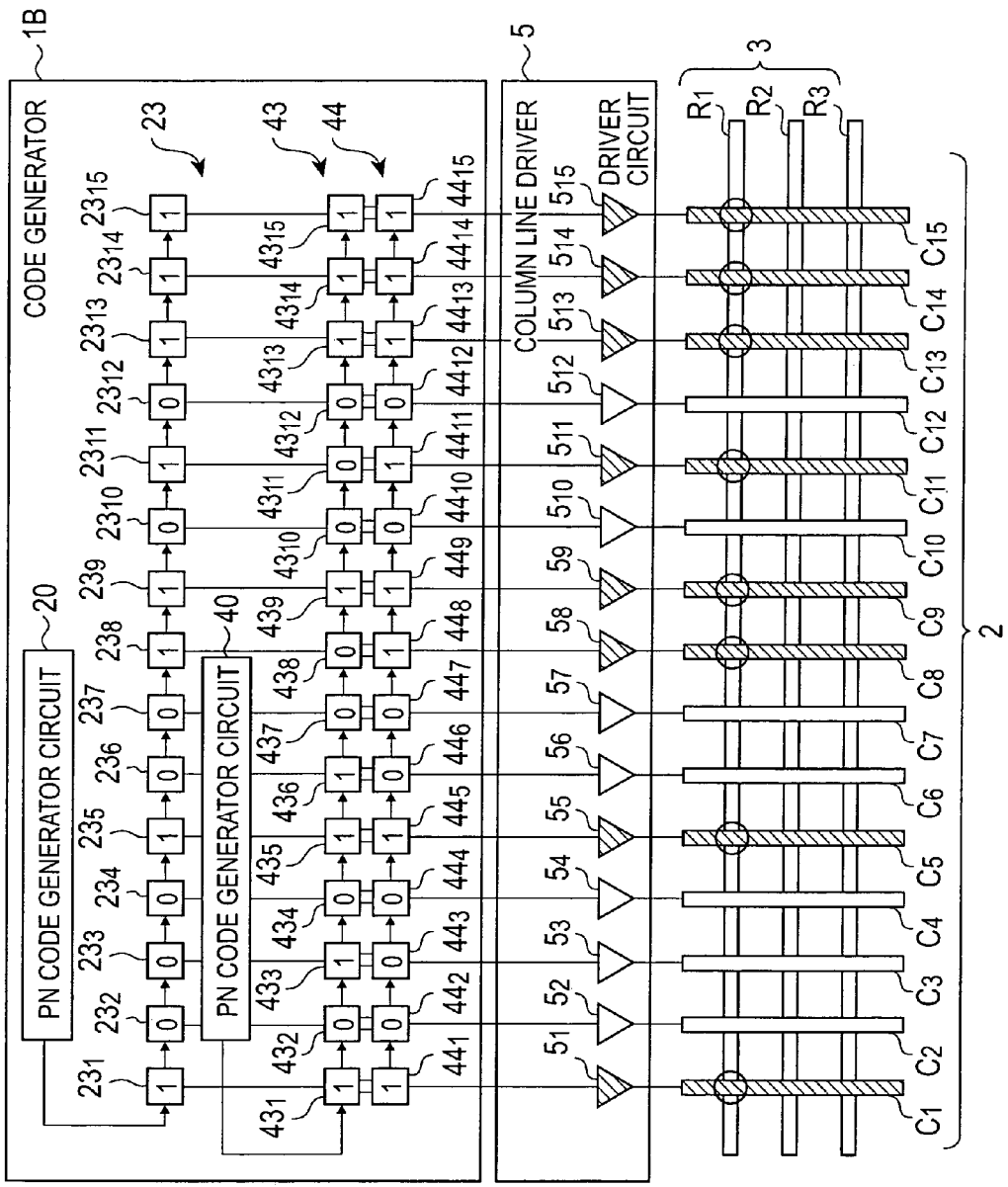
FIG. 17 illustrates the concept of a code generator in accordance with a third preferred embodiment of the present invention.

Referring to FIG. 17, a capacitance detector circuit of a third preferred embodiment of the present invention is described below. FIG. 17 is a block diagram illustrating the structure of a code generator 1B and a column line driver 5 in accordance with the third preferred embodiment of the present invention. Elements in the third preferred embodiment identical to those discussed with reference to the second preferred embodiment are designated with the same reference numerals.

As in the second preferred embodiment, a measurement operation of shifting the bit train of the PN code and multiplexing the capacitance of the sensor elements on a per row line basis is performed for a plurality of cycles. The difference of the third preferred embodiment from the second preferred embodiment is that the multiplexing operation is performed using a different PN code for each cycle. More specifically, two types of PN codes are generated, and each time one cycle is completed, the detector switches between one PN code and the other PN code.

The code generator 1B of FIG. 17 uses two PN codes A and B. The code generator 1B includes a PN code generator circuit 40, a storage shift register 43, and a code selector 44 in addition to the PN code generator circuit 20 and the storage shift register 23 of the first and second preferred embodiments. In accordance with the third preferred embodiment of the present invention, a plurality of column lines of the column line array 2 are driven with the two types of PN codes A and B alternately generated, each type for twice.

Figure 18A:
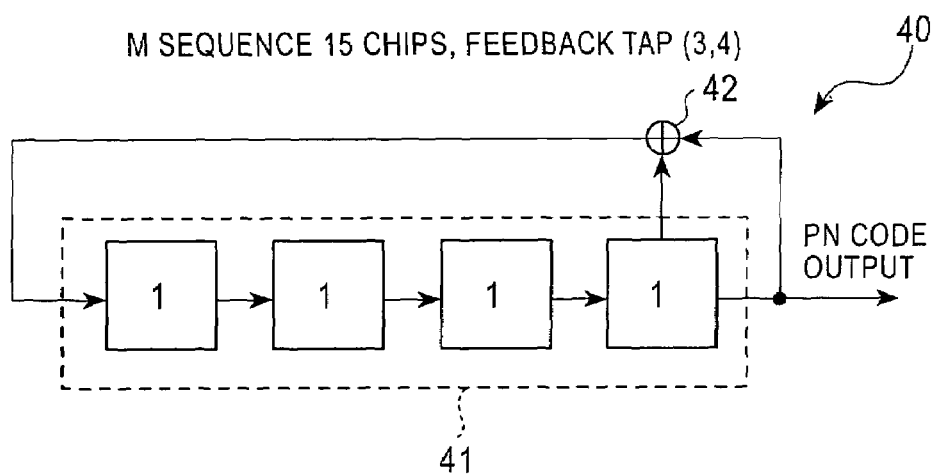
FIGS. 18A and 18B illustrate the concept of a PN code generator circuit for generating a PN code in accordance with the third preferred embodiment of the present invention.
Figure 18B:
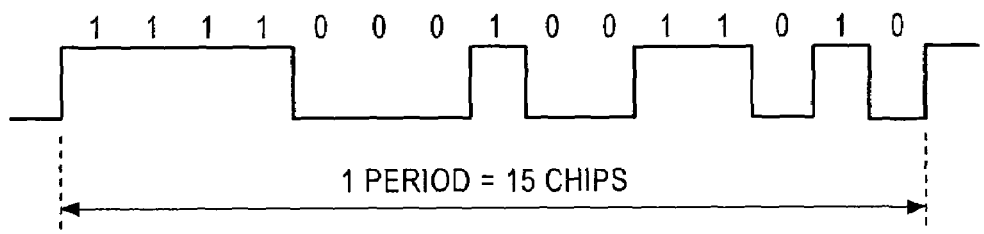

The structure of the PN code generator circuit 40 is described below with reference to FIGS. 18A and 18B. The PN code generator circuit 40 shown in FIG. 18A outputs an M sequence PN code in synchronization with the clock. The PN code generator circuit 40, generating an M sequence 15 bit PN code, includes a 4-bit shift register 41 and an exclusive OR (EXOR) gate 42. The shift register 41 is connected to the EXOR gate 42.

The EXOR gate 42 exclusive OR gates a tap 3 of the shift register 41 (the output of the third bit of the shift register 41) and a tap 4 of the shift register 41 (the output of the fourth bit of the shift register 41), and inputs an exclusive OR gated output to the input of the shift register 41. The PN code generator circuit 40 shifts the data of the bits of the shift register 41 in synchronization with the clock signal, thereby successively generating the data of the bit train of the PN code B in synchronization with the clock signal. The PN code generator circuit 40 writes the data of the bit train (one cycle of 15 bits (chips)) in the internal shift register 43 of FIG. 17 in time sequence in the order of {1 (LSB), 1, 1, 1, 0, 0, 0, 1, 0, 0, 1, 1, 0, 1, 0 (MSB)} from left to right as shown in FIG. 8B in synchronization with the clock signal.

Returning to FIG. 17, the code selector 44 receives the data of the bit trains of the PN codes A and B stored in the storage shift register 23 and the storage shift register 43, respectively, and switches between the PN code A and the PN code B.

The code selector 44 receives a switching signal every cycle. The code selector 44 selects and outputs the bit train of the PN code A stored in the storage shift register 23 for first and third cycles, and selects and outputs the bit train of the PN code B stored in the storage shift register 43 for second and fourth cycles.

Register stages $23_1$, $23_2$, $23_3$, $23_4$, $23_5$, $23_6$, $23_7$, $27_8$, $23_9$, $23_{10}$, $23_{11}$, $23_{12}$, $23_{13}$, $23_{14}$, and $23_{15}$ in the storage shift register 23 are connected to selectors $44_1$, $44_2$, $44_3$, $44_4$, $44_5$, $44_6$, $44_7$, $44_8$, $44_9$, $44_{10}$, $44_{11}$, $44_{12}$, $44_{13}$, $44_{14}$, and $44_{15}$ in the code selector 44, respectively. Register stages $43_1$, $43_2$, $43_3$, $43_4$, $43_5$, $43_6$, $43_7$, $43_8$, $43_9$, $43_{10}$, $43_{11}$, $43_{12}$, $43_{13}$, $43_{14}$, and $43_{15}$ in the storage shift register 43 are connected to the selectors $44_1$, $44_2$, $44_3$, $44_4$, $44_5$, $44_6$, $44_7$, $44_8$, $44_9$, $44_{10}$, $44_{11}$, $44_{12}$, $44_{13}$, $44_{14}$, and $44_{15}$ in the code selector 44, respectively.

As shown in FIG. 19, the code selector 44 switches the storage shift register outputting the data every cycle. The data of the bit train of the PN code A stored in the storage shift register 23 is used for the data string {d1, d2, . . . , d15} of the measurement data for the first cycle. The data of the bit train of the PN code B stored in the storage shift register 43 is used for the data string {d16, d17, . . . , d30} of the measurement data for the second cycle. The data of the bit train of the PN code A stored in the storage shift register 23 is used for the data string {d31, d32, . . . , d45) of the measurement data for the third cycle. The data of the bit train of the PN code B stored in the storage shift register 43 is used for the data string {d46, d47, . . . , d60} of the measurement data for the fourth cycle. The measurement process of the measurement data other than the switching between the PN code A and the PN code B every cycle is identical to the data measurement through multiplexing by a plurality of cycles in accordance with the second preferred embodiment of the present invention.

The measurement data from the first cycle to the fourth cycle every row line is stored in the internal memory of the decode processing circuit 10.

In the decode process for determining the voltage data dSi corresponding to the capacitance of each sensor element in the sensor 4 from the multiplexed measurement data, the decode processing circuit 10 determines the voltage data dSi–n (n is a cycle number) corresponding to the column line using equation (2), and sums the dSi–n determined for the column lines in each cycle, thereby determining the dSi of each sensor from the data string of the multiplexed measurement data di.

A signal component (voltage data) of the capacitance of the sensor element at the intersection is thus extracted, by performing a total of four cycles of multiplication and summing operations, two cycles for the PN code A and two cycles for the PN code B. The voltage data dSi is thus calculated every row line in the same manner as in the first and second preferred embodiments of the present invention.

Fourth Preferred Embodiment

In each of the preceding preferred embodiments of the present invention, the phase of the PN code is shifted bit by bit in the multiplexing process. In accordance with a fourth preferred embodiment of the present invention, a PN code generator varies the phase of the PN code by hopping, namely, by shifting the PN code by a random number of bits (scrambling the phase). Since the voltage data at each sensor element must be multiplexed on a per row line basis, 15 PN bit trains different in phase are generated with none of the bit trains having the same phase.

In accordance with the fourth preferred embodiment of the present invention, a detection signal that is multiplexed in accordance with the number of bits of the PN code required in the multiplication and summing operation is easily obtained without generating different PC codes while the PN code is circulated by one cycle. The effect of disturbance noise is distributed among a set of detection signals different in phase, namely, the data string of {d1, d2, . . . , d14, d15} of the measurement data, resulted from the multiplication and summing process and the shifting operation. As a result, the flattening effect of a filtering process is easily achieved.

The fourth preferred embodiment is described below. Elements identical those discussed in connection with the first, second, and third preferred embodiments are designated with the same reference numerals, and the discussion thereof is omitted here.

Figure 21:
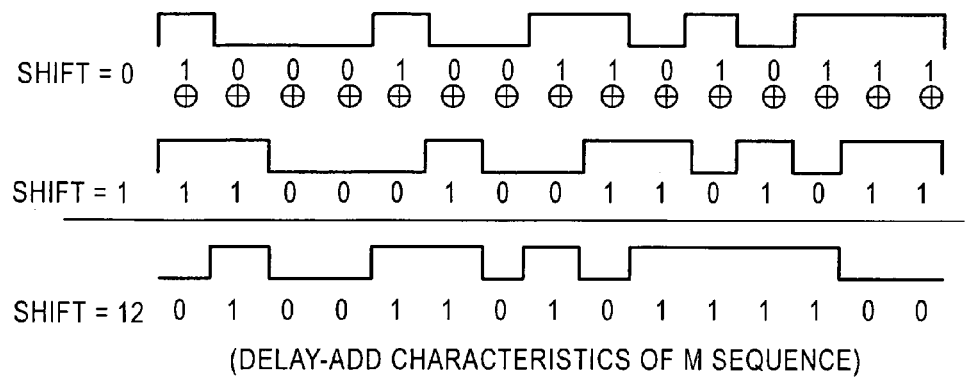
FIG. 21 illustrates the concept of a hopping process in which phase is changed in a random fashion in accordance with a fourth preferred embodiment of the present invention.

FIG. 21 illustrates the concept of the hopping process for changing phase in a random fashion. In the M sequence PN code, the data of each bit of an initial bit arrangement and the data of a bit, at the corresponding position, of a bit arrangement with the phase thereof shifted are exclusively OR gated so that the phase only is randomly varied without varying the data arrangement of the bit train of the PN code as consecutive data string circulated (delay-and-add feature).

A PN code generator 60 scrambles the phase of the bit train of the PN code in a hopping process as described above, and supplies the scrambled PN code to the column line driver 5. The operation of the PN code generator is described below.

Figure 22:
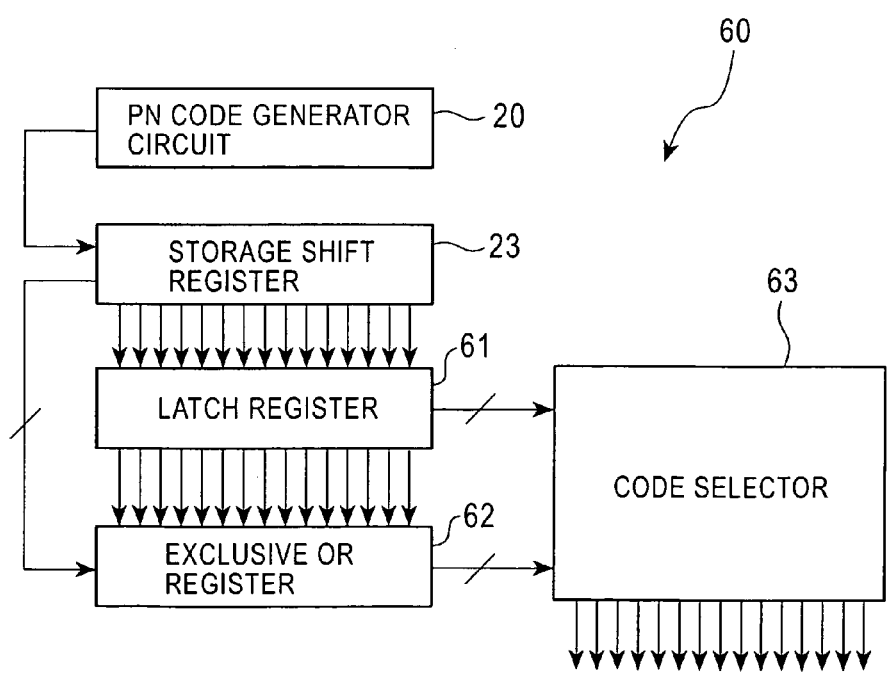
FIG. 22 is a block diagram illustrating the structure of a PN code generator in accordance with the fourth preferred embodiment of the present invention.

FIG. 22 is a block diagram of the PN code generator 60 which scrambles the phase of the PN code in the hopping process, and supplies the column line driver 5 with the scrambled bit train of the PN code.

As shown, in the same process as the one previously discussed in connection with the first preferred embodiment of the present invention, the PN code generator circuit 20 generates the PN code inputs the PN code to the storage shift register 23, which in turn shifts the bit train of the PN code.

A latch register 61 stores the same bit train of {1 (MSB), 1, 1, 0, 1, 0, 1, 1, 0, 0, 1, 0, 0, 0, 1 (LSB)} as the PN code prior to phase shifting, namely, a default bit train as in the first preferred embodiment. The bit train remains unchanged in the subsequent process. Upon receiving the data of the bit trains from the storage shift register 23 and the latch register 61, an exclusive OR register 62 exclusive OR gates the bits in the order of the bit train, and stores the exclusive OR gated result in an internal shift register.

A code selector 63 selects between the data of the bit train stored in the latch register 61 and the data of the bit train stored in the exclusive OR register 62, and outputs the selected data to the column line driver 5.

The operation of the PN code generator 60 of the fourth preferred embodiment of the present invention will now be discussed with reference to FIGS. 21–24. FIG. 23 is a table listing the data of each bit of the bit train of the PN code output by the storage shift register 23 at each one bit shifting. FIG. 24 is a table listing the data output by the code selector 63. The code selector 63 selects between the bit train of the latch register 61 and the phase-hopped bit train the storage shift register 23 outputs in response to the bit train from the storage shift register 23, and outputs the phase-hopped bit train.

To simplify explanation, the following discussion focuses the operation of the PN code generator 60 only. The multiplication operation, which is performed in response to the bit train of the PN code output from the code selector 63, remains unchanged from that previously discussed.

As shown in FIGS. 23 and 24, the time sequence order $\{t_1, t_2, \ldots, t_{13}, t_{14}\}$ indicating the order of shifting is listed on a leftmost column.

As shown in FIG. 23, the bit train at time $t_1$ is the bit train applied to the column lines for the first time subsequent one bit shifting. In succession, the PN code is successively shifted by one bit at each of time $t_1, \ldots, t_{14}$, and $t_{15}$. The outputs of the storage shift register 23 for 14 shifts, through which the data of the bit arrangement is circulated one cycle, are thus listed in the table. The amount of shift is listed at the rightmost column with the amount of shift at time t1 as a default value. At each time, one bit shift is performed. In each of FIGS. 23 and 24, the topmost row of the table lists the bit number of the bit train with "15" being the most significant bit (MSB), and "1" being the least significant bit (LSB).

FIG. 24 shows that the code selector 63 selects the output of the latch register 61 as the bit train at time t1. In succession, the code selector 63 selects and outputs the output of the exclusive OR register 62 in response to the storage shift register 23 at time $t_2, t_3, \ldots, t_{13}, t_{14}$, and $t_{15}$. The amount of shift at the rightmost column, which is calculated with respect to the bit arrangement at time $t_1$ as a default value, fails to correspond to the order of shift. The amount of shift at the right most column is a random amount for shifting the PN code at random, but the bit data arrangement of the PN code remains unchanged. None of the shift orders have the same phase in the bit train. As shown in FIG. 8, the storage shift register 23 varies phase by bit shifting, and the data of the bit train of the PN code successively input from the PN code generator circuit 20 is identical to the data shifted out of the register stage $23_{15}$ and deleted. When the storage shift register 23 performs bit shifting, the bit train is practically circulated, and the data arrangement of the bit train remains unchanged.

As described above, the code selector 63 selects the output of the latch register 61 at time t1 as the bit train of the PN code in the multiplexing operation of the capacitance measurement of the sensor element at each row line only when the data string d1 of the measurement data is measured. In the multiplexing operation in the measurement of the measurement data d2 thereafter, the code selector 63 selects and outputs the output of the exclusive OR register 62. The exclusive OR register 62 outputs the bit train of the output of the latch register 61 with the phase thereof scrambled. The code selector 63 then outputs the scrambled bit train to the column line driver 5.

In the decode process for decoding the data string of the multiplexed measurement data into the voltage data ds, the decode processing circuit 10 performs the same process as that of the PN code generator 60, thereby generating the bit train of the PN code required for decoding.

In the same manner as in the preceding embodiments, the decode processing circuit 10 successively multiplies the multiplexed measurement data d by the bit data of the bit train that has been used in the multiplexing operation during measurement, and sums the measurement data multiplied by the bit number of the bit train for each column line, thereby determining the voltage data ds at each sensor element on a per row line basis.

Fifth Preferred Embodiment

Figure 25:
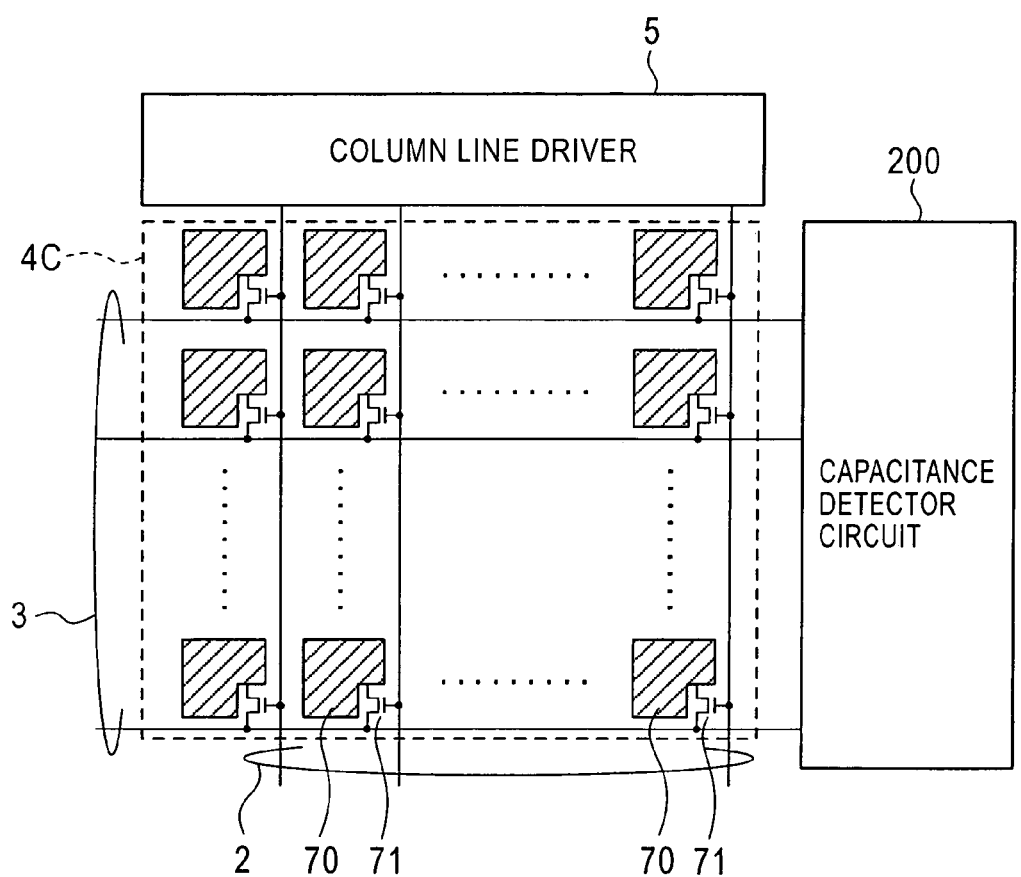
FIG. 25 illustrates the structure of an active matrix type sensor in accordance with a fifth preferred embodiment of the present invention.

With reference to FIG. 4, the capacitances of the sensor elements formed at the column lines and the row lines are multiplexed in the capacitance measurement operation in accordance with the first through fourth preferred embodiments. In a fifth preferred embodiment of the present invention, however, capacitance measurement is performed on a sensor 4C in an active matrix type sensor shown in FIG. 25.

The code generator 1 (or 60) supplies the column line driver 5 with the bit train of the PN code, and the column line driver 5 in turn drives a plurality of column lines in the column line array 2 to multiplex the capacitances of unit capacitance cells (sensor elements) 70 on a per row line basis. In this respect, the fifth preferred embodiment is identical to the first through fourth preferred embodiments. The capacitance detector circuit 200 is identical in structure and operation to the capacitance detector circuit 100 of the first through fourth preferred embodiments, except that the charge amplifier 6 is replaced with a charge amplifier 72 of FIG. 26.

Figure 26:
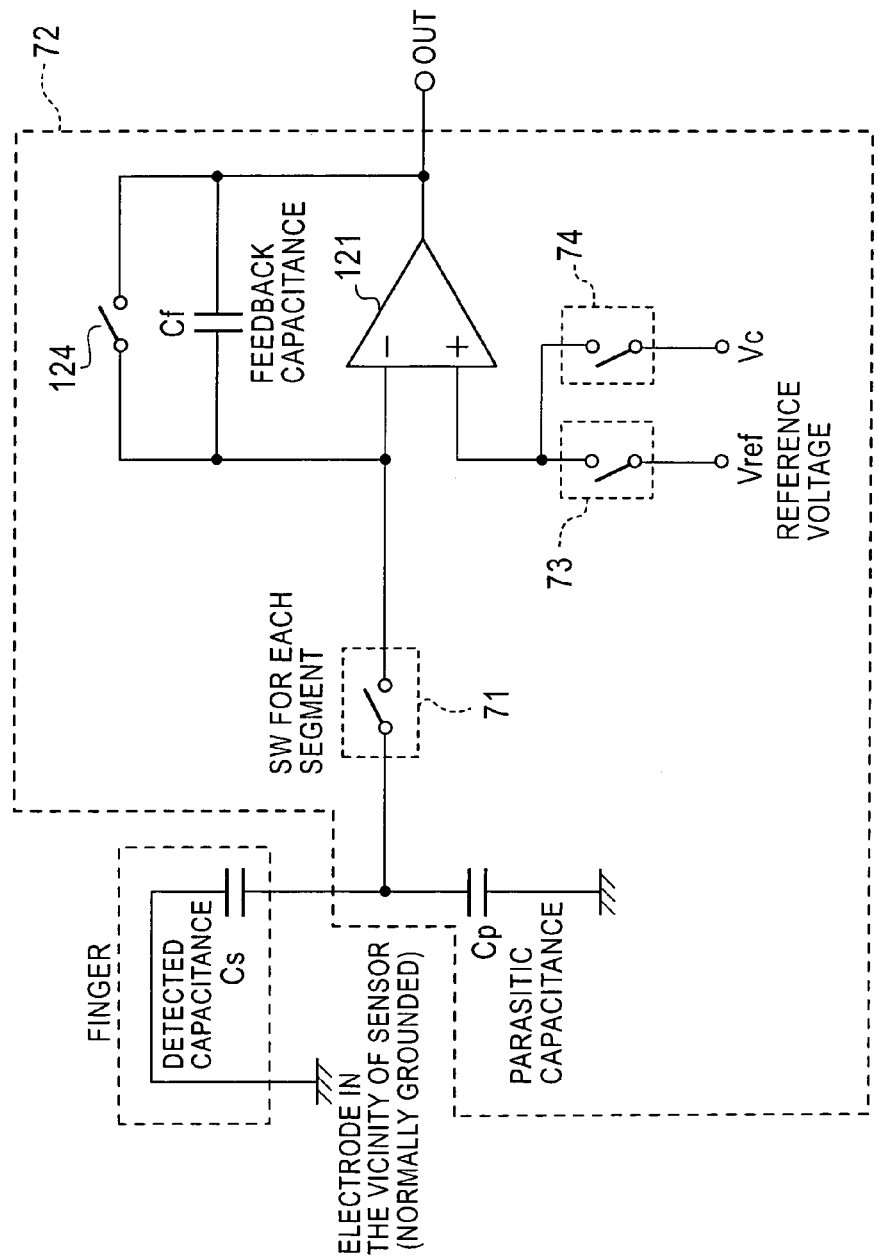
FIG. 26 is a block diagram illustrating the structure of a charge amplifier of the fifth preferred embodiment of the present invention.

Elements in the charge amplifier 72 of FIG. 26 identical to those of the charge amplifier 6 are designated with the same reference numerals. Since the measurement of the active matrix sensor is slightly different, the charge amplifier 72 is different from the charge amplifier 6 accordingly. Only a difference in the measurement operation is described below.

With a switch 73 in an off state, and with a switch 47, a switch 124, and cell selection switches 71 connected to a plurality of column lines corresponding to bit 1 all in an on state prior to the measurement of fingerprint data, the unit capacitance cell 70 (capacitance Cs) and parasitic capacitance Cp are charged up to voltage Vc, and all switches are thus turned off.

In the measurement of the fingerprint data, the switch 74 and the cell selection switch 71 are concurrently turned on with the switch 74 and the switch 124 remaining off. When a finger is placed on the sensor 4C, the capacitance Cs of the unit capacitance cell 70 changes. A voltage corresponding to the sum of charge caused by a difference between the voltage Vc and a reference voltage Vref is provided on an output terminal of the operational amplifier 121. The output voltage as measurement data d is thus stored in the internal memory of the decode processing circuit 10. Multiplexed measurement data di is obtained by repeating a sequence of charge storage and measurement of the voltage. By performing the previously discussed decode process, the decode processing circuit 10 provides the voltage data ds corresponding to the capacitance Cs of each unit capacitance cell 70 from the data string of the measurement data d stored in the internal memory.

Sixth Preferred Embodiment

Figure 27:
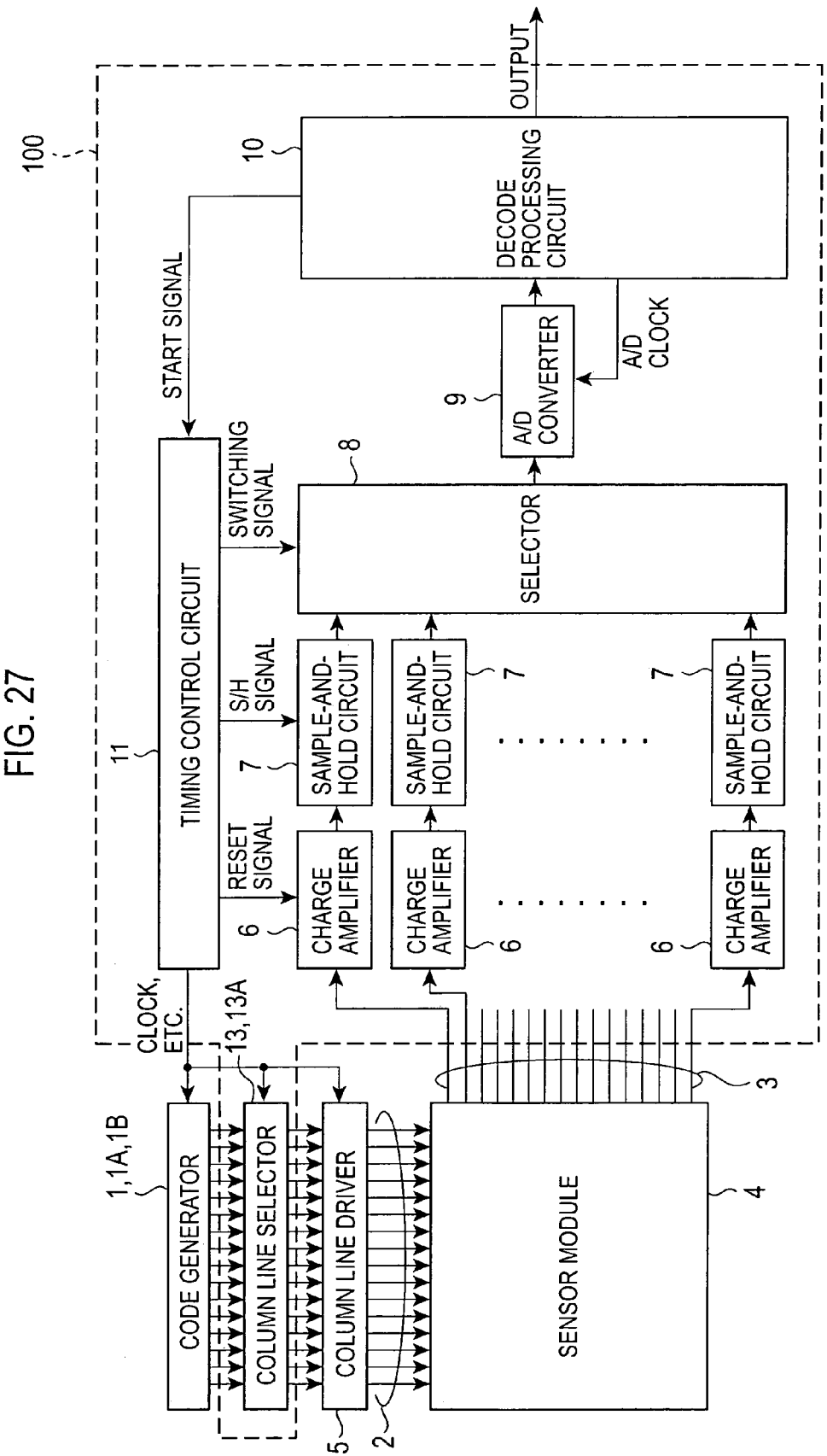
FIG. 27 is a block diagram illustrating the structure of a fingerprint sensor incorporating a capacitance detector circuit of a sixth preferred embodiment of the present invention.

A capacitance detector circuit of a sixth preferred embodiment of the present invention is described below with reference to FIG. 27. FIG. 27 is a block diagram illustrating the structure of the capacitance detector circuit of the sixth preferred embodiment. Elements identical to those discussed in connection with the first through fifth preferred embodiments are designated with the same reference numerals and the discussion thereof is omitted here.

The sixth preferred embodiment relates to the capacitance detector circuit for detecting a change in capacitance at an intersection (sensor element) of a column line and a row line in a matrix type capacitive sensor having a plurality of column lines and a row line intersecting the column lines. A code generator generates a code having orthogonality in time sequence, and divides the plurality of column lines into groups, each group including a predetermine number of column lines. A column line group selector circuit selects a group of column lines to be measured. A column line drive circuit drives the plurality of column lines in each of the successively selected column line groups in response to the code. A capacitance detector circuit outputs, as a measurement voltage, a total sum of currents corresponding to the capacitances at intersections of the plurality of driven column line and the row line, and a decode processing circuit performs a multiplication and summing operation on the measured voltage and the code on a per column line group basis, and for extracting a voltage value responsive to the capacitance at each intersection.

As shown in FIG. 27, the difference of the sixth preferred embodiment of the present invention from the first through fifth preferred embodiments is that a column line selector 13 is added between the code generator 1 and the column line driver 5 in the arrangement of the first through fifth preferred embodiments.

The column line selector 13 divides the column lines in the column line array 2 into column line groups of a predetermined number. A drive signal based on the PN code from the code generator 1 is output to the column lines on a per column line group basis.

Figure 28:
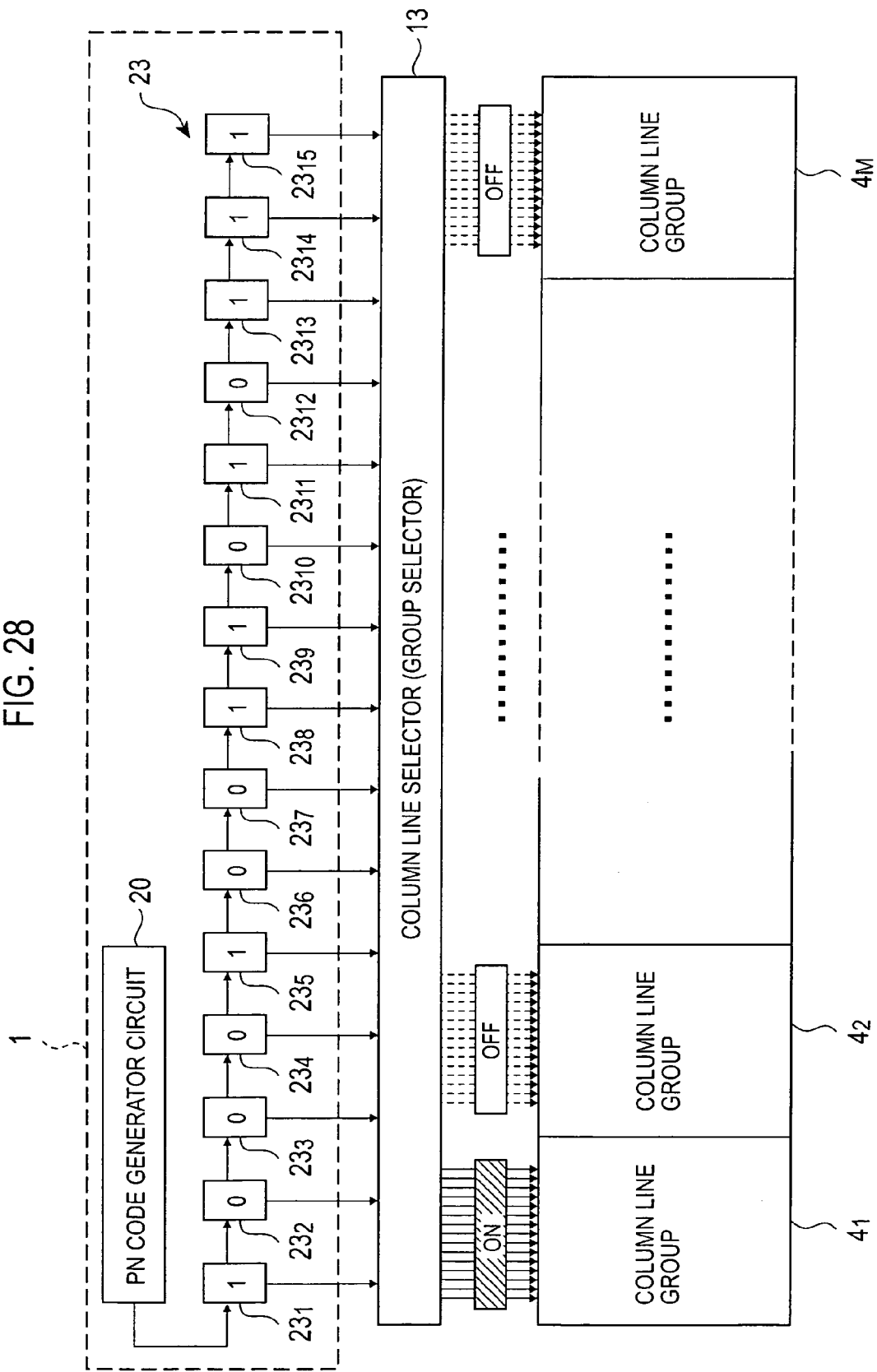
FIG. 28 illustrates the operation of a column line selector of FIG. 27 for selecting a group of column lines from among a plurality of groups into which a column line array is divided.

FIG. 28 illustrates the column line selector (group selector) 13 for selecting a column line group from among the column lines of the entire sensor. In the sixth preferred embodiment of the present invention, consecutively adjacent column lines are arranged in a group. For example, when the PN code having a 15-bit length (N=15) is used, 255 column lines are divided into 17 groups, each group containing 15 consecutive column lines.

In accordance with the sixth preferred embodiment of the present invention, the column line selector 13 does not change the selection of the column line group until the PN code is circulated by one cycle. Upon circulating one cycle of the PN code, the column line selector 13 changes to another column line group in response to a control signal from the timing control circuit 11. Every cycle of the PN code, the column line group is switched.

As shown in FIG. 28, the column line driver 5 divides the column line array 2 into a plurality of groups, for example, M column line groups $4_1$-$4_M$, and outputs the output signal from the storage shift register 23 to successively selected one of the column line groups. The number of column lines in each column line group equals the number of bits of the bit train of the PN code generated by the PN code generator circuit 20. If the number of bits of the PN code is 15 in the example of the sixth preferred embodiment, the number of column lines in each of the column line groups $4_1$-$4_M$ is also 15.

Figure 30:
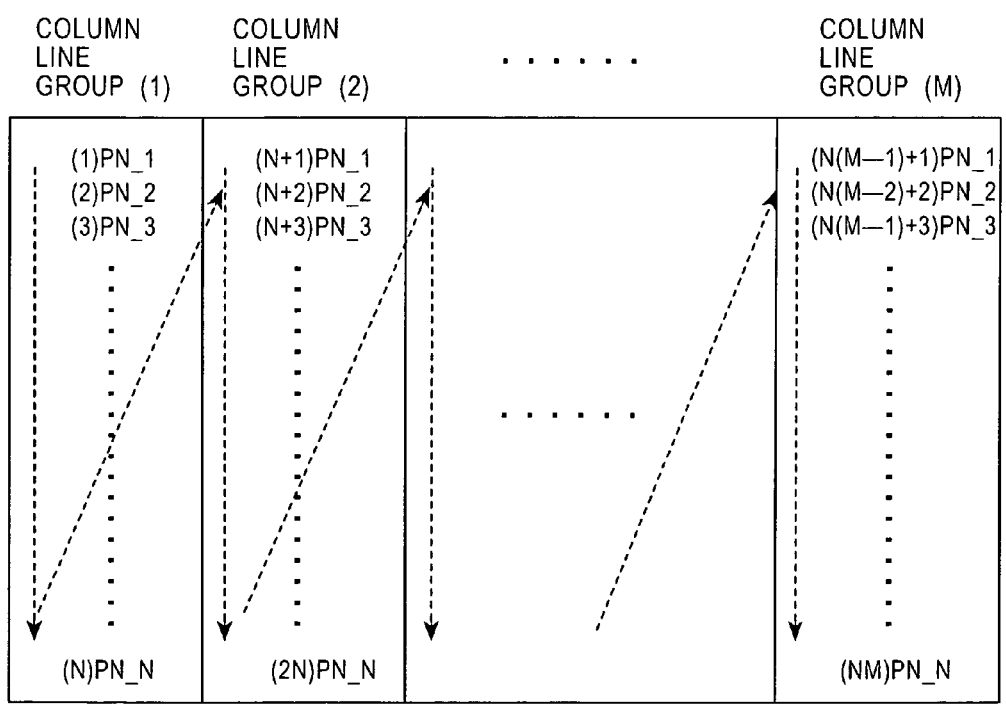
FIG. 30 illustrates the operation of a capacitance detector circuit that divides a column line array into a plurality of groups, and determines the measurement order of each line in each group.

When the capacitance measurement at the intersections of the column lines in one group and the row line is completed for one cycle as shown in FIG. 30, a next column line group is selected in succession. The order of selection of the column line group may be in the order of $4_1$ through $4_M$, or may be selected in a random fashion rather than in the order of position.

The capacitance measurement of the capacitance at the intersections in each column line group will now be discussed.

Figure 29:
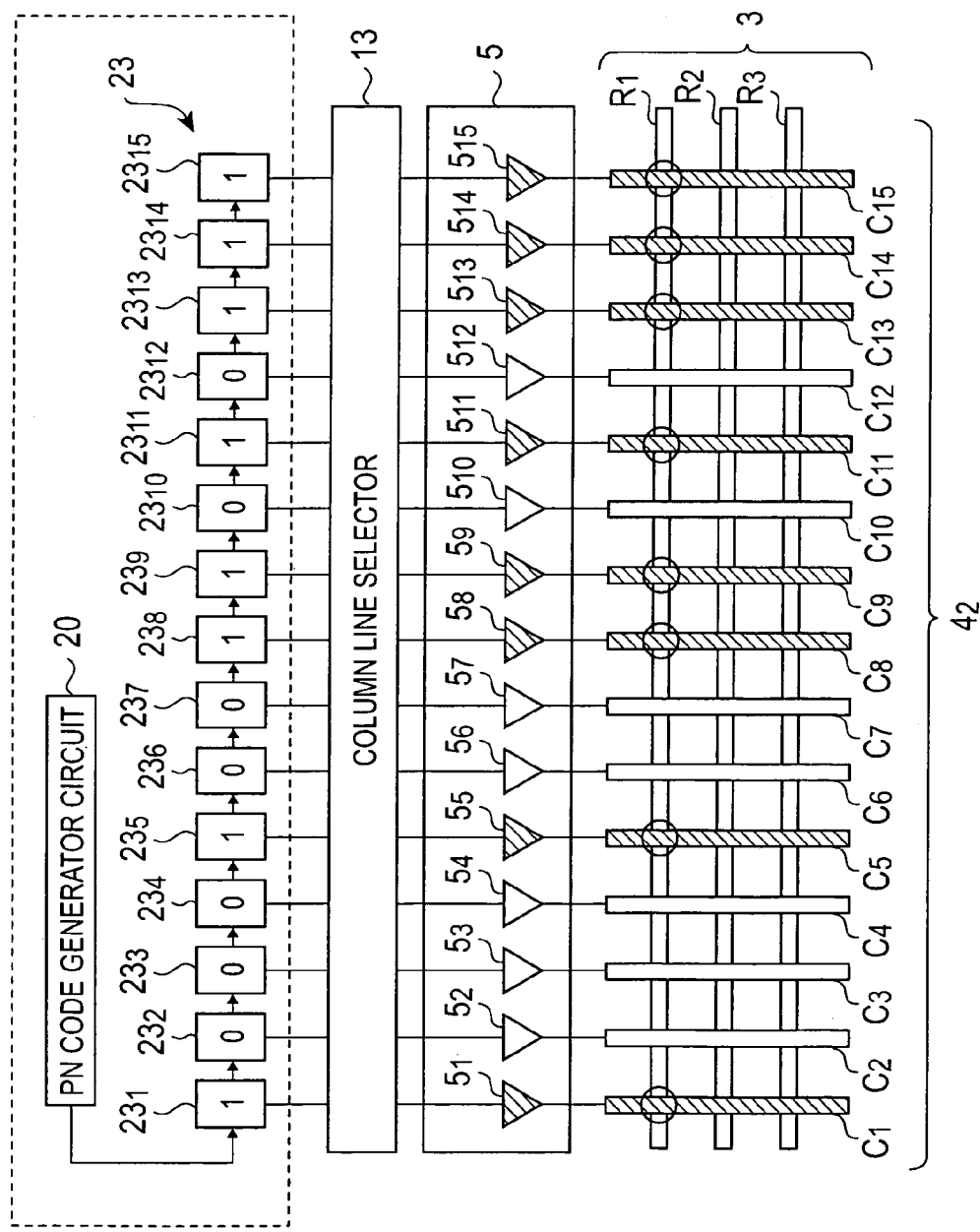
FIG. 29 illustrates the operation of the column line selector that selects a predetermined group of column lines and multiplexes the column lines contained the selected group for capacitance measurement.

As shown in FIG. 29, a predetermined column line group of the column line array 2, such as a plurality of column lines in the column line group $4_1$, are concurrently driven by a drive signal train input through the column line selector 13 in response to the PN code output from the code generator 1. If the PN code includes 15 bits of {1 (MSB), 1, 1, 1, 0, 1, 0, 1, 1, 0, 0, 1, 0, 0, 0 (LSB)}, one cycle for generating the bit train of the PN code is formed of a constant duration of time from time $t_1$ to time $t_{15}$ throughout which the bits are successively shifted in time sequence. The bit train {1 (MSB), 1, 1, 1, 0, 1, 0, 1, 1, 0, 0, 1, 0, 0, 0 (LSB)} of the PN code generated by the PN code generator circuit 20 is thus successively shifted by the storage shift register 23. The storage shift register 23 includes 15 register stages of a register stage $23_1$ through a register stage $23_{15}$. Data is shifted from left to right (from the register stage $23_1$ toward the register stage $23_{15}$). At time $t_1$, "1" of the first bit of the PN code is input to the leftmost register stage $23_1$ of the storage shift register 23. At time $t_2$, "1" of the first bit of the PN code, stored in the register stage $23_1$, is shifted to the register stage $23_2$, while "1" of the second bit of the bit train of the PN code is input to the register stage $23_1$.

The above-referenced shifting operation is performed at times $t_1$, $t_2$, $t_3$, $t_4$, $t_5$, $t_6$, $t_7$, $t_8$, $t_9$, $t_{10}$, $t_{12}$, $t_{13}$, $t_{14}$, and $t_{15}$, thereby inputting the data {1 (MSB), 1, 1, 1, 0, 1, 0, 1, 1, 0, 0, 1, 0, 0, 0 (LSB)} of the bit train of the PN code to register stages $23_{15}$, $23_{14}$, $23_{13}$, $23_{12}$, $23_{11}$, $23_{10}$, $23_9$, $23_8$, $23_7$, $23_6$, $235$, $23_4$, $23_3$, $23_2$, and $23_1$, respectively. The data stored in the register stages $23_{15}$, $23_{14}$, $23_{13}$, $23_{12}$, $23_1$, $23_{10}$, $23_9$, $23_8$, $23_7$, $23_6$, $235$, $23_4$, $23_3$, $23_2$, and $23_1$ of the storage shift register 23 are supplied to driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively. When the period of $t_1$ through $t_{15}$ has elapsed, the bit train {1, 1, 1, 1, 0, 1, 0, 1, 1, 0, 0, 1, 0, 0, 0} of the PN code is already fed to the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively. The operation during the one period of from time $t_1$ through time $t_{15}$ is one cycle for the fingerprint capturing process in accordance with the preferred embodiments of the present invention.

The operation of the storage shift register 23 is described below. When a signal for starting fingerprint capturing is input, 15 clocks of a clock signal are input to the storage shift register 23 from the timing control circuit 11. The register stages $23_{15}$, $23_{14}$, . . . , $23_1$ are set to {1, 1, 1, 1, 0, 1, 0, 1, 1, 0, 0, 1, 0, 0, 0} at a default state. At the first time $t_1$ of the one cycle of the fingerprint capturing process, a clock is input from the timing control circuit 11 to the storage shift register 23. In response to the input clock, the register stages $23_{15}$, $23_{14}$, . . . , $23_1$ in the storage shift register 23 shifts the data thereof by one bit, thereby having {1, 1, 1, 0, 1, 0, 1, 1, 0, 0, 1, 0, 0, 0, 1} (see FIG. 29). In response to the clock signal output from the timing control circuit 11, the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5 drive corresponding column lines $C_{15}$, $C_{14}$, $C_{13}$, $C_{12}$, $C_{11}$, $C_{10}$, $C_9$, $C_8$, $C_7$, $C_6$, $C_5$, $C_4$, $C_3$, $C_2$, and $C_1$ with a drive pulse train of drive pulses, each pulse having a predetermined pulse width (see FIGS. 31(c) and 32(f)).

In the case of a drive pulse train P1 corresponding to the bit train of the PN code, the column line driver 5 outputs a drive pulse having a predetermined voltage in response to "1" of the data of the bit, and doest not output the drive pulse in response to "0" of the data of the bit. The column line driver 5 thus outputs the ground voltage to column lines other than the column lines receiving the drive pulse. At time $t_1$, in response to the drive pulse of the drive pulse train P1, column lines $C_1$, $C_5$, $C_8$, $C_9$, $C_{11}$, $C_{13}$, $C_{14}$, and $C_{15}$ are driven as shown in FIG. 32. A sum of capacitances of capacitive sensors formed of the plurality of driven column lines and each of the row lines $R_1, R_2, R_3, \ldots$ namely, a capacitance value multiplexed in accordance with the bit arrangement of the PN code is connected to each of the row lines $R_1, R_2, R_3, \ldots$ As shown in FIGS. 31(b) and 32(a), the timing control circuit 11 outputs a reset signal to the charge amplifier 6 slightly prior to the rising edge of the drive pulse of the drive pulse train for driving the column lines and slightly prior to the falling edge of the drive pulse. As shown in FIGS. 31(d) and 32(b), the timing control circuit 11 outputs a sample-and-hold signal to the sample-and-hold circuit 7 slightly prior to the reset signal.

The timing control circuit 11 outputs N switching signals (N is the number of sample-and-hold circuits 7) to the selector 8 within the intervals of the inputting of the sample-and-hold signals. As shown in FIG. 32(c), the signals held by the sample-and-hold circuits 7 in response to a single sample-and-hold signal are successively fed to the A/D converter 9 through the selector 8 until a next sample-and-hold signal is supplied. At the timing of an analog-to-digital (A/D) clock (in synchronization with the above-mentioned switching signal) input from the decode processing circuit 10, the A/D converter 9 converts measurement voltage in response to a detection signal for each row line into digital data, thereby outputting the digital data as measurement data d1 to the decode processing circuit 10. The decode processing circuit 10 writes, onto an internal memory on a per row line basis, the data string of measurement data successively input.

The operation of the charge amplifier 6 will now be discussed. When the timing control circuit 11 outputs the reset signal at time $td_1$ slightly prior to time $t_1$ of FIG. 31, the analog switch 124, as a metal-oxide semiconductor (MOS) transistor shown in FIG. 5, is turned on. The feedback capacitance Cf is discharged, causing the output OUT of the operational amplifier 121 to be short-circuited to the inverting input terminal of the operational amplifier 121. The output OUT is set to the reference voltage, and the row line connected to the inverting input terminal of the operational amplifier 121 is also set to the reference voltage.

When the reset signal is transitioned to an off level, field through due to the parasitic capacitance of the gate of the analog switch 124 causes the output voltage of the operational amplifier 121 to slightly rise (see label Fd subsequent to time $td_1$ in FIG. 31(a)).

When a predetermined drive pulse of the bit pattern of the PN code in the drive pulse train (drive pulse train P1 shown in FIG. 32(f) rises at time $t_1$, the drive pulse is fed to the inverting input terminal of the operational amplifier 121 through the sensor element (capacitance Cs) at the intersection of the column line and the row line. A current flowing in response to the voltage value of the drive pulse causes the output OUT of the operational amplifier 121 to gradually drop as shown in FIG. 31(a).

At time $td_2$, the timing control circuit 11 outputs a sample-and-hold signal (S/H) signal to the sample-and-hold circuit 7. Upon receiving the sample-and-hold signal, the sample-and-hold circuit 7 holds the measurement voltage Va output from the output OUT of the operational amplifier 121 in the charge amplifier 6.

At time $td_3$, the timing control circuit 11 outputs a reset signal to the charge amplifier 6 again. In response, the output OUT of the operational amplifier 121 is short-circuited to the inverting input terminal thereof, the feedback capacitance Cf is discharged, and the output OUT of the operational amplifier 121 is returned to the reference voltage. With the reset signal transitioned to off, field through of the gate parasitic capacitance of the analog switch 124 causes the output voltage of the operational amplifier 121 to slightly rise (see label Fd subsequent to time $td_3$ of FIG. 31(a)).

At time $td_4$, the drive pulse of the drive pulse train P1 falls. The sensor element (capacitance Cs) at the intersection of the column line driven by the drive pulse and the row line is discharged in response to a current based on the voltage of the drive pulse. In response, the output OUT of the operational amplifier 121 gradually rises in a voltage level.

At time $td_5$, the timing control circuit 11 outputs a sample-and-hold signal to the sample-and-hold circuit 7. The sample-and-hold circuit 7 holds a measurement voltage Vb of the output OUT of the operational amplifier 121 at the timing of the input of the sample-and-hold signal.

At time $td_6$ (corresponding to $td_1$ at next time $t_2$), the timing control circuit 11 outputs a reset signal to the charge amplifier 6. The output OUT of the operational amplifier 121 in the charge amplifier 6 is thus short-circuited to the inverting input terminal thereof, the feedback capacitance Cf is discharged, and the output OUT of the operational amplifier 121 returns to the reference voltage. The above-referenced operation is repeated (see FIGS. 31(a) and 31(b)).

In the above-referenced measurement operation, an offset Vk due to the field through current of the analog switch 124 is generated in a positive direction regardless of whether the output OUT rises or falls with respect to the reference voltage. In this preferred embodiment, the offset due to the field through is not negligible when the capacitance Cs to be measured falls within a range of several tens of fF to several hundreds of fF. In the above measurement, $-VaO(=-Va+Vk)$ is a voltage proportional to the target capacitance Cs. The voltage to be measured is Va, and contains an error Vk due to offset as follows:

$$Va = VaO + Vk$$

In this preferred embodiment, a voltage Vb during discharging of the target capacitance Cs is also measured. A voltage VbO is expressed as follows:

$$VbO = Vb - Vk$$

Here, VbO is proportional to the capacitance Cs, and the voltage Vb to be measured is expressed as follows:

$$Vb = VbO + Vk$$

The measurement voltages Va and Vb are successively held by the sample-and-hold circuits 7, and the held voltages are analog-to-digital converted by the A/D converter 9 on a per Va and Vb basis, and the resulting digital data is stored in the memory of the decode processing circuit 10. The decode processing circuit 10 performs a calculation operation in accordance with the following equation:

$$d = Vb - Va = (VbO + Vk) - (Vk + VaO) = VbO - VaO$$

In this way, measurement data d corresponding to multiplexed capacitance values, free from an offset error, is obtained.

The decode processing circuit 10 thus determines a difference between the output signals of the charge amplifier 6 in response to the rising of the voltage at the column line and the falling of the voltage of the column line when the predetermined drive pulse in the drive pulse train rises and falls. The decode processing circuit 10 thus determines the capacitance value of the sensor element in a state free from the effect of field through. With the selector used, the time-consuming measurements of the column lines of the charge amplifiers 6 are performed in parallel. A high-speed measurement of the entire sensor is thus achieved.

At time $t_2$ (prior to the rising of a drive pulse P2 shown in FIG. 32(*f*) subsequent to one bit shift), the timing control circuit 11 outputs a clock to the code generator 1. The shift register 21 in the code generator 1 generates "1" with one bit shifted, and outputs the shifted data to the storage shift register 23. In synchronization with the clock, the storage shift register 23 shifts the bits of {1, 1, 1, 0, 1, 0, 1, 1, 0, 0, 1, 0, 0, 0, 1} of the stored PN code by one bit, while writing data "1" input from the shift register 21 onto the register stage $23_1$. In this way, data "1" stored in the register stage $23_{15}$ is pushed out of the storage shift register 23, and disappears. Data "1" stored in the register stage $23_{14}$ is newly written onto the register stage $23_{15}$.

Figure 33:
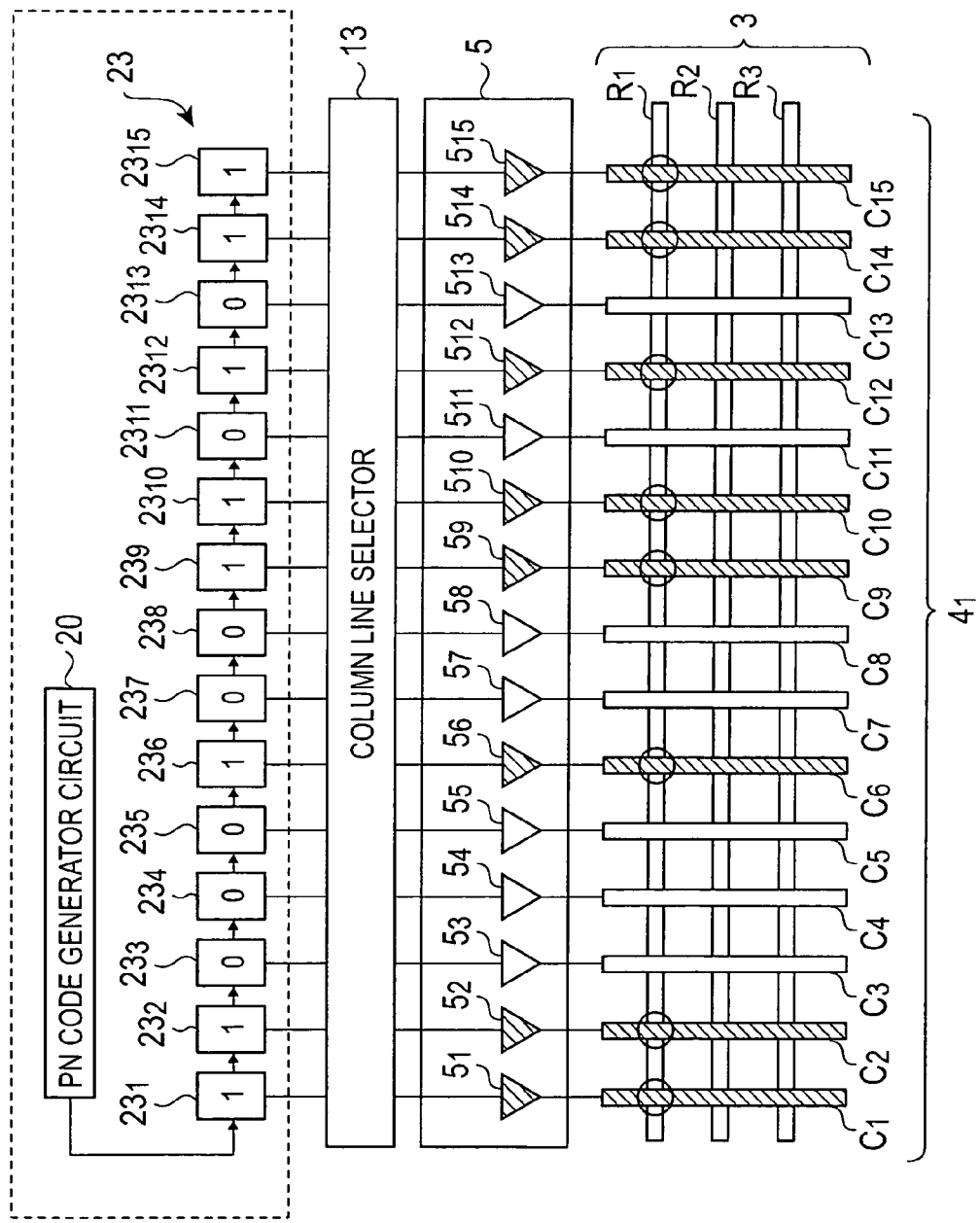
FIG. 33 illustrates the operation of the column line selector of FIG. 28 which selects a predetermined column line group and multiplexes the column lines contained in the selected group for capacitance measurement.

As shown in FIG. 33, the data stored in the register stages $23_{15}$, $23_{14}$, $23_{13}$, $23_{12}$, $23_{11}$, $23_{10}$, $23_9$, $23_8$, $23_7$, $23_6$, $23_5$, $23_4$, $23_3$, $23_2$, and $23_1$ of the storage shift register 23 are the bit train {1, 1, 0, 1, 0, 1, 1, 0, 0, 1, 0, 0, 0, 1, 1}. The outputs of the register stages of the storage shift register 23 are thus fed to the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively. At the end of $t_2$, namely, when of the capacitance values of the plurality of sensor elements in response to the drive pulse train P1 are multiplexed, the bit train of the PN code {1 (MSB), 1, 0, 1, 0, 1, 1, 0, 0, 1, 0, 0, 0, 1, 1 (LSB)} is the PN code with the bit arrangement (phase) thereof shifted by one bit, and is fed to the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5, respectively.

At time $t_2$ in response to the clock signal output from the timing control circuit 11, the driver circuits $5_{15}$, $5_{14}$, $5_{13}$, $5_{12}$, $5_{11}$, $5_{10}$, $5_9$, $5_8$, $5_7$, $5_6$, $5_5$, $5_4$, $5_3$, $5_2$, and $5_1$ in the column line driver 5 drive corresponding column lines $C_{15}$, $C_{14}$, $C_{13}$, $C_{12}$, $C_{11}$, $C_{10}$, $C_9$, $C_8$, $C_7$, $C_6$, $C_5$, $C_4$, $C_3$, $C_2$, and $C_1$ with a drive pulse train (drive pulse train P2 subsequent to one bit shifting) of drive pulses, each pulse having a predetermined pulse width. See FIGS. 31(*d*) and 32(*f*). At time $t_2$, in response to the drive pulse of the drive pulse train P1, column lines $C_1$, $C_2$, $C_6$, $C_9$, $C_{10}$, $C_{12}$, $C_{14}$, and $C_{15}$ are driven (see FIG. 33). The state at time $t_2$ all corresponds the state to time $t_1$ already discussed.

Figure 31:
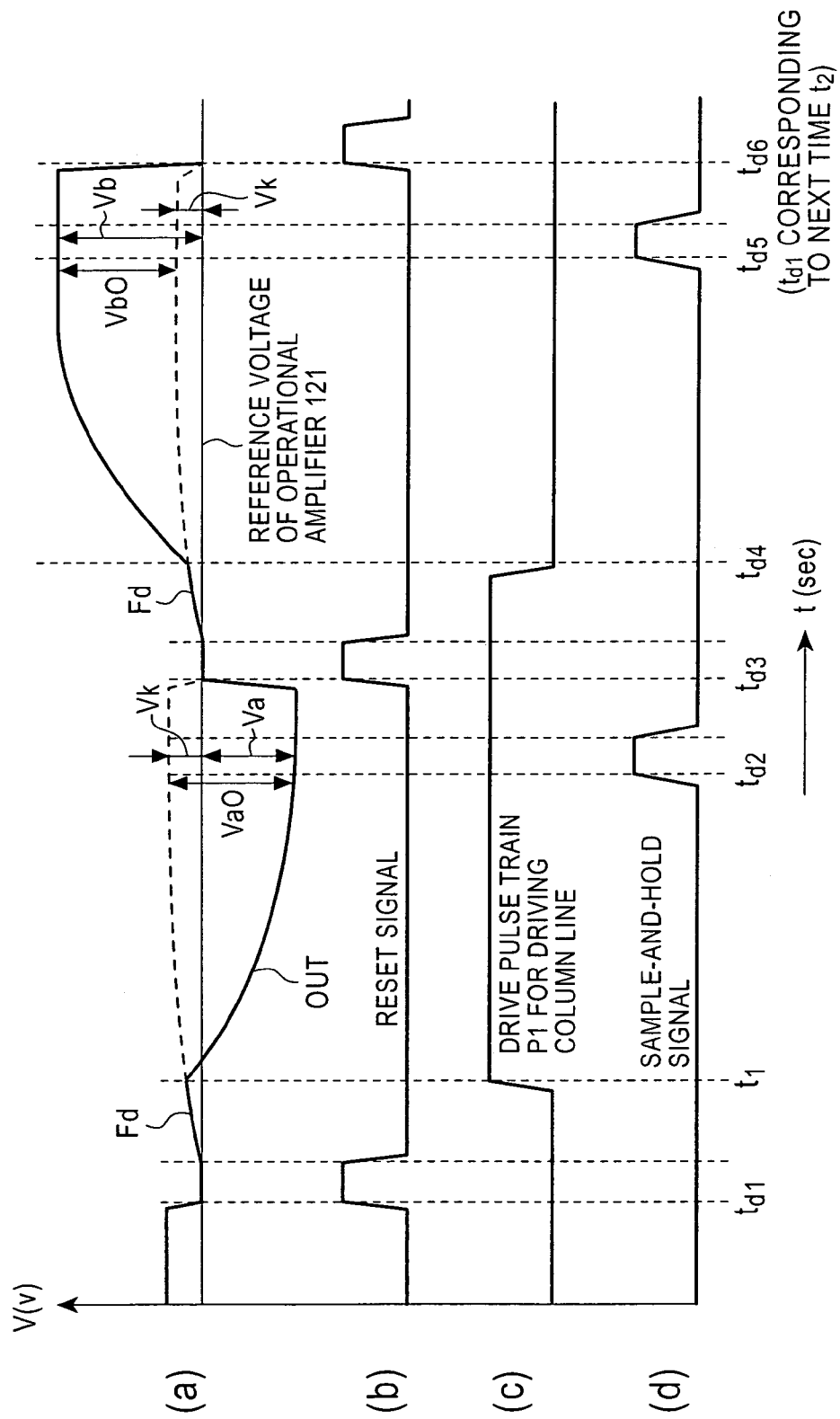
FIG. 31 is a timechart illustrating the detected signal and the operation of a charge amplifier in accordance with the sixth preferred embodiment of the present invention.
Figure 32:
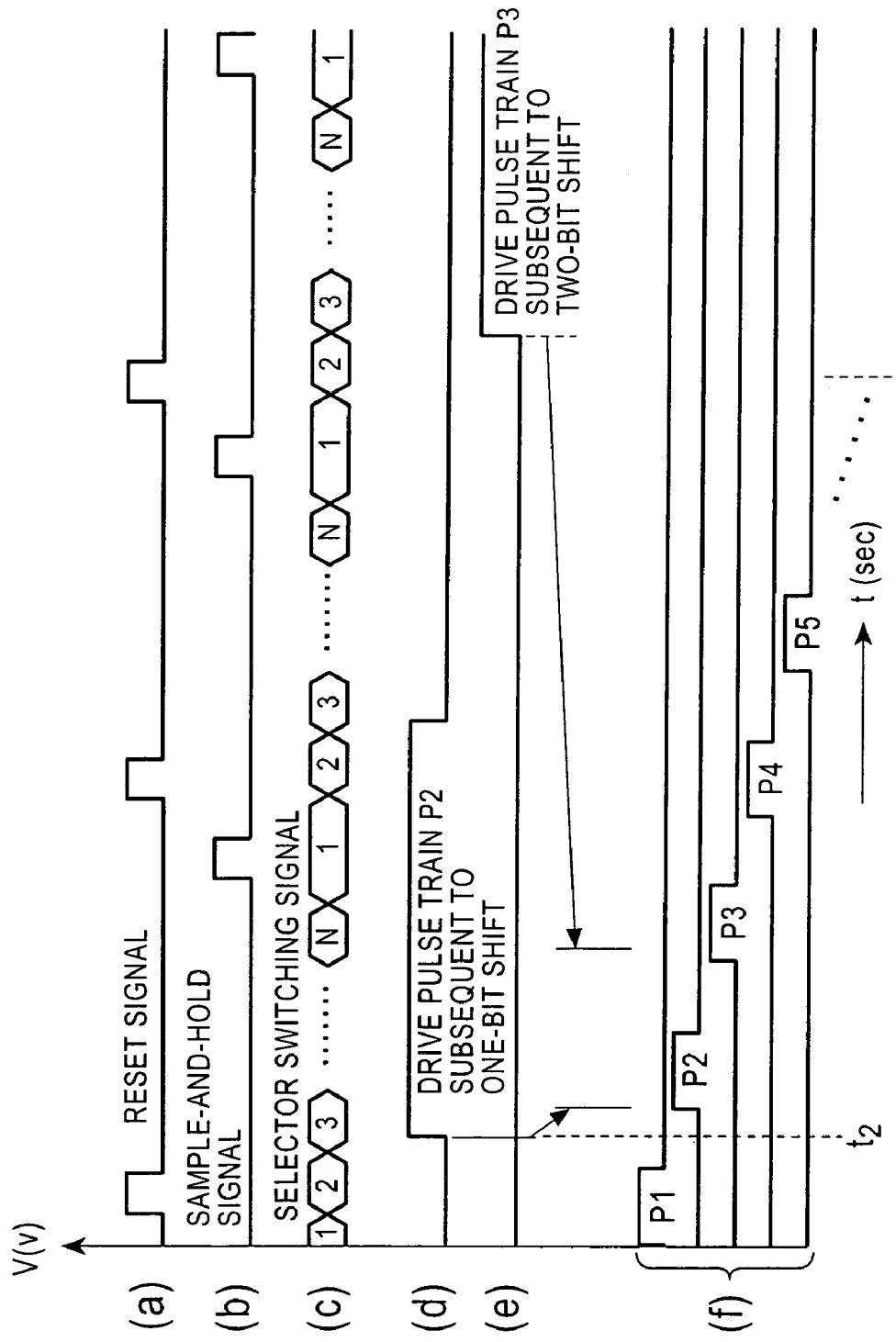
FIG. 32 is a timechart illustrating the control process of the selector and the column lines in accordance with the first preferred embodiment of the present invention.

At or in the vicinity of $t_2$, the operation from $td_1$ to time $td_5$, already discussed with reference to FIG. 31, is repeated. When the bit train of the PN code is shifted by one bit, the plurality of column lines are driven, the capacitance values of the plurality of sensor elements are multiplexed, and the multiplexed capacitances are then converted to a voltage value. Thus, the measurement voltage is obtained.

Figures 34, 35:
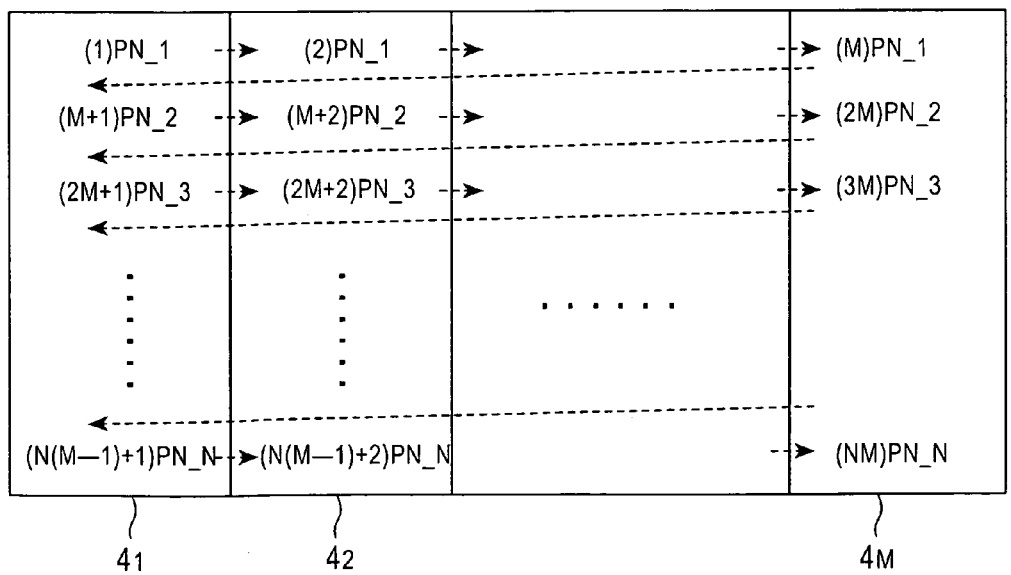
FIG. 34 is a table listing data stored in a storage shift register at each time.
FIG. 35 illustrates the operation of the column line selector of FIG. 28 which selects a predetermined column line group and multiplexes the column lines contained in the selected group for capacitance measurement.

The process discussed with reference to time $t_1$ and time $t_2$, namely, the process performed from time $td_1$ to time $td_5$ as shown in FIG. 31 is repeated at each timing of time $t_3$ through time $t_{15}$. FIG. 34 shows the bit arrangement of the PN code of the storage shift register 23 at each time. The bit shifting of the PN code, the driving of the column lines, and the voltage measurement are repeated for one cycle to perform fingerprint capturing.

In response to the drive pulse train of the drive pulses P1-P15, the capacitance detector circuit 100 drives a plurality of column lines in the column line array 2, and performs the measurement process each time the 15 bit PN code is successively shifted by one bit. The measurement voltages Vd with the phase thereof shifted by one bit are obtained from the row lines, respectively. The measurement voltages of Vd are converted to digital data. A data string {d1, d2, . . . , d15} multiplexed by the PN code is thus obtained.

The following measurement data of the row lines different from each other in the phase of the PN code by one bit is stored in the memory of the decode processing-circuit 10:

$$d1 = Vs1 + Vs5 + Vs8 + Vs9 + Vs11 + Vs13 + Vs14 + Vs15$$

$$d2 = Vs1 + Vs2 + Vs6 + Vs9 + Vs10 + Vs12 + Vs14 + Vs15$$

$$d3 = Vs1 + Vs2 + Vs3 + Vs7 + Vs10 + Vs11 + Vs13 + Vs15$$

$$d4 = Vs1 + Vs2 + Vs3 + Vs4 + Vs8 + Vs11 + Vs12 + Vs14$$

...

$$d15 = Vs4 + Vs7 + Vs8 + Vs10 + Vs12 + Vs13 + Vs14 + Vs15$$

where Vs represents the voltage digital data into which the capacitance at each sensor element at the intersection of the driven column lines and the row line is converted. The measurement data d is multiplexed in response to the capacitance of the sensor element corresponding to the column line driven by the PN code.

The measurement data d in a general form is expressed by the following equation:

$$di = \sum_{j=1}^{N} \begin{cases} PN(i-j-1) \times Vs(j) & (i \geq j) \\ PN(i-j+1+N) \times Vs(j) & (i < j) \end{cases} \quad (1)$$

Since about half the column line array 2 (eight lines) is driven concurrently in accordance with the PN code, the measurement data di is determined by summing the products of the PN code and the voltage data Vsj corresponding to the capacitance Csj of half the sensor elements. Here, "j", representing a line number of the column line C, is 1, 2, 3, . . . , N, and "i", representing a measurement data number (corresponding to the order of phase shifting), is 1, 2, 3, . . . , N.

The decode processing circuit 10 determines the voltage data Vs of each sensor element based on the multiplexed measurement data and the PN code used in the multiplexing operation in accordance with equation (2):

$$dsi = \sum_{j=1}^{N} \begin{cases} PNs(j-i+1) \times d(j) & (j \geq i) \\ PNs(j-i+1+N) \times d(j) & (j < i) \end{cases} \quad (2)$$

As already discussed, the measurement data d in time sequence that is determined by successively shifting the PN code bit by bit is separated into voltage data ds, namely, voltage data Vs corresponding to the capacitance of the sensor element at the intersection of the row line and the driven column line, by performing the multiplication and summing operation on the PN code and the measurement data d as represented by equation (2).

In equation (2), a polarity sign PNs(i)=+1 when the data of the bit of the PN code is PNi=1, and a polarity sign PNs(i)=−1 when PNi=0. The decode processing circuit 10 performs a separation process (namely, a decode process) from the measurement data d to the voltage data ds using equation (2).

A data string of the measurement data {d15, d14, . . . , d2, d1} has been obtained by multiplexing the voltage data ds and the PN code on a per row line basis. To determine the voltage data ds of each sensor element, namely, the voltage data {ds15, ds14, ds13, . . . , ds2, ds1}, a polarity sign corresponding to the data PNi of each bit of the bit train of the PN code {1 (MSB) 1, 1, 1, 0, 1, 0, 1, 1, 0, 0, 1, 0, 0, 0 (LSB)} is multiplied by measurement data dj. When the drive signal is applied to the column lines in response to the predetermined PN code during measurement, the order of the bit train corresponds to the order of the column lines. For example, the LSB bit corresponds to the column line $C_1$, and the MSB bit corresponds to a column line $C_{15}$. The voltage data dS1 at the intersection of the column line $C_1$ is determined by multiplying a polarity sign PNs(i) corresponding to the data PNi of each bit of the bit train of {1 (MSB), 1, 1, 1, 0, 1, 0, 1, 1, 0, 0, 1, 0, 0, 0 (LSB)} by the measurement data dj and summing the products throughout one cycle. More specifically, the column line $C_1$ is driven by the data of the LSB bit of the PN code at time $t_1$ of FIG. 34, driven by the data of the second bit at $t_2$, . . . , and driven by the data of the MSB bit at time $t_{15}$. In the multiplication and summing operation, the data are multiplied by the polarity sign corresponding to the data of the respective bits of the PN code and the products are then summed.

The column line $C_2$ is driven by the bit train of the PN code one bit shifted (rightward circulated) as in the data of the second bit of the PN code at each time as listed in the table shown in FIG. 34. The voltage data dS2 at the intersection of the column line $C_2$ is determined by multiplying a coefficient PNi corresponding to the data PNi of each bit of the bit train of {0 (LSB), 1, 1, 1, 1, 0, 0, 1, 0, 1, 1, 0, 0, 1, 0, 0 (MSB)} by the measurement data dj and summing the products throughout one cycle. This process is the multiplication and summing process of the PN code. As shown below, the voltage data dSj at each intersection is determined by performing the multiplication and summing operation on the data of the bit train of the PN code shifted by a predetermined number of bits. As will be discussed below, the voltage data dsj at each intersection is determined by performing the multiplication and summing operation on the measurement data di and the polarity sign corresponding to the data PNi of the bit train of the PN code that has been shifted by predetermined bits.

In the multiplication and summing operation during decoding, the default PN code is used for the column line $R_1$, and the PN codes successively one bit shifted for the respective column lines in the order of measurement are used.

In the multiplication and summing operation during decoding, for data measured at each time, the column number of the intersection to be determined, and the data of the bit of the order number of the bit arrangement of the PN code used at that time are multiplied, and then the resulting products are summed. In other words, at each time during measurement, the data of the bit of the PN code that has been used to drive the corresponding column line and the coefficient corresponding to the same data are multiplied.

In accordance with equation (2), the decode processing circuit 10 performs the following calculation process based on the bit train of the PN code {1, 1, 1, 1, 0, 1, 0, 1, 1, 0, 0, 1, 0, 0, 0} for the 15 column lines:

$$dS1 = +d1 + d2 + d3 + d4 - d5 + d6 - d7 + d8 + d9 - d10 - d11 + d12 - d13 - d14 - d15$$

-continued $$dS2 = -d1 + d2 + d3 + d4 + d5 - d6 + d7 - d8 + d9 + d10 - d11 - d12 + d13 - d14 - d15$$

$$dS3 = -d1 - d2 + d3 + d4 + d5 + d6 - d7 + d8 - d9 + d10 + d11 - d12 - d13 + d14 - d15$$

$$dS4 = -d1 - d2 - d3 + d4 + d5 + d6 + d7 - d8 + d9 - d10 + d11 + d12 - d13 - d14 + d15$$

...

$$dS15 = +d1 + d2 + d3 - d4 + d5 - d6 + d7 + d8 - d9 - d10 + d11 - d12 - d13 - d14 + d15$$

The decode processing circuit 10 thus separates the data string of the measurement data di into the voltage data dsi corresponding to the capacitance value of each sensor.

In accordance with the sixth preferred embodiment, the column line array 2 is divided into the plurality of column line groups, each group including adjacent column lines. On a per group basis, the column lines are multiplexed for measurement with the PN code shifted in phase at each of times $t_1$ through $t_{15}$. This process is repeated for each column line group to perform capacitance measurement on all column lines. The time series data on the detector and the PN code are subjected to the multiplication and summing process. The effect from the intersections of other column lines is averaged while information of the charge stored and discharged at the sensor elements (capacitive sensors) at the intersections of the target column lines only is extracted.

In accordance with the sixth preferred embodiment of the present invention, among other PN codes, the M sequence providing excellent autocorrelation makes the effect of the adjacent column lines uniform during the decoding operation of the detector. The effect of crosstalk among the column lines is thus minimized. The M sequence may be an 11 bit Barker sequence {1, 0, 1, 1, 0, 1, 1, 1, 0, 0, 0}.

The capacitance detector circuit of the sixth preferred embodiment of the present invention determines whether the measurement voltage multiplexed at time t1 is above a preset reference voltage when the decode processing circuit 10 performs the multiplexing process for measurement on the column lines on a per column line group basis. If it is determined that the measurement voltage is above the preset reference voltage, the measurement of the column line group is continuously performed. If it is determined that the measurement voltage is below the preset reference voltage, the measurement of the column line group is suspended, and the measurement data d1–d15 are set to be "0", and the measurement of a next column line group resumes. In this arrangement, unnecessary measurement is not performed on a column line group that requires no measurement because no finger touches that column line group. The entire process of measurement becomes efficient, and the workload involved in the capacitance detection process is reduced.

Concerning the switching timing, as soon as one cycle of time $t_1$ through time $t_{15}$ is completed on one column line group, the measurement operation starts on a next column line group.

As shown in FIG. 35, however, the column line group 4$_1$ through the column line group 4$_M$ are successively switched in accordance with the bit arrangement of the PN code at time $t_1$. After the switching of the column line group is cycled through, the phase of the bit arrangement of the PN code is changed, and then the column line group 4$_1$ through the column line group $4_M$ are successively switched. In this way, capacitance measurement is performed on each of the column line groups.

The decode processing circuit 10 determines the voltage data dSj of each capacitance from the measurement data of each column line group in a process identical to the previously discussed decode process.

Figure 36:
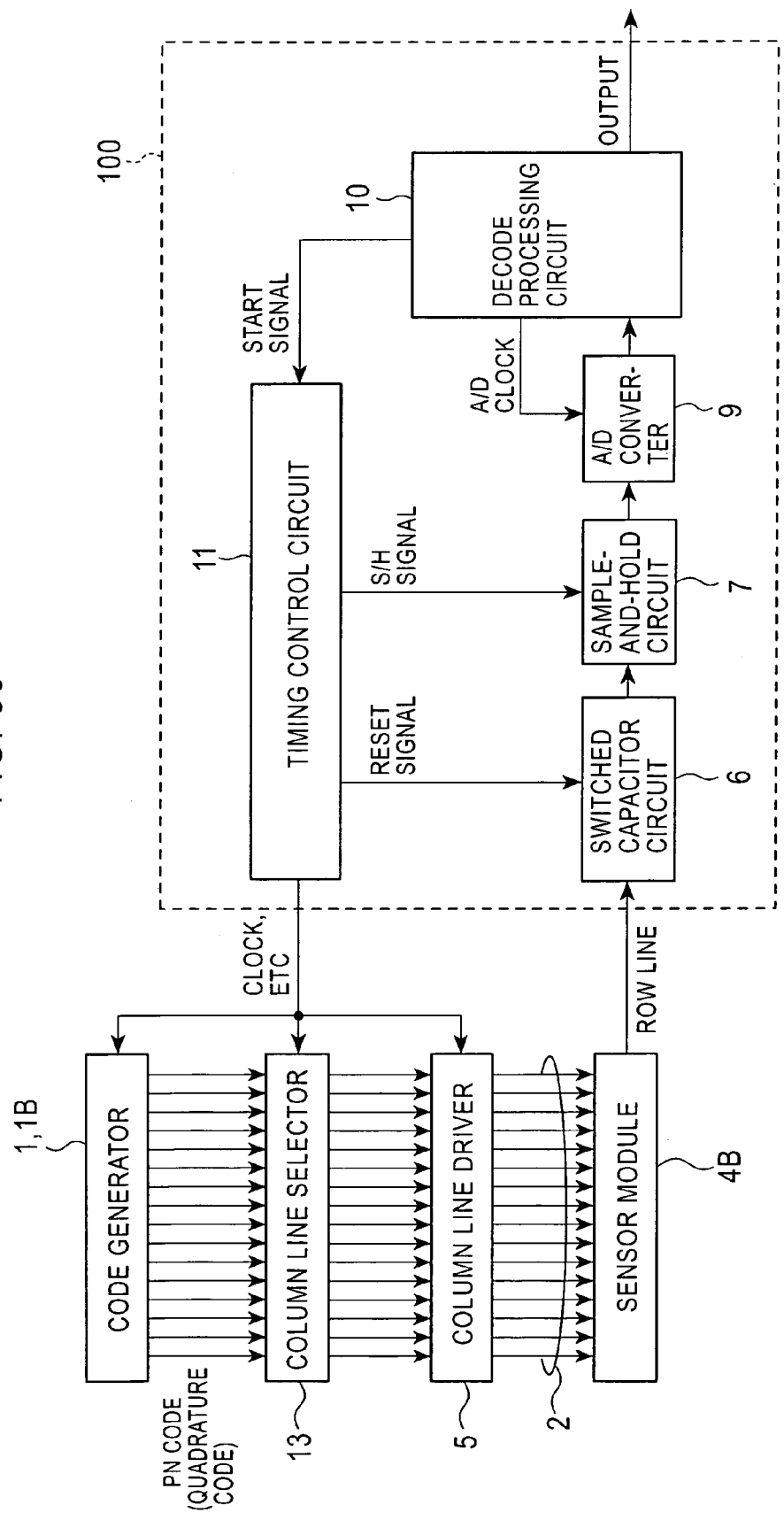
FIG. 36 is a block diagram illustrating the structure of a line sensor incorporating the sixth through ninth preferred embodiments of the present invention.

FIG. 36 is a block diagram illustrating the structure of a line type sensor 4B in accordance with the sixth preferred embodiment of the present invention.

The line sensor 4B has a plurality of column lines and only a single row line.

The capacitance detector circuit is identical in structure to the area sensor except that the selector 8 is not included. Like elements are designated with like reference numerals, and the discussion thereof is omitted here.

In comparison with the area type sensor, the line type sensor is small in the scale of circuit, leading to lower power consumption and low cost design.

To use the line type sensor as a fingerprint sensor, a finger is swept across the sensor in a direction substantially perpendicular to the direction of the row line. The timing control circuit 11 outputs required signals with a, predetermined period for measurement, and the decode processing circuit 10 thus obtain two-dimensional fingerprint data by concatenating measurement data that is input on a per row line basis every predetermined period.

Seventh Preferred Embodiment

A capacitance detector circuit of a seventh preferred embodiment of the present invention is described below with reference to FIG. 27.

Figure 37:
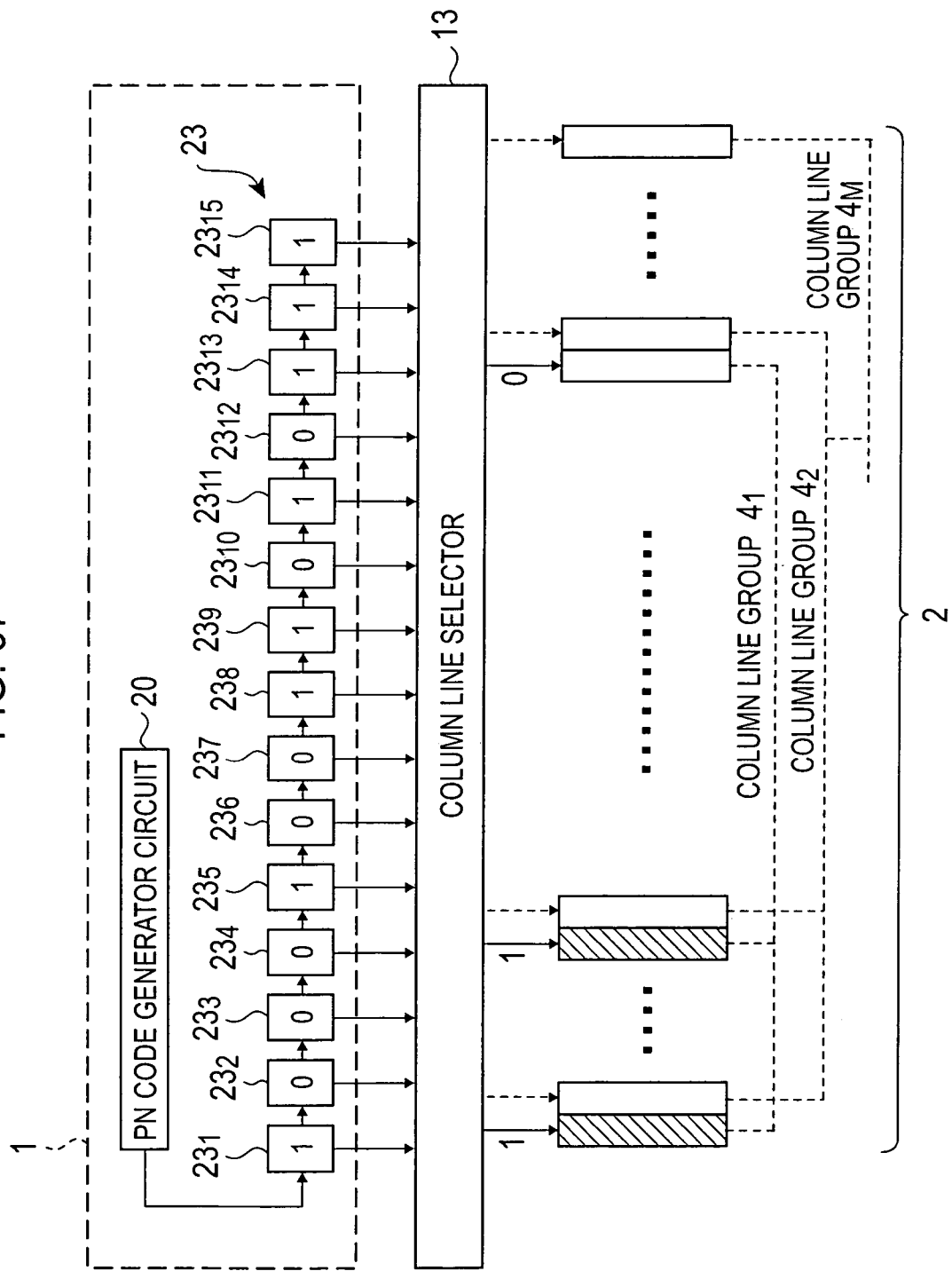
FIG. 37 illustrates a combination of column lines in the division of a column line array into column line groups.

The capacitance detector circuit of the seventh preferred embodiment is identical in structure to the capacitance detector circuit of the sixth preferred embodiment of the present invention. The difference of the capacitance detector circuit of the seventh preferred embodiment is that when the column line array 2 is divided into a plurality of groups, such as $4_1$ through $4_M$ each group includes column lines spaced by predetermined intervals (including one every predetermined number of column lines) as shown in FIG. 37.

For example, when the column line array 2, including 255 column lines, is divided into 15 groups, each group containing 17 column lines, each of the groups includes one line every 15 column lines.

The seventh preferred embodiment is identical to the sixth preferred embodiment in the measurement process of the measurement data performed on each column line group and the advantages thereof.

Eighth Preferred Embodiment

A capacitance detector circuit of an eighth preferred embodiment of the present invention is described below with reference to FIG. 27.

Figure 38:
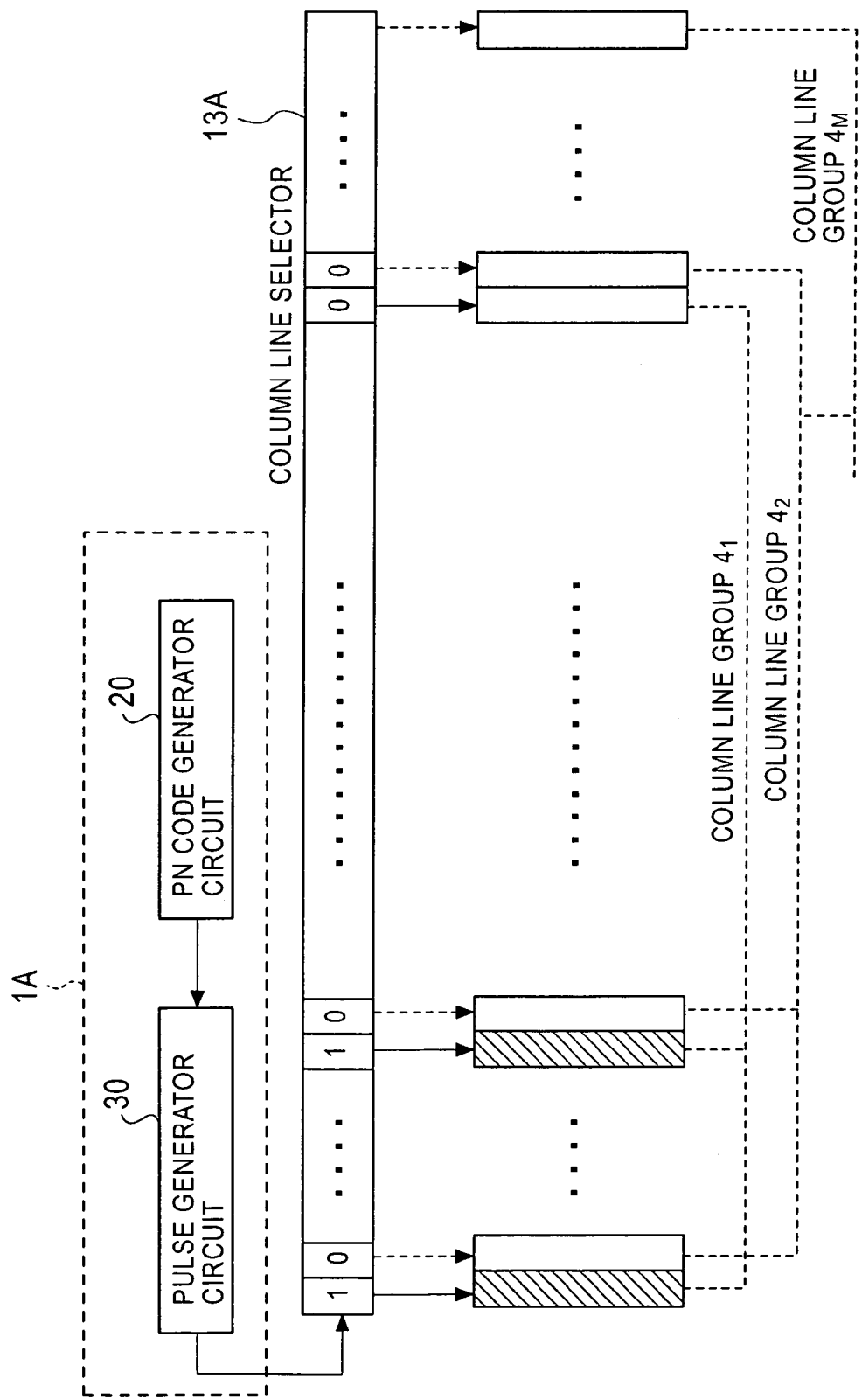
FIG. 38 illustrates the operation of a column line selector of the eighth preferred embodiment of the present invention, in which the column lines are driven in a column line group in accordance with the PN code (or quadrature code)

The capacitance detector circuit of the eighth preferred embodiment is identical in structure to the capacitance detector circuit of the seventh preferred embodiment of the present invention. As shown in FIG. 38, the difference of the capacitance detector circuit of the eighth preferred embodiment from that of the seventh preferred embodiment is that a code generator 1A includes a pulse generator circuit 30 substituted for the storage shift register 23 of the code generator 1 and that a column line selector 13A is substituted for the column line selector 13.

When a column line array 2 includes 255 column lines with a PN code of 15 bits, the number of column lines per group is 15. The pulse generator circuit 30 receives the bit train {1 (MSB), 1, 1, 1, 0, 1, 0, 1, 1, 0, 0, 1, 0, 0, 0 (LSB)} of the PN code generated by the PN code generator circuit 20. The pulse generator circuit 30 outputs a drive bit train {1, <0's of 16 bits>, 1, <0's of 16 bits>, 1, <0's of 16 bits>, 1, <0's of 16 bits>, 0, <0's of 16 bits>, 1, <0's of 16 bits>, 0, <0's of 16 bits>, 1, <0's of 16 bits>, 1, <0's of 16 bits>, 0, <0's of 16 bits>, 0, <0's of 16 bits>, 1, <0's of 16 bits>, 0, <0's of 16 bits>, 0, <0's of 16 bits>, 0, <0's of 16 bits>} for driving each column line group. Here, <0's of 16 bits> represents data "0" of 16 consecutive bits, namely, a bit train of {0, 0, 0, 0, 0, 0, 0, 0, 0, 0, 0, 0, 0, 0, 0, 0}.

More specifically, the pulse generator circuit 30 interposes <0's of 16 bits> between any two adjacent bits of the bit train of the PN code so that one every 17 column lines is driven, and outputs the resulting code bit by bit at each multiplexing measurement.

The column line selector 13A is a shift register corresponding to the column lines $C_1$–$C_{255}$ of the column line array 2, and shifts the data thereof by one bit in the direction represented by the arrow mark (in the rightward direction in FIG. 38) each time the drive bit train with the data "0" interposed therewithin is input bit by bit.

In response to the data output from each register stage, the column line selector 13A drives a predetermined number of column lines through buffers $5_1$–$5_{255}$ in the column line driver on a per column line group basis. The column line group is formed of column lines, spaced from each other by a predetermined number of lines, for example, each selected every 17 column lines.

Ninth Preferred Embodiment

A capacitance detector circuit 100 in accordance with a ninth preferred embodiment of the present invention is described below with reference to FIG. 27. The ninth preferred embodiment is identical to the sixth and seventh preferred-embodiments except that the ninth preferred embodiment employs a quadrature code rather than the PN code in the sixth and seventh preferred embodiments. To simplify explanation, only the difference of the ninth preferred embodiment from the sixth preferred embodiment is discussed particularly with reference to a 15-bit length quadrature code output by a quadrature code reading circuit 220.

The decode processing circuit 10 receives a start signal for starting capacitance detection from the outside, namely, a signal for collecting a fingerprint on a fingerprint sensor 4.

In response, the decode processing circuit 10 outputs, to the timing control circuit 11, a start command signal for starting capacitance detection. The timing control circuit 11 in turn outputs a clock signal and a reset signal to the code generator 1B.

In response to the reset signal, the code generator 1B initializes an internal address counter 222 and each register stage of the quadrature code reading circuit 220 (see FIG. 39) for synchronization with the clock signal, and successively reads the quadrature code from a code memory 221 to output the quadrature code.

The code generator 1B stores in the code memory 221 the quadrature code produced beforehand, and successively outputs a data string having orthogonality to the column line driver 5 each time the clock signal is input.

Figure 40:
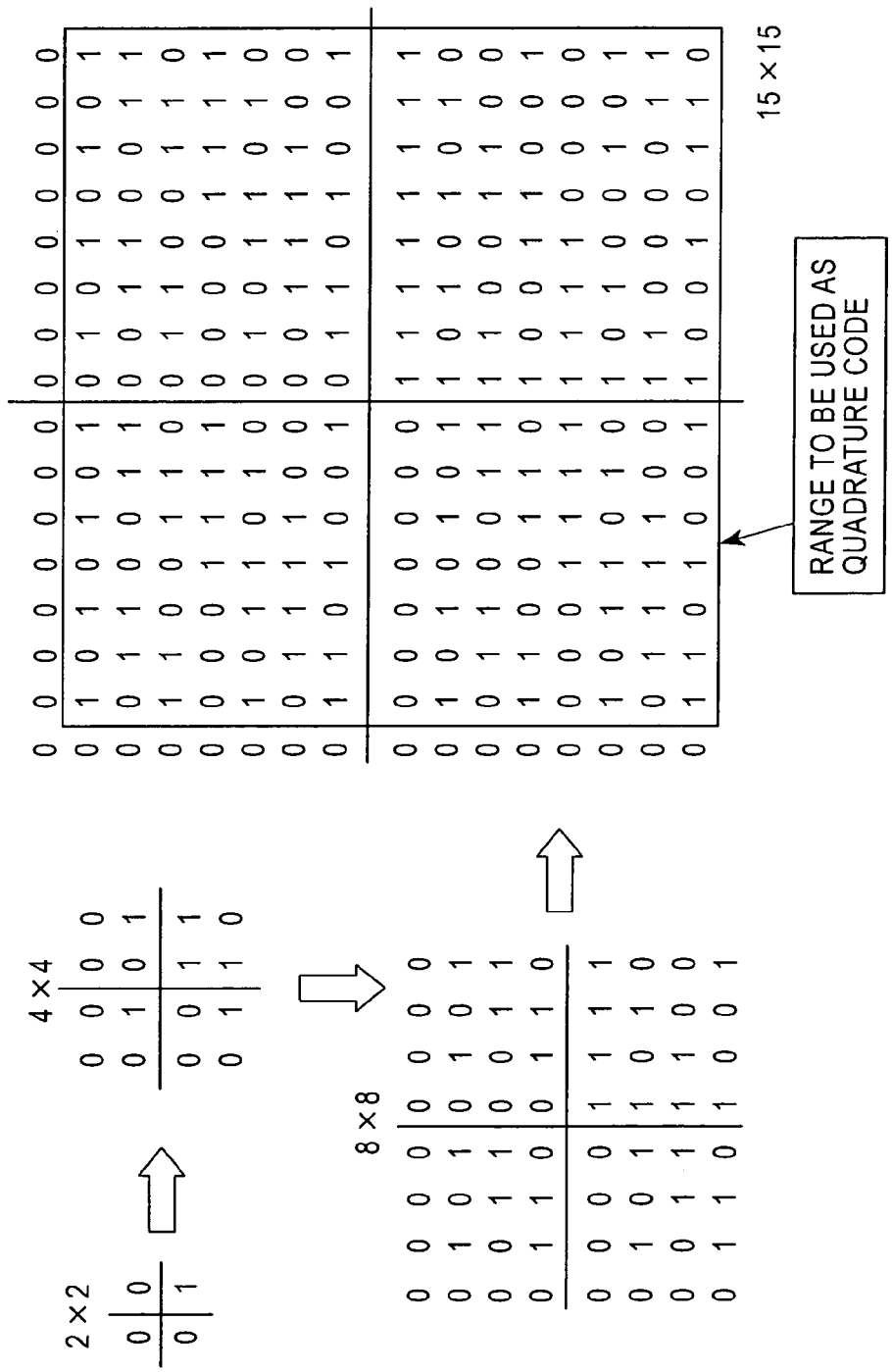
FIG. 40 illustrates the procedure of generating a Walsh code as a quadrature code in accordance with the ninth preferred embodiment of the present invention.

A Walsh code as a typical quadrature code is generated in a sequence shown in FIG. 40. In a basic structure, the Walsh code has a basic unit of 2 rows by 2 columns, and bits at the top right corner, the top left corner, and the bottom left corner are equal to each other and the bit at the bottom right corner is inverted.

The basic unit of 2×2 is synthesized into a bit arrangement of 4 rows by 4 columns as four blocks on the top right, the top left, the bottom right and the bottom left corners. In each block, the bottom right bit is opposite. Similarly, the number of bits in the bit train of the code (corresponding to the number of columns) and the number of codes (corresponding to the number of rows) are thus arranged as a bit arrangement of 8×8, and a bit arrangement of 16×16.

In the ninth preferred embodiment, the first column having all logical 0's and the first row having all logical 0' are excluded from the codes because none of the columns is driven in the multiplexing of the measurement data. As shown in FIG. 40, the quadrature code is 15 rows by 15 columns of bits.

As discussed above, the Walsh code is applicable as a long length code. The Walsh code thus generated is used in the multiplexing of capacitance measurement.

In accordance with the ninth preferred embodiment, the column line array 2 includes 15 columns of $C_1$–$C_{15}$. The code represented in the 15 rows by 15 columns of bits is used for multiplexing the capacitance measurement.

Figure 39:
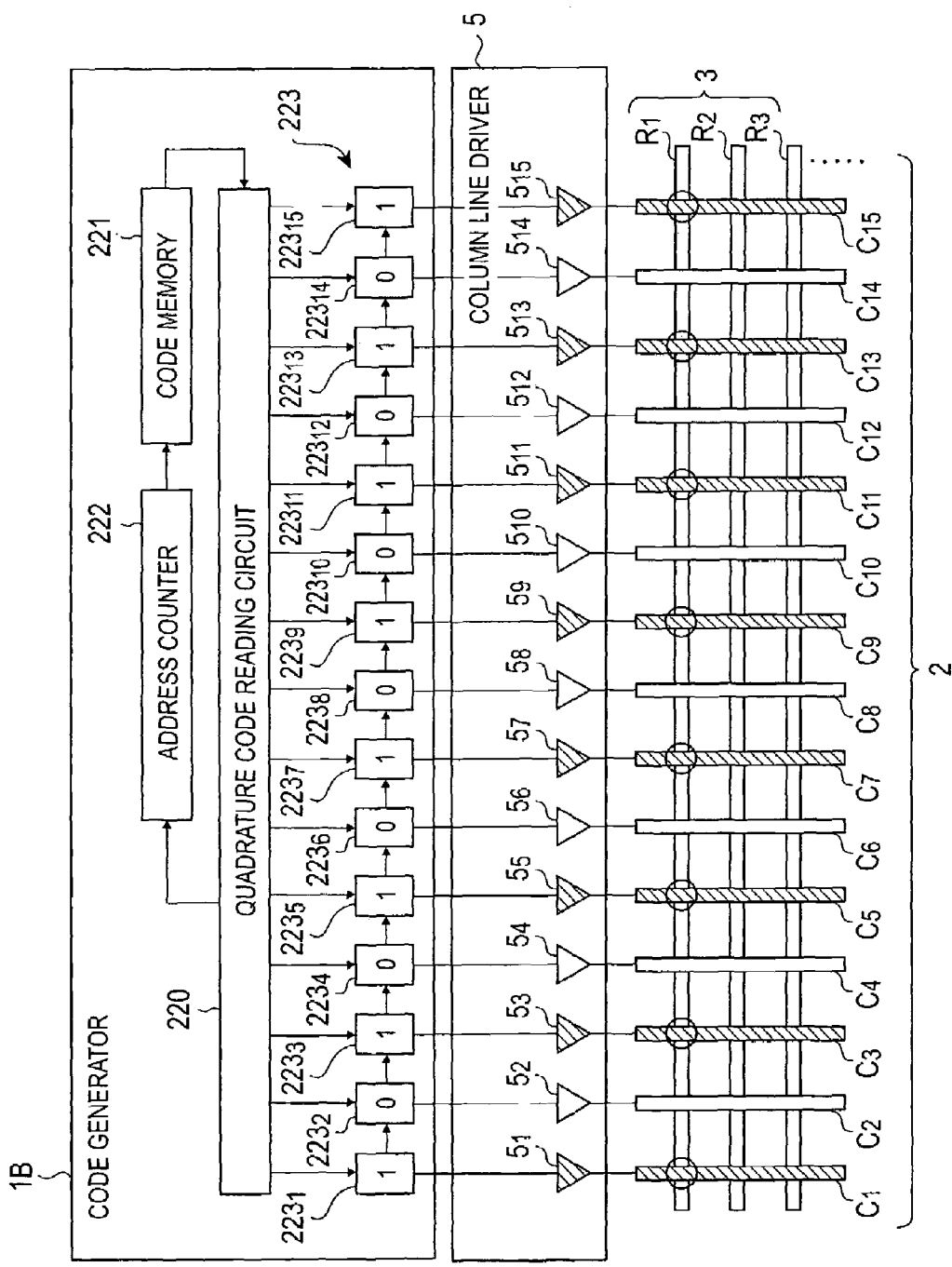
FIG. 39 illustrates the driving operation of the column lines in which the column lines contained in the column line group selected by the column line selector in accordance with the quadrature code are multiplexed.

The data of the quadrature code represented in the 15 rows by 15 columns is stored in the code memory 221 of the code generator 1B of FIG. 39 in the data format listed in the table of FIG. 41. Each row is arranged in the order corresponding to the addresses $t_1$ through $t_{15}$.

The Walsh code in the address $t_1$ is {1 (LSB) 0, 1, 0, 1, 0, 1, 0, 1, 0, 1, 0, 1, 0, 1 (MSB)}. The Walsh code in the address $t_{15}$ is {1 (LSB), 1, 0, 1, 0, 0, 1, 1, 0, 0, 1, 0, 1, 1, 0 (MSB)}.

Upon receiving the start signal, the timing control circuit 11 outputs a measurement start signal to the code generator 1B.

As shown in FIG. 39, the quadrature code reading circuit 220 resets the address counter 222 and the storage shift register 23 in response to the measurement start signal, thereby setting the count of the address counter 222 to "0".

At the above default state, the quadrature code reading circuit 220 outputs a count signal to the address counter 222 each time the quadrature code reading circuit 220 receives a clock from the timing control circuit 11 during the measurement of the capacitance at the intersection.

The address counter 222 counts the input count signal, and outputs addresses $t_1, t_2, \ldots, t_{15}$ responsive to the count to the code memory 221.

The code memory 221 outputs, to the quadrature code reading circuit 220, the data (the bit arrangement at a row) of the quadrature code corresponding to the input addresses $t_1, t_2, \ldots, t_{15}$.

In response to the clock from the timing control circuit 11, the quadrature code reading circuit 220 writes the bit arrangement from the LSB to the MSB of the bit train of the quadrature code to register stages $223_1$ through $223_{15}$ of a storage register 223.

When the storage register 223 receives the quadrature code, the data arrangement of {1 (LSB), 0, 1, 0, 1, 0, 1, 0, 1, 0, 1, 0, 1, 0, 1 (MSB)} is set in the register stages $223_1$, $223_2$, ..., $223_{15}$ in the storage register 223, respectively.

In the same manner as in the first preferred embodiment, the column line driver 5 drives the column lines in the column line group selected by the column line selector 13 with the data of the bit train of the input quadrature code.

As previously discussed in connection with the capacitance measurement of the sixth preferred embodiment, the process from $td_1$ to time $td_5$ shown in FIG. 31 is repeated at each of time $t_1$ through time $t_{15}$. FIG. 41 illustrates the bit arrangement of the quadrature code of the storage register 223 at each time. During one cycle from memory address $t_1$ through $t_{15}$, the quadrature code is read from the code memory 221, the column lines are driven, and the measurement voltage is acquired to collect fingerprint data.

In response to each drive pulse P, the capacitance detector circuit 100 successively reads the 15 bit quadrature code for the measurement process from the code memory 221. The column line driver 5 drives the predetermined column lines in response to the quadrature code in the column line group.

The capacitance detector circuit 100 obtains, on a per row line basis, 15 time sequence measurement voltages Vd different from address to address within a range from address $t_1$ through address $t_{15}$. The measurement voltages Vd are converted into the measurement data d in time sequence by the A/D converter 9. A data string {d1, d2, ..., d15} multiplexed by the quadrature code is thus obtained.

The following measurement data different from each other depending on each of the 15 quadrature codes (measured using the quadrature code in the table of FIG. 41) is stored in the memory of the decode processing circuit 10:

$d1 = Vs1 + Vs5 + Vs8 + Vs9 + Vs11 + Vs13 + Vs14 + Vs15$ $d2 = Vs1 + Vs2 + Vs6 + Vs9 + Vs10 + Vs12 + Vs14 + Vs15$ $d3 = Vs1 + Vs2 + Vs3 + Vs7 + Vs10 + Vs11 + Vs13 + Vs15$ $d4 = Vs1 + Vs2 + Vs3 + Vs4 + Vs8 + Vs11 + Vs12 + Vs14$

...

$d15 = Vs4 + Vs7 + Vs8 + Vs10 + Vs12 + Vs13 + Vs14 + Vs15$ where Vs represents the voltage digital data into which the capacitance at each sensor element at the intersection of the driven column lines and the row line is converted. The measurement data d is multiplexed in response to the capacitance of the sensor element corresponding to the column line driven by the quadrature code.

The measurement data d in a general form is expressed by the following equation (3):

$$di = \sum_{j=1}^{N} CD(i, j) \times Vs(j) \quad (3)$$

Since about half the column line array 2 (eight lines) is driven concurrently in accordance with the quadrature code as in equation (3), the measurement data di is determined by summing the products of the quadrature code and the voltage data Vsj corresponding to the capacitance Csj of half the sensor elements. Here, "j" is 1, 2, 3, ..., N and a line number of the column line C, and "i" is 1, 2, 3, ..., N and represents a measurement data number (corresponding to the order number of address ti). The code CD(i, j) in equation (3) represents a j-th element code at an i-th code used at time ti.

The decode processing circuit 10 determines the voltage data Vs of each sensor element based on the multiplexed measurement data and the quadrature code used in the multiplexing operation in accordance with equation (4):

$$dsj = \sum_{j=1}^{N} CDs(i, j) \times d(i) \quad (4)$$

As already discussed, the time-sequence measurement data d that has determined with the quadrature code successively read from the code memory 221 is subjected to the multiplication and summing process in accordance with equation (4). The voltage data ds, namely, the voltage data Vs corresponding to the capacitance of the sensor element at the intersection of the driven column line and the row line is thus separated.

In equation (4), a polarity sign CDs(i, j)=+1 when the data of the bit of the PN code is CD(i, j)=1, and a polarity sign CDs(i, j)=−1 when CD(i, j)=0.

The decode processing circuit 10 performs the separation process from the measurement data d to the voltage data ds using equation (4).

A data string of the measurement data {d1, d2, d14, d15} has been determined by multiplexing the voltage data ds and the quadrature code on a per row line basis. To determine the voltage data ds of each sensor element, namely, the voltage data {ds1, ds2, ds3, . . . , ds14, ds15}, measurement data di is multiplied by a polarity sign corresponding to the data CD(i, j) of each bit of the bit train of the quadrature code {1 (LSB), 0, 1, 0, 1, 0, 1, 0, 1, 0, 1, 0, 1, 0, 1 (MSB)} and the resulting produces are summed throughout one cycle.

The order of the bit train corresponds to the order of the column lines in each column line group. For example, the LSB bit corresponds to the column line $C_1$, and the MSB bit corresponds to a column line $C_{15}$. The voltage data dS1 at the intersection of the column line $C_1$ is determined by multiplying a polarity sign corresponding to the data CD(i, j) of each bit of the LSB bit train of (1 ($t_1$), 0 ($t_2$), 1 ($t_3$) 0 ($t_4$), 1 ($t_5$), 0 ($t_6$), 1 ($t_7$), 0 ($t_8$), 1 ($t_9$) 0 ($t_{10}$), 1 ($t_{11}$), 0 ($t_{12}$), 1 ($t_{13}$), 0 ($t_{14}$), 1 ($t_{15}$)} of each quadrature code of addresses $t_1$–$t_{15}$ by the measurement data di and summing the products throughout one cycle.

More specifically, the column line $C_1$ is driven by the data of the LSB bit of the quadrature code at address $t_1$ at time $t_1$, driven by the LSB data of the quadrature code at address $t_2$ at time $t_2$, . . . , and driven by the LSB data of the quadrature code at address $t_{15}$ at time $t_{15}$. In the multiplication and summing operation, the data are multiplied by the polarity sign corresponding to the data of the respective bits of the quadrature code and the products are then summed.

Similarly, the column line $C_2$ is driven by the data of the second bit of the quadrature code at address $t_1$ at time $t_1$, driven by the data of the second bit of the quadrature code at address $t_2$ at time $t_2$, . . . , driven by the data of the second bit of the quadrature code at address $t_{15}$ at time $t_{15}$. The voltage data dS2 at the intersection of the column line $C_2$ is determined by multiplying the measurement data by a polarity sign corresponding to the data of the bit of the quadrature code. In other words, the voltage data dS2 at the intersection of the column line $C_1$ is determined by multiplying a polarity sign corresponding to the data CD(i, j) of a second bit of the LSB bit train of {0 ($t_1$), 1 ($t_2$), 1 ($t_3$), 0 ($t_4$), 0 ($t_5$), 1 ($t_6$), 1 ($t_7$), 0 ($t_8$), 0 ($t_9$), 1 ($t_{10}$), 1 ($t_{11}$) 0 ($t_{12}$), 0 ($t_{13}$), 1 ($t_{14}$), 1 ($t_{15}$)} of each quadrature code of addresses $t_1$–$t_{15}$ by the measurement data di and summing the products throughout one cycle.

As described above, the voltage corresponding to the capacitance at each intersection is determined by multiplying a polarity sign corresponding to the data CD(i, j) of each bit of the bit train corresponding to the data applied to the corresponding column lines at time $t_1$ to time $t_{15}$ by the measurement data di, and summing the resulting products through one cycle. This process is the multiplication and summing process of the quadrature code. As described below, the voltage data dsj at each intersection is determined by performing the multiplication and summing operation on the measurement data di and the polarity sign corresponding to the data of each bit train of the quadrature code stored in the code memory 221.

In the multiplication and summing operation during decoding, for data measured at each time, the measurement data at the column line number of a target intersection, and the polarity sign corresponding to the data of the bit of the order number in the bit train of the quadrature code corresponding to that column line number at that time are multiplied, and the resulting products are summed. In other words, at each measurement time, the data of the bit of the quadrature code used to drive the corresponding column lines and the polarity sign corresponding to the data are multiplied.

In accordance with equation (4), the decode processing circuit 10 performs the following calculation process based on the bit train of the quadrature code of FIG. 41 stored in the code memory 221, at addresses $t_1$ through $t_{15}$:

$$dS1 = +d1 - d2 + d3 - d4 + d5 - d6 + d7 - d8 + d9 - d10 + d11 - d12 + d13 - d14 + d15$$

$$ds2 = -d1 + d2 + d3 - d4 - d5 + d6 + d7 - d8 - d9 + d10 + d11 - d12 - d13 + d14 + d15$$

$$ds3 = +d1 + d2 - d3 - d4 + d5 + d6 - d7 - d8 + d9 + d10 + d11 - d12 - d13 + d14 - d15$$

$$ds4 = -d1 - d2 - d3 + d4 + d5 + d6 + d7 - d8 - d9 - d10 - d11 + d12 + d13 + d14 + d15$$

$$\ldots$$

$$ds15 = +d1 + d2 - d3 + d4 - d5 - d6 + d7 + d8 - d9 - d10 + d11 - d12 + d13 + d14 - d15$$

The decode processing circuit 10 thus separates the data string of the measurement data di into the voltage data dsj corresponding to the capacitance value of each sensor.

In accordance with the ninth preferred embodiment, the quadrature code such as a Walsh code is used instead of the PN code of the sixth preferred embodiment of the present invention. The column line array 2 is divided into the plurality of column line groups. On a per group basis, the column lines corresponding to the data of the bits of the quadrature code are driven, and the measurement values of the column line group are multiplexed to result in the measurement data. At a next timing, the quadrature code at the address corresponding to the time is read from the code memory 221 to repeat the above-referenced measurement operation. On the detector side, the obtained time-sequence measurement data and the quadrature code are subjected to the multiplication and summing operation. The effect from the intersections of other column lines is averaged while information of the charge stored and discharged at the sensor elements (capacitive sensors) at the intersections of the target column lines only is extracted. In the ninth preferred embodiment, the Walsh code is used instead of the PN code. In the first through fifth preferred embodiments, the Walsh code may be substituted for the PN code.

The decode process of the decode processing circuit 10 may be performed on the sensor side or may be performed on a host computer after the measurement data is sent to the host computer in the sixth through ninth preferred embodiments.

Not only capacitance but also other physical quantities such as resistance may be measured in accordance with the preferred embodiments of the present invention.

In accordance with the sixth to ninth preferred embodiments of the present invention, the drive lines are the column lines and detecting lines are the row lines. The present invention is equally applicable to drive and detection methods, e.g., a method in which a column line serves as a detecting line and a row line serves as a drive line.

Tenth Preferred Embodiment

With reference to FIG. 4, the capacitances of the sensor elements formed at the column lines and the row lines are multiplexed in the capacitance measurement operation in accordance with the sixth through ninth preferred embodiments. In a tenth preferred embodiment of the present invention, however, capacitance measurement is performed on a sensor 4C in an active matrix type sensor shown in FIG. 25.

The code generator 1 supplies the column line driver 5 with the bit train of the PN code. The column line array 2 is divided into a plurality of column line groups ($4_1$–$4_M$). A plurality of column lines are driven on a per group basis. The capacitances of the unit capacitance cells (sensor elements) 70 are multiplexed on a per row line basis. In this respect, the tenth preferred embodiment is identical to the sixth through ninth preferred embodiments. The capacitance detector circuit 200 is identical in structure and operation to the capacitance detector circuit 100 of the first through fourth preferred embodiments, except that the charge amplifier 6 is replaced with a charge amplifier 72 of FIG. 26.

Elements in the charge amplifier 72 of FIG. 26 identical to those of the charge amplifier 6 are designated with the same reference numerals. Since the measurement of the active matrix sensor is slightly different, the charge amplifier 72 is different from the charge amplifier 6 accordingly. Only a difference in the measurement operation is described below.

With a switch 73 in an off state, and with a switch 47, a switch 124, and cell selection switches 71 connected to a plurality of column lines corresponding to bits 1 all in an on state prior to the measurement of fingerprint data, the unit capacitance cell 70 (capacitance Cs) and parasitic capacitance Cp are charged up to voltage Vc, and all switches are thus turned off.

In the measurement of the fingerprint data, the switch 73 and the cell selection switch 71 are turned on with the switch 74 and the switch 124 remaining off. When a finger is placed on the sensor 4C, the capacitance Cs of the unit capacitance cell 70 changes. A voltage corresponding to the sum of charge caused by a difference between the voltage Vc and a reference voltage Vref is provided on an output terminal of the operational amplifier 121. The output voltage as measurement data d is thus stored in the internal memory of the decode processing circuit 10. Multiplexed measurement data di is obtained by repeating a sequence of charge storage and measurement of the voltage. By performing the previously discussed decode process, the decode processing circuit 10 provides the voltage data ds corresponding to the capacitance Cs of each unit capacitance cell 70 from the data string of the measurement data d stored in the internal memory.

In each of the first through tenth preferred embodiments of the present invention, a computer program for performing the function of the decode processing circuit 10 shown in FIGS. 1 and 27 may be stored in computer readable storage media, a computer system may read the computer program from the storage medium, and may execute the computer program to perform a process for decoding a data string of the multiplexed measurement data di to the voltage data dsi corresponding to the capacitance at the sensor element. The "computer system" here includes an operating system (OS), and hardware such as peripheral devices. The "computer system" also includes a WWW system that features a homepage providing environment (or display environment). The "computer readable storage media" include portable media, such as a flexible disk, a magneto-optical disk, a read-only memory (ROM), and a compact disk read-only memory (CD-ROM), and a storage device, such as a hard disk device, built in the computer system. The "computer system" also includes a volatile memory, such as a random-access memory (RAM), for temporarily storing programs, in a computer system that functions as a server or a client when a program is transmitted via a communication line including a network such as the internet.

The computer program may be transmitted from the computer system having the storage device therewithin to another computer system via a transmission medium or via a transmission wave in a transmission medium. The "transmission medium" includes a communication network, such as the internet, and a communication line, such as a telephone line, for transmitting information. The computer program may partially perform the above-referenced function. The computer program may be in the form of a differential file that is executed in combination with a program already recorded in the computer system.

What is claimed is:

1. A circuit of a capacitive sensor having a plurality of column lines and a row line intersecting the column lines, for detecting a change in capacitance at an intersection of a column line and a row line, the circuit comprising:

code generating means for generating a code having orthogonality in time sequence to output the generated code as a column drive signal;

column line drive means for driving a plurality of column lines, from among the column lines that are selected in response to the code;

capacitance detecting means, connected to the row line, for detecting a voltage by converting a total sum of changes in capacitance at intersections of the selected column lines into the voltage to output the detected voltage; and decode processing means for performing a predetermined calculation on the detected voltage output from the capacitance detecting means and the code to determine a voltage value responsive to the capacitance change at the intersection, wherein the code generating means generates a PN code, and outputs the PN code with the phase thereof varied in time sequence, and wherein the code generating means repeats by a plurality of times a circle within which the phase of the PN code is varied by a number of bits equal to the number of bits of the PN code, and wherein the decode processing means determines a voltage responsive to a chanee in capacitance at the intersection on a per cycle basis, sums the voltage for a plurality of cycles, and outputs the summed result as the detected voltage.

2. A circuit according to claim 1, wherein the code generating means generates a plurality of PN codes, and switches the PN code from one PN code to a different PN code every cycle.

3. A circuit according to claim 1, wherein the PN code comprises an M sequence.

4. A circuit according to claim 1, wherein a capacitance at an intersection is detected in an area type capacitive sensor which includes a matrix of intersections of a plurality of column lines and a plurality of row lines.

5. A circuit according to claim 1, wherein a capacitance at an intersection is detected in a line type capacitive sensor which includes a single row line and a plurality of column lines intersecting the row line.

6. A fingerprint sensor comprising a circuit according to claim 1.

7. A circuit of a capacitive sensor having a plurality of column lines and a row line intersecting the column lines, for detecting a change in capacitance at an intersection of a column line and a row line, the circuit comprising:
code generating means for generating a code having orthogonality in time sequence to output the generated code as a column drive signal;
column line drive means for driving a plurality of column lines, from among the column lines that are selected in response to the code;
capacitance detecting means, connected to the row line, for detecting a voltage by converting a total sum of changes in capacitance at intersections of the selected column lines into the voltage to output the detected voltage; and
decode processing means for performing a predetermined calculation on the detected voltage output from the capacitance detecting means and the code to determine a voltage value responsive to the capacitance change at the intersection,
wherein the code generating means generates a Walsh code having bit strings varying in time sequence, and outputs the Walsh code as the code thereof.

8. A circuit according to claim 7, wherein a capacitance at an intersection is detected in an area type capacitive sensor wbich includes a matrix of intersections of a plurality of column lines and a plurality of row lines.

9. A circuit according to claim 7, wherein a capacitance at an intersection is detected in a line type capacitive sensor which includes a single row line and a plurality of column lines intersecting the row line.

10. A fingerprint sensor comprising a circuit according to claim 7.

11. A circuit of a capacitive sensor having a plurality of column lines and a row line intersecting the column lines, for detecting a change in capacitance at an intersection of a column line and a row line, the circuit comprising:
code generating means for generating a code having orthogonality in time sequence to output the generated code as a column drive signal;
column line drive means for driving a plurality of column lines, from among the column lines that are selected in response to the code;
capacitance detecting means connected to the row line, for detecting a voltage by converting a total sum of changes in capacitance at intersections of the selected column lines into the voltage to output the detected voltage; and
decode processing means for performing a predetermined calculation on the detected voltage output from the capacitance detecting means and the code to determine a voltage value responsive to the capacitance change at the intersection,
wherein the decode processing means performs a decode process by multiplying and summing a data string of the detected voltage that is output in accordance wit the code in time sequence.

12. A circuit according to claim 11, wherein a capacitance at an intersection is detected in an area type capacitive sensor which includes a matrix of intersections of a plurality of column lines and a plurality of row lines.

13. A circuit according to claim 11, wherein a capacitance at an intersection is detected in a line type capacitive sensor which includes a single row line and a plurality of column lines intersecting the row line.

14. A fingerprint sensor comprising a circuit according to claim 11.

15. A circuit for detecting a change in capacitance at an intersection of a column line and a row line in a capacitive sensor that includes a plurality of column lines and a row line intersecting the column lines, the circuit comprising:
code generating means for generating a code having orthogonality in time sequence;
column line group selecting means for dividing the plurality of column lines into groups, each group including a predetermine number of column lines, and for selecting a group of column lines to be measured;
column line drive means for driving the plurality of column lines in each of the successively selected column line groups in response to the code;
capacitance detecting means, connected to the row line, for converting a total sum of changes in capacitance at intersections of the selected column lines into a voltage signal, and outputting the voltage signal as a detected voltage; and
decode processing means for performing a predetermined calculation on the measured voltage and the code on a per column line group basis, and for determining a voltage value responsive to the capacitance change at each intersection,
wherein the code generating means generates a PN code, and outputs the PN code with the phase thereof varied in time sequence, and
wherein the code generating means repeats by a plurality of times a cycle within which the phase of the PN code is varied by a number of bits equal to the number of bits of the PN code, and wherein the decode processing means determines a voltage responsive to a change in capacitance at the intersection on a per cycle basis, sums the voltage for plurality of cycles, and outputs the summed result as the detected voltage.

16. A circuit according to claim 15, wherein the column line group comprises a predetermined number of adjacent column lines.

17. A circuit according to claim 15, wherein the column line group comprises column lines spaced at predetermined intervals.

18. A circuit according to claim 15, wherein the code generating means generates a plurality of PN codes, and switches the PN code from one PN code to a different PN code every cycle.

19. A circuit according to claim 15, wherein the PN code comprises an M sequence.

20. A fingerprint sensor comprising a capacitance detection circuit according to claim 15.

21. A circuit for detecting a change in capacitance at an intersection of a column line and a row line in a capacitive sensor that includes a plurality of column lines and a row line intersecting the column lines, the circuit comprising:

code generating means for generating a code having orthogonality in time sequence;

column line group selecting means for dividing the plurality of column lines into groups, each group including a predetermine number of column lines, and for selecting a group of column lines to be measured;

column line drive means for driving the plurality of column lines in each of the successively selected column line groups in response to the code;

capacitance detecting means, connected to the row line, for converting a total sum of changes in capacitance at intersections of the selected column lines into a voltage signal, and outputting the voltage signal as a detected voltage; and decode processing means for performing a predetermined calculation on the measured voltage and the code on a per column line group basis, and for determining a voltage value responsive to the capacitance change at each intersection, wherein the code generating means generates a Walsh code having bit strings varying in time sequence, and outputs the Walsh code as the code thereof.

22. A fingerprint sensor comprising a capacitance detection circuit according to claim 21.

23. A circuit according to claim 21, wherein the column line group comprises a predetermined number of adjacent column lines.

24. A circuit according to claim 21, wherein the column line group comprises column lines spaced at predetermined intervals.

* * * * *